US009276221B2

(12) United States Patent
Nowatari et al.

(10) Patent No.: US 9,276,221 B2
(45) Date of Patent: *Mar. 1, 2016

(54) LIGHT-EMITTING ELEMENT, LIGHT-EMITTING DEVICE, ELECTRONIC DEVICE, AND LIGHTING DEVICE COMPRISING A PHTHALOCYANINE-BASED MATERIAL

(75) Inventors: Hiromi Nowatari, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 519 days.

This patent is subject to a terminal disclaimer.

(21) Appl. No.: 13/072,908

(22) Filed: Mar. 28, 2011

(65) Prior Publication Data

US 2011/0240971 A1 Oct. 6, 2011

(30) Foreign Application Priority Data

Mar. 31, 2010 (JP) ................................. 2010-082706

(51) Int. Cl.
*H01L 51/54* (2006.01)
*H01L 51/00* (2006.01)
*H01L 51/50* (2006.01)

(52) U.S. Cl.
CPC ......... *H01L 51/0078* (2013.01); *H01L 51/0072* (2013.01); *H01L 51/5036* (2013.01); *H01L 51/5048* (2013.01)

(58) Field of Classification Search
None
See application file for complete search history.

(56) References Cited

U.S. PATENT DOCUMENTS

| | | | |
|---|---|---|---|
| 5,585,213 A | 12/1996 | Tamano et al. | |
| 5,998,803 A | 12/1999 | Forrest et al. | |
| 6,013,384 A | 1/2000 | Kido et al. | |
| 6,034,236 A | 3/2000 | Aoki et al. | |
| 6,137,223 A | 10/2000 | Hung et al. | |
| 6,717,358 B1 | 4/2004 | Liao et al. | |
| 6,734,457 B2 | 5/2004 | Yamazaki et al. | |
| 6,936,961 B2 | 8/2005 | Liao et al. | |
| 7,192,659 B2 | 3/2007 | Ricks et al. | |
| 7,459,029 B2 | 12/2008 | Hosoda et al. | |
| 7,462,883 B2 | 12/2008 | Kumaki et al. | |
| 7,473,575 B2 | 1/2009 | Yamazaki et al. | |
| 7,482,626 B2 | 1/2009 | Yamazaki et al. | |
| 7,494,722 B2 | 2/2009 | Liao et al. | |
| 7,560,862 B2 | 7/2009 | Liao et al. | |
| 7,564,052 B2 | 7/2009 | Kumaki | |
| 7,598,670 B2 | 10/2009 | Kumaki et al. | |
| 7,683,536 B2 | 3/2010 | Forrest et al. | |
| 7,736,754 B2 | 6/2010 | Kijima et al. | |
| 7,737,437 B2 | 6/2010 | Yamazaki et al. | |
| 7,893,427 B2 | 2/2011 | Kumaki et al. | |
| RE42,248 E | 3/2011 | Hosoda et al. | |
| 7,960,038 B2 | 6/2011 | Ohsawa et al. | |
| 7,964,891 B2 | 6/2011 | Kumaki et al. | |
| 7,985,974 B2 | 7/2011 | Nowatari et al. | |
| 8,017,254 B2 | 9/2011 | Itai | |
| 8,040,047 B2 | 10/2011 | Ushikubo et al. | |
| 8,164,088 B2 | 4/2012 | Ohsawa et al. | |
| 8,207,540 B2 | 6/2012 | Nowatari et al. | |
| 8,251,765 B2 | 8/2012 | Ushikubo et al. | |
| 8,368,059 B2 | 2/2013 | Kumaki et al. | |
| 8,368,060 B2 | 2/2013 | Kumaki et al. | |
| 8,431,940 B2 | 4/2013 | Nowatari et al. | |
| 8,581,266 B2 | 11/2013 | Nowatari et al. | |
| 8,610,109 B2 | 12/2013 | Yamazaki et al. | |
| 8,618,574 B2 | 12/2013 | Kumaki et al. | |
| 8,742,407 B2 | 6/2014 | Ohsawa et al. | |
| 8,872,169 B2 | 10/2014 | Kumaki et al. | |
| 8,994,017 B2 | 3/2015 | Yamazaki et al. | |
| 2002/0180347 A1 | 12/2002 | Adachi et al. | |
| 2003/0127967 A1 | 7/2003 | Tsutsui et al. | |
| 2003/0189401 A1 | 10/2003 | Kido et al. | |
| 2004/0174116 A1 | 9/2004 | Lu et al. | |
| 2004/0227460 A1* | 11/2004 | Liao et al. ..................... 313/506 |
| 2004/0262614 A1 | 12/2004 | Hack et al. | |
| 2005/0098207 A1* | 5/2005 | Matsumoto et al. .......... 136/263 |

(Continued)

FOREIGN PATENT DOCUMENTS

CN 001610466 A 4/2005
CN 101034736 A 9/2007

(Continued)

OTHER PUBLICATIONS

Liao, L.S. et al., "High-Efficiency Tandem Organic Light-Emitting Diodes," Applied Physics Letters, vol. 84, No. 2, Jan. 12, 2004, pp. 167-169.
Tsutsui, T. et al., "Electric Field-Assisted Bipolar Charge Spouting in Organic Thin-Film Diiodes," Applied Physics Letters, vol. 84, No. 3, Jan. 19, 2004, pp. 440-442.
Ikeda, H. et al., "P-185: Low-Drive-Voltage OLEDs With a Buffer Layer Having Molybdenum Oxide," SID Digest '06: SID International Symposium Digest of Technical Papers, vol. 37, 2006, pp. 923-926.

(Continued)

*Primary Examiner* — Andrew K Bohaty
(74) *Attorney, Agent, or Firm* — Husch Blackwell LLP

(57) ABSTRACT

A light-emitting element that emits light with high luminance and can be driven at low voltage. The light-emitting element includes n (n is a natural number greater than or equal to 2) EL layers between an anode and a cathode, and includes a first layer, a second layer, and a third layer between an m-th (m is a natural number, $1 \leq m \leq n-1$) EL layer from the anode and an (m+1)th EL layer. The first layer functions as a charge-generation region, has hole-transport properties, and contains an acceptor substance. The third layer has electron-transport properties and contains an alkali metal or the like. The second layer is formed of a phthalocyanine-based material and is provided between the first layer and the third layer, whereby an injection barrier at the time of injecting electrons generated in the first layer into the m-th EL layer through the third layer can be lowered.

61 Claims, 21 Drawing Sheets

(56) References Cited

U.S. PATENT DOCUMENTS

| | | |
|---|---|---|
| 2005/0104511 A1 | 5/2005 | Liao et al. |
| 2005/0110007 A1 | 5/2005 | Forrest et al. |
| 2006/0008740 A1 | 1/2006 | Kido et al. |
| 2006/0087225 A1 | 4/2006 | Liao et al. |
| 2006/0115673 A1 | 6/2006 | Li |
| 2006/0188745 A1 | 8/2006 | Liao et al. |
| 2006/0220534 A1 | 10/2006 | Shibanuma et al. |
| 2006/0251921 A1 | 11/2006 | Forrest et al. |
| 2006/0251922 A1 | 11/2006 | Liao et al. |
| 2006/0263629 A1 | 11/2006 | Aziz et al. |
| 2006/0279190 A1 | 12/2006 | Nakayama |
| 2006/0292394 A1 | 12/2006 | Iwaki et al. |
| 2007/0001570 A1 | 1/2007 | Nomura et al. |
| 2007/0003788 A1* | 1/2007 | Tagami et al. ............... 428/690 |
| 2007/0013297 A1 | 1/2007 | Park |
| 2007/0020483 A1 | 1/2007 | Park et al. |
| 2007/0040161 A1 | 2/2007 | Kumaki et al. |
| 2007/0090376 A1 | 4/2007 | Kumaki et al. |
| 2007/0114512 A1 | 5/2007 | Kumaki et al. |
| 2007/0114527 A1 | 5/2007 | Kumaki et al. |
| 2007/0116983 A1 | 5/2007 | Kanno et al. |
| 2007/0120136 A1 | 5/2007 | Noda et al. |
| 2007/0129545 A1 | 6/2007 | Inoue et al. |
| 2007/0182317 A1 | 8/2007 | Kido et al. |
| 2007/0200125 A1 | 8/2007 | Ikeda et al. |
| 2007/0210322 A1 | 9/2007 | Ohsawa et al. |
| 2007/0222376 A1 | 9/2007 | Ohsawa et al. |
| 2008/0135858 A1 | 6/2008 | Yamazaki et al. |
| 2008/0278064 A1 | 11/2008 | Kumaki et al. |
| 2009/0102366 A1 | 4/2009 | Ushikubo et al. |
| 2009/0167158 A1* | 7/2009 | Kathirgamanathan et al. ............... 313/504 |
| 2009/0167168 A1 | 7/2009 | Seo et al. |
| 2009/0242911 A1 | 10/2009 | Ishihara et al. |
| 2010/0133523 A1 | 6/2010 | Nowatari et al. |
| 2010/0133573 A1 | 6/2010 | Nowatari et al. |
| 2010/0134456 A1 | 6/2010 | Oyamada |
| 2010/0282309 A1 | 11/2010 | Pschirer et al. |
| 2010/0301316 A1 | 12/2010 | Nowatari et al. |
| 2010/0301317 A1 | 12/2010 | Nowatari et al. |
| 2011/0057179 A1 | 3/2011 | Nowatari et al. |
| 2011/0215307 A1 | 9/2011 | Nowatari et al. |
| 2011/0233530 A1 | 9/2011 | Nowatari et al. |
| 2011/0240972 A1 | 10/2011 | Nowatari et al. |
| 2014/0070198 A1 | 3/2014 | Nowatari et al. |
| 2014/0264304 A1 | 9/2014 | Ohsawa et al. |
| 2015/0188071 A1 | 7/2015 | Yamazaki et al. |

FOREIGN PATENT DOCUMENTS

| | | |
|---|---|---|
| CN | 101414665 A | 4/2009 |
| CN | 100502086 C | 6/2009 |
| CN | 100527458 C | 8/2009 |
| CN | 101636856 A | 1/2010 |
| EP | 0 687 133 A2 | 12/1995 |
| EP | 0 882 768 A2 | 12/1998 |
| EP | 0 977 288 A2 | 2/2000 |
| EP | 1 408 563 A2 | 4/2004 |
| EP | 1 478 025 A2 | 11/2004 |
| EP | 1 530 245 A2 | 5/2005 |
| EP | 1 624 502 A2 | 2/2006 |
| EP | 1 718 120 A2 | 11/2006 |
| EP | 1 833 104 A2 | 9/2007 |
| EP | 1 865 566 A1 | 12/2007 |
| EP | 2 051 310 A1 | 4/2009 |
| EP | 2 192 633 A2 | 6/2010 |
| EP | 2 365 556 A2 | 9/2011 |
| JP | 63-037991 A | 2/1988 |
| JP | 03-219679 A | 9/1991 |
| JP | 04-297076 A | 10/1992 |
| JP | 06-328856 A | 11/1994 |
| JP | 07-331237 A | 12/1995 |
| JP | 10-270171 A | 10/1998 |
| JP | 11-263919 A | 9/1999 |
| JP | 2000-058265 A | 2/2000 |
| JP | 2003-272860 A | 9/2003 |
| JP | 2004-031212 A | 1/2004 |
| JP | 2005-082577 A | 3/2005 |
| JP | 2005-082580 A | 3/2005 |
| JP | 2005-101002 A | 4/2005 |
| JP | 2005-161190 A | 6/2005 |
| JP | 2005-166637 A | 6/2005 |
| JP | 2005-209643 A | 8/2005 |
| JP | 2006-073484 A | 3/2006 |
| JP | 2006-074022 A | 3/2006 |
| JP | 2006-173550 A | 6/2006 |
| JP | 2006-295104 A | 10/2006 |
| JP | 2007-165171 A | 6/2007 |
| JP | 2007-242733 A | 9/2007 |
| JP | 2004-281371 A | 10/2007 |
| JP | 2008-535266 | 8/2008 |
| JP | 2009-245747 A | 10/2009 |
| JP | 2009-246125 A | 10/2009 |
| TW | 201038120 | 10/2010 |
| TW | 201144386 | 12/2011 |
| WO | WO 01/15244 A1 | 3/2001 |
| WO | WO 2006/009262 A1 | 1/2006 |
| WO | WO 2006/105387 A2 | 10/2006 |
| WO | WO 2007/130047 A1 | 11/2007 |

OTHER PUBLICATIONS

Birnstock, J. et al., "54.3: Distinguished Paper: White Stacked OLED With 35 lm/W and 100,000 Hours Lifetime at 1000 cd/m2 for Display and Lighting Applications," SID Digest '08: SID International Symposium Digest of Technical Papers, vol. 39, May 20, 2008, pp. 822-825.

Kanno, H. et al., "High Efficiency Stacked Organic Light-Emitting Diodes Employing Li2O as a Connecting Layer," Japanese Journal of Applied Physics, vol. 45, No. 12, Dec. 7, 2006, pp. 9219-9223.

Nowatari, H. et al., "60.2: Intermediate Connector With Suppressed Voltage Loss for White Tandem OLEDs," SID Digest '09: SID International Symposium Digest of Technical Papers, vol. 40, May 31, 2009, pp. 899-902.

Chang, C.-C. et al., "Highly Efficient White Organic Electroluminescent Devices Based on Tandem Architecture," Applied Physics Letters, vol. 87, No. 25, Dec. 12, 2005, pp. 253501-1-253501-3.

Kanno, H. et al., "White Stacked Electrophosphorescent Organic Light-Emitting Devices Employing MoO3 as a Charge-Generation Layer," Advanced Materials, vol. 18, No. 3, 2006, pp. 339-342.

Terai, M. et al., "Electric-Field-Assisted Bipolar Charge Generation From Internal Charge Separation Zone Composed of Doped Organic Bilayer," Applied Physics Letters, vol. 90, Feb. 21, 2007, pp. 083502-1-083502-3.

Law, C.W. et al., "Effective Organic-Based Connection Unit for Stacked Organic Light-Emitting Devices," Applied Physics Letters, vol. 89, No. 13, Sep. 28, 2006, pp. 133511-1-133511-3.

Leem, D.-S. et al., "Highly Efficient Tandem p-i-n. Organic Light-Emitting Diodes Adopting a Low Temperature Evaporated Rhenium Oxide Interconnecting Layer," Applied Physics Letters, vol. 93, No. 10, Sep. 8, 2008, pp. 10330-1-103304-3.

Lai, S.L. et al., "Copper Hexadecafluorophthalocyanine and Copper Phthalocyanine as a Pure Organic Connecting Unit in Blue Tandem Organic Light-Emitting Devices," Journal of Applied Physics, vol. 101, 2007, pp. 014509-1-014509-4.

Liao, L.S. et al., "Power Efficiency Improvement in a Tandem Organic Light-Emitting Diode," Applied Physics Letters, vol. 92, No. 22, Jun. 2, 2008, pp. 223311-1-223311-3.

Chan, M-Y. et al., "Influences of Connecting Unit Architecture on the Performance of Tandem Organic Light-Emitting Devices," Advanced Functional Materials, vol. 17, No. 14, 2007, pp. 2509-2514.

Hiramoto, M. et al., "p-i-n. Like Behavior in Three-Layered Organic Solar Cells Having a Co-Deposited Interlayer of Pigments," Journal of Applied Physics, vol. 72, No. 8, Oct. 15, 1992, pp. 3781-3787.

Brabec, C.J. et al., "Photovoltaic Properties of Conjugated Polymer/methanofullerene Composites Embedded in a Polystyrene Matrix," Journal of Applied Physics, vol. 85, No. 9, May 1, 1999, pp. 6866-6872.

(56) References Cited

OTHER PUBLICATIONS

Matsumoto, T. et al., "27.5L: Late-News Paper: Multiphoton Organic EL Device Having Charge Generation Layer," SID Digest '03: SID International Symposium Digest of Technical Papers, vol. 34, 2003, pp. 979-981.
Tanaka, H. et al., "High Efficiency Polarization-Sensitive Organic Photovoltaic Devices," Applied Physics Letters, 2006, vol. 88, No. 25, pp. 253506-1-253506-3.
Tanaka, H. et al., "Polarization-Sensitive Photodiodes Composed of Organic Multilayer Thin Films," Japanese Journal of Applied Physics, 2005, vol. 44, No. 12, pp. 8676-8678.
Chinese Office Action re Application No. CN 201110087061.2, dated Dec. 2, 2014.
Taiwanese Office Action re Application No. TW 100109567, dated Dec. 3, 2014.
Chinese Office Action re Application No. CN 201110087061.2, dated Jul. 20, 2015.

* cited by examiner

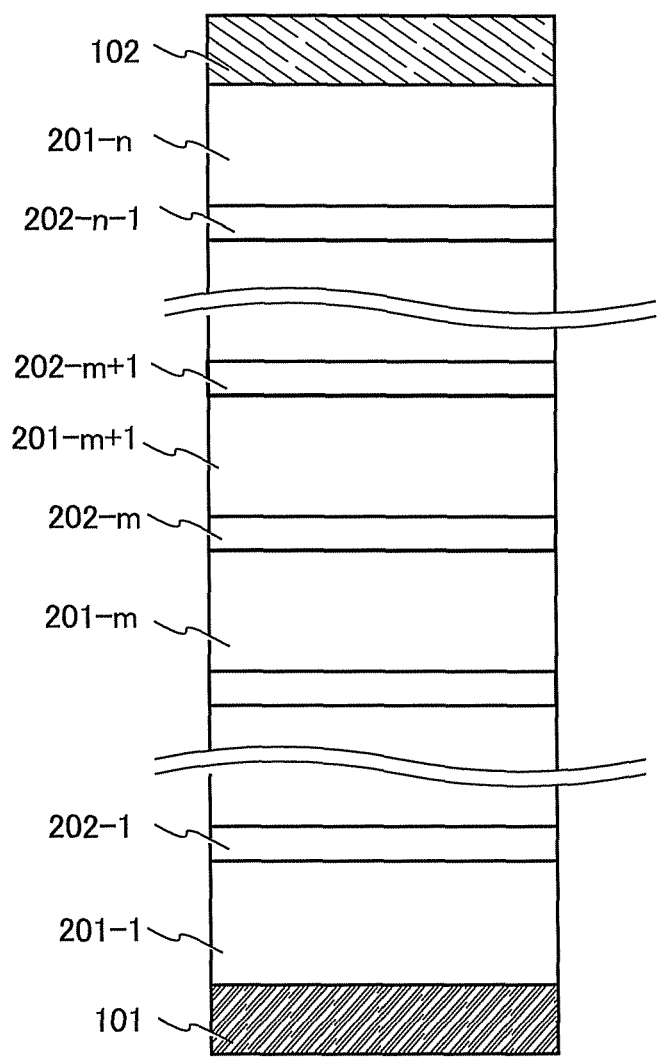

FIG. 10A
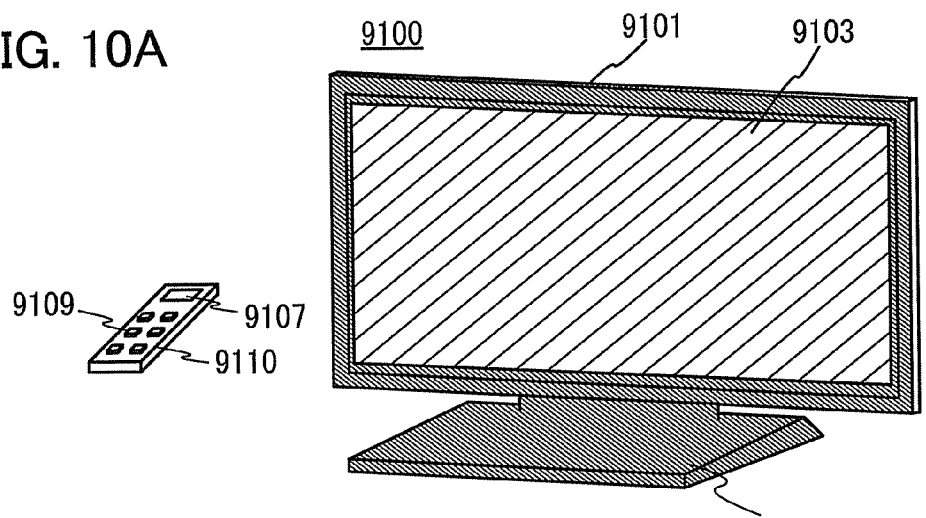
FIG. 10B
FIG. 10C
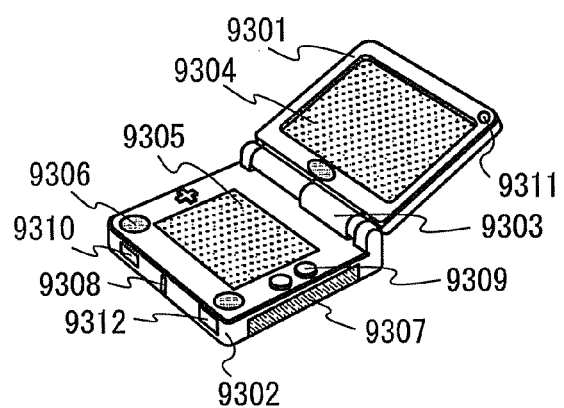
FIG. 10D
FIG. 10E
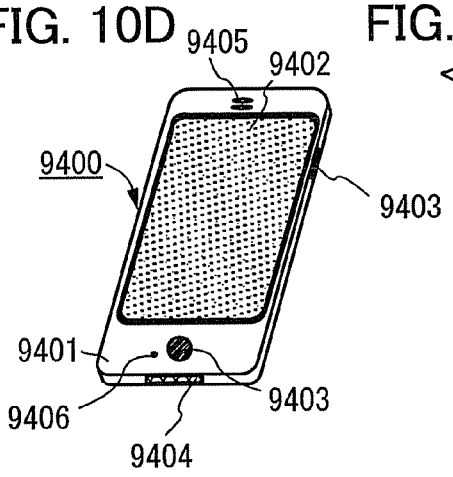
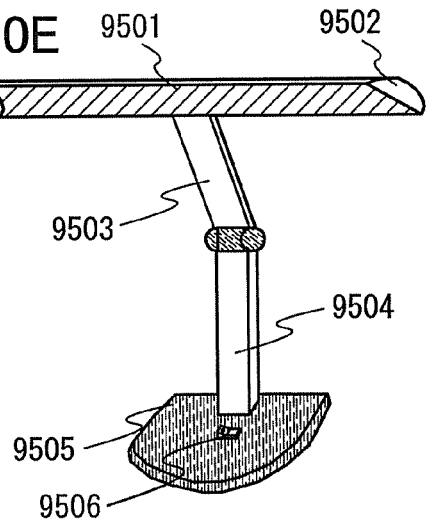

LIGHT-EMITTING ELEMENT, LIGHT-EMITTING DEVICE, ELECTRONIC DEVICE, AND LIGHTING DEVICE COMPRISING A PHTHALOCYANINE-BASED MATERIAL

BACKGROUND OF THE INVENTION

1. Field of the Invention

The present invention relates to a light-emitting element (also referred to as an EL element) including an electroluminescence layer; a light-emitting device including the light-emitting element; and an electronic device and a lighting device including the light-emitting device.

2. Description of the Related Art

A light-emitting element including an electroluminescence layer (also referred to as an EL layer) has a structure in which the EL layer is sandwiched between a pair of electrodes. When voltage is applied between the pair of electrodes, the EL layer emits light. The EL layer contains an organic compound and includes at least a light-emitting layer containing a light-emitting substance. Such a light-emitting element has a simple structure. The light-emitting element has attracted attention as a next-generation flat panel display element because of its characteristics such as thinness, light-weight, high speed response, and direct-current low-voltage driving. Further, the light-emitting element is an area light source and thus is considered applicable to a light source such as a backlight of a liquid crystal display or lighting.

An emission mechanism of the above light-emitting element will be described. When voltage is applied between the pair of electrodes, electrons injected from a cathode and holes injected from an anode recombine in the EL layer. As a result of the recombination, energy is released and light is emitted.

A light-emitting element has been proposed in which, in order to increase the emission luminance of the light-emitting element, a plurality of light-emitting units (in this specification, also referred to as EL layers) are stacked and current with the same current density as in the case of a single layer is fed (e.g., Patent Document 1).

Patent Document 1 discloses a light-emitting element in which a plurality of light-emitting units are divided by charge-generation layers. Specifically, in the light-emitting element disclosed in Patent Document 1, a charge-generation layer containing vanadium pentoxide is stacked over an electron-injection layer containing an alkali metal of a first light-emitting unit, and a second light-emitting unit is stacked over the charge-generation layer. Vanadium pentoxide contained in the charge-generation layer is a kind of metal oxide.

REFERENCE

Patent Document 1: Japanese Published Patent Application No. 2003-272860

SUMMARY OF THE INVENTION

In the light-emitting element in which the plurality of light-emitting units are stacked, as in Patent Document 1, electrons generated in the charge-generation layer are injected into the first light-emitting unit to be used for light emission of the first light-emitting unit. At the same time, holes generated in the charge-generation layer are injected into the second light-emitting unit to be used for light emission of the second light-emitting unit. However, as in Patent Document 1, the light-emitting element including the charge-generation layer containing metal oxide has a high injection barrier. When electrons are injected from the charge-generation layer into the first light-emitting unit, high voltage is needed in order to drive the light-emitting element.

In view of the above, an object of one embodiment of the present invention is to provide a light-emitting element that emits light with high luminance and can be driven at low voltage. Another object is to provide a light-emitting device whose power consumption is reduced by including the light-emitting element. Another object is to provide an electronic device and a lighting device including the light-emitting device.

One embodiment of the present invention is a light-emitting element which includes n EL layers between an anode and a cathode (n is a natural number greater than or equal to 2), and a first layer, a second layer, and a third layer between an m-th EL layer from the anode and an (m+1)th EL layer (m is a natural number, $1 \leq m \leq n-1$). The first layer is provided between the (m+1)th EL layer and the second layer, is in contact with the (m+1)th EL layer and the second layer, functions as a charge-generation region, has hole-transport properties, and contains an acceptor substance. The second layer is provided between the first layer and the third layer, is in contact with the first layer and the third layer, and is formed of a phthalocyanine-based material. The third layer is provided between the second layer and the m-th EL layer, is in contact with the second layer and the m-th EL layer, has electron-transport properties, and contains an alkali metal, an alkaline earth metal, a rare earth metal, an alkali metal compound, an alkaline earth metal compound, or a rare earth metal compound. The phthalocyanine-based material is any of copper(II) phthalocyanine (CuPC), phthalocyanine ($H_2Pc$), a phthalocyanine tin(II) complex (SnPc), a phthalocyanine zinc complex (ZnPc), a cobalt(II) phthalocyanine, β-form (CoPc), and phthalocyanine iron (FePc). The structural formulae of these phthalocyanine-based materials are shown below.

[Chemical Formulae 1]

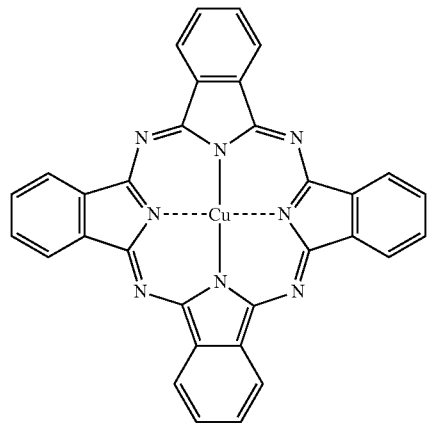

CuPc

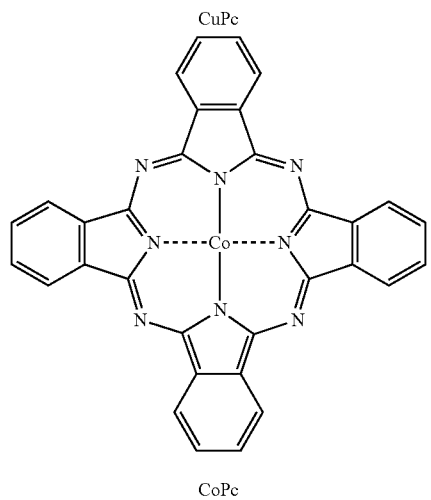

CoPc

-continued

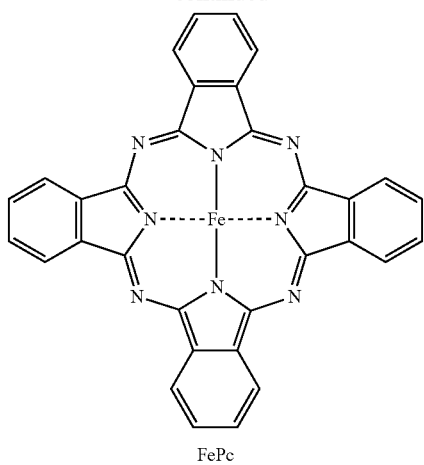

FePc

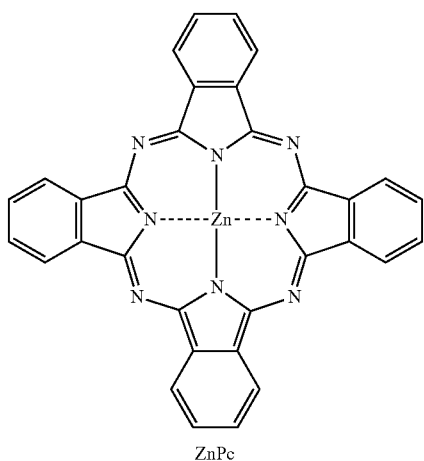

ZnPc

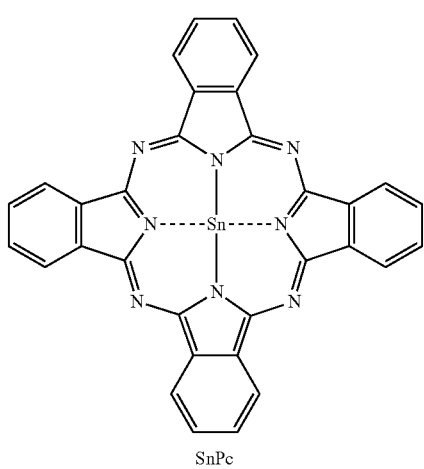

SnPc

-continued

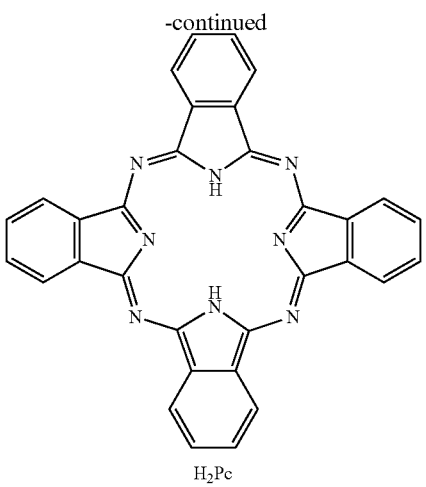

H₂Pc

Another embodiment of the present invention is a light-emitting element which includes n EL layers between an anode and a cathode (n is a natural number of two or more), and a first layer, a second layer, and a third layer between an m-th EL layer from the anode and an (m+1)th EL layer (in is a natural number, 1≤m≤n−1). The first layer is provided between the (m+1)th EL layer and the second layer, is in contact with the (m+1)th EL layer and the second layer, functions as a charge-generation region, has hole-transport properties, and contains an acceptor substance. The second layer is provided between the first layer and the third layer, is in contact with the first layer and the third layer, and is formed of a phthalocyanine-based material (also referred to as a phthalocyanine derivative) having a phenoxy group. The third layer is provided between the second layer and the m-th EL layer, is in contact with the second layer and the m-th EL layer, has electron-transport properties, and contains an alkali metal, an alkaline earth metal, a rare earth metal, an alkali metal compound, an alkaline earth metal compound, or a rare earth metal compound. The phthalocyanine-based material having a phenoxy group is PhO-VOPc (vanadyl 2,9,16,23-tetraphenoxy-29H,31H-phthalocaynine; produced by Synthon BV). A structural formula of the phthalocyanine-based material having a phenoxy group is shown below.

[Chemical Formula 2]

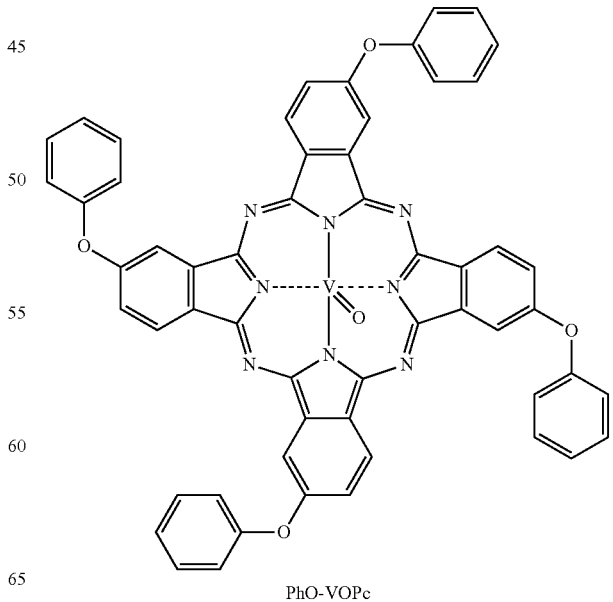

PhO-VOPc

The second layer formed of the phthalocyanine-based material is provided between the first layer which functions as a charge-generation region, has hole-transport properties, and contains an acceptor substance, and the third layer which has electron-transport properties and contains an alkali metal or the like, whereby an electron injection barrier can be lowered to inject electrons generated in the first layer into the m-th EL layer through the third layer. Thus, the light-emitting element can be driven at low voltage. Further, n EL layers are provided between the anode and the cathode, the light-emitting element can emit light with high luminance.

The LUMO level of the second layer is greater than or equal to −5.0 eV, preferably greater than or equal to −5.0 eV and less than or equal to −3.0 eV. Accordingly, electrons can be easily transferred from the first layer to the second layer and from the second layer to the m-th EL layer through the third layer. Thus, the light-emitting element can be driven at low voltage.

In the above light-emitting element, the third layer has electron-transport properties and contains an alkali metal, an alkaline earth metal, a rare earth metal, an alkali metal compound, an alkaline earth metal compound, or a rare earth metal compound. Accordingly, electrons can be transported in the third layer, and the electrons can be efficiently injected from the second layer to the EL layer (the m-th EL layer) through the third layer. Further, the third layer contains the above metal or the above metal compound, whereby an electron injection barrier at the time when electrons generated in the first layer are injected into the EL layer (the m-th EL layer) through the second layer and the third layer can be lowered to some extent.

In the above light-emitting element, as the third layer, a layer can be used which contains an electron-transport substance and in which the mass ratio of the above alkali metal, the above alkali earth metal, the above rare earth metal, the above alkali metal compound, the above alkaline earth metal compound, or the above rare earth metal compound to the hole-transport substance is from 0.001:1 to 0.1:1, in which case the above-described effect becomes pronounced.

In the above light-emitting element, the third layer contains an electron-transport substance. The third layer can have a stacked structure of a layer containing an electron-transport substance and a layer containing the above metal or the above metal compound, without limitation to a structure in which an electron-transport substance and the above metal or the above metal compound are contained in the same film.

In the above light-emitting element, the first layer functions as a charge-generation region, has hole-transport properties, and contains an acceptor substance. Accordingly, holes generated in the first layer can be efficiently transported in the first layer and the holes can be efficiently injected into the EL layer (the (m+1)th EL layer). Further, the first layer contains an acceptor substance and thus can effectively function as a charge-generation region. In addition, the first layer contains an acceptor substance; thus, an electron injection barrier at the time when electrons generated in the first layer are injected into the EL layer (the m-th EL layer) through the second layer and the third layer can be lowered to some extent.

In the above light-emitting element, as the acceptor substance contained in the first layer, an oxide of a transition metal or an oxide of a metal belonging to any of Groups 4 to 8 of the periodic table can be used. Such a material has strong acceptor properties; thus, charges can be easily generated in the first layer when voltage is applied, for example.

In the above light-emitting element, molybdenum oxide is preferably used as the acceptor substance contained in the first layer, in which case the above effect becomes pronounced. In addition, molybdenum oxide has low hygroscopicity and thus is suitable as a material used in the light-emitting element.

In the above light-emitting element, the first layer contains a hole-transport substance. The first layer is not limited to a structure in which a hole-transport substance and an acceptor substance are contained in the same film but can have as well a stacked structure of a layer containing a hole-transport substance and a layer containing a acceptor.

In the above light-emitting element, as the second layer, a layer which contains an alkali metal, an alkaline earth metal, a rare earth metal, an alkali metal compound, an alkaline earth metal compound, or a rare earth metal compound can be used. When a layer which contains the above metal or the above metal compound is used as the second layer, electrons can be transferred more easily. Thus, the light-emitting element can be driven at low voltage.

As the second layer, a layer in which the above metal or the above metal compound is contained at a mass ratio thereof to the above phthalocyanine-based material of from 0.001:1 to 0.1:1 can be used. In that case, the above-described effect becomes pronounced.

A light-emitting device may be manufactured using the above light-emitting element. In addition, an electronic device or a lighting device may be manufactured using the light-emitting device. The light-emitting element is preferably used for these purposes, in which case remarkable efficacies can be obtained.

The light-emitting device in this specification refers to an image display device, a light-emitting device, or a light source (including a lighting device). Further, the light emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted on a light emitting element by a chip on glass (COG) method.

Note that the ordinal numbers such as "first" and "second" in this specification are used for convenience and do not denote the order of steps and the stacking order of layers. In addition, the ordinal numbers in this specification do not denote particular names which specify the present invention.

According to one embodiment of the present invention, the second layer which is formed of the phthalocyanine-based material is provided between the first layer and the third layer, whereby an electron injection barrier at the time when electrons generated in the first layer are injected into the EL layer through the third layer can be lowered. Thus, the light-emitting element can be driven at low voltage. Further, the plurality of EL layers are provided between the anode and the cathode, whereby the light-emitting element can emit light with high luminance.

BRIEF DESCRIPTION OF THE DRAWINGS

FIG. 1 illustrates an example of a structure of a light-emitting element.

FIGS. 10A to 10E illustrate examples of electronic devices.

DETAILED DESCRIPTION OF THE INVENTION

Hereinafter, embodiments and examples of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description of embodiments and examples below.

(Embodiment 1)

An example of a structure of a light-emitting element which is one embodiment of the present invention will be described with reference to FIG. 1, FIGS. 2A and 2B, FIG. 3, FIGS. 4A and 4B, and FIG. 5.

A light-emitting element illustrated in FIG. 1 includes a plurality of EL layers 201 between a pair of electrodes (an anode 101 and a cathode 102). In the case where the light-emitting element has a structure in which n (n is a natural number greater than or equal to 2) layers are stacked, for example, the light-emitting element includes an EL layer 201-m (m is a natural number, 1≤m≤n−1) (also referred to as an m-th EL layer) and an EL layer 201-m+1 (also referred to as an (m+1)-th EL layer). In addition, the light-emitting element includes an intermediate layer 202-1 between the EL layer 201-1 and an EL layer 201-2 (not illustrated); an intermediate layer 202-m (also referred to as an m-th intermediate layer) between the EL layer 201-m and the EL layer 201-m+1; and an intermediate layer 202-n−1 (also referred to as an (n−1)-th intermediate layer) between an EL layer 201-n−1 (not illustrated) and an EL layer 201-n. Note that the intermediate layers are not connected to a power source or the like, and thus are in a floating state. Each of the plurality of EL layers 201 is formed of an organic compound and includes at least a light-emitting layer containing a light-emitting substance.

Figure 2A:
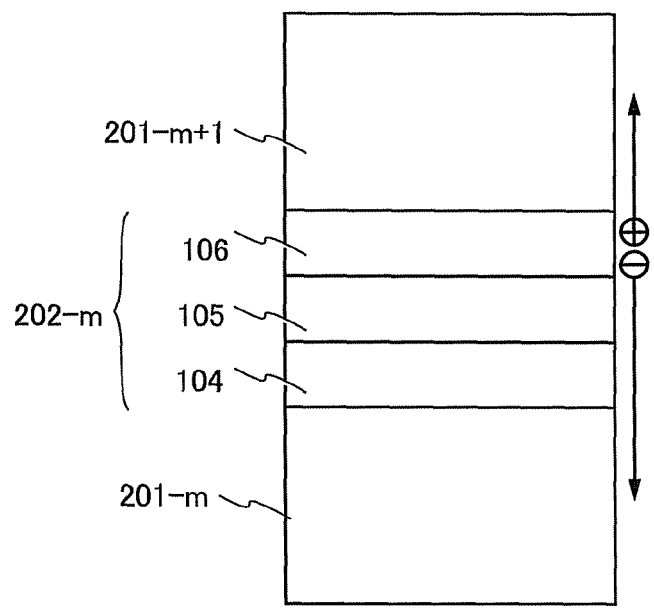
FIG. 2A illustrates an example of a structure of a light-emitting element and FIG. 2B is an example of a band diagram of the light-emitting element.

FIG. 2A illustrates part of the structure of the light-emitting element illustrated in FIG. 1 (the EL layer 201-m, the intermediate layer 202-m, the EL layer 201-m+1). As illustrated in FIG. 2A, the intermediate layer 202-m includes a first layer 106, a second layer 105, and a third layer 104 from the cathode 102 side.

The first layer 106 is provided between and is in contact with the EL layer 201-m+1 and the second layer 105. The first layer 106 functions as a charge-generation region, has hole-transport properties, and contains an acceptor substance. In addition, the first layer 106 contains a hole-transport substance. Holes and electrons are considered to be generated in such a manner that when voltage is applied between the pair of electrodes (the anode 101 and the cathode 102), for example, electrons are extracted from the hole-transport substance by the acceptor substance. The electrons generated in the first layer 106 are injected into the EL layer 201-m to be used for light emission of the EL layer 201-m. At the same time, the holes generated in the first layer 106 are injected into the EL layer 201-m+1 to be used for light emission of the EL layer 201-m+1. The first layer 106 has a thickness greater than or equal to 10 nm and less than or equal to 200 nm. A change in conductivity is small even when the thickness of the first layer 106 is increased; thus, an increase in the driving voltage of the light-emitting element can be suppressed. The adjustment of the thickness of the first layer 106 enables optical adjustment of emission without an increase in driving voltage.

The second layer 105 is provided between and is in contact with the first layer 106 and the third layer 104. The second layer 105 is formed of a phthalocyanine-based material and has functions of accepting electrons generated in the first layer 106 and donating the electrons to the EL layer 201-m through the third layer 104. Therefore, the second layer 105 functions as an electron-relay layer. Further, the LUMO level of the second layer 105 is greater than or equal to −5.0 eV, preferably greater than or equal to −5.0 eV and less than or equal to −3.0 eV, and has a function of lowering an electron injection barrier at the time when the electrons generated in the first layer 106 are injected into the EL layer 201-m through the third layer 104. Thus, providing the second layer 105 makes it possible to drive the light-emitting element at low voltage.

Specifically, the phthalocyanine-based material is preferably any of CuPc (copper(II) phthalocyanine), $H_2Pc$ (phthalocyanine), SnPc (phthalocyanine tin(II) complex), ZnPc (phthalocyanine zinc complex), CoPc (cobalt(II) phthalocyanine, β-form), and FePc (phthalocyanine iron), whose structural formulae are shown below. Each of the phthalocyanine-based materials shown below are phthalocyanine which has Cu, Co, Fe, Zn, or Sn as a central metal or phthalocyanine which does not have a central metal.

[Chemical Formulae 3]

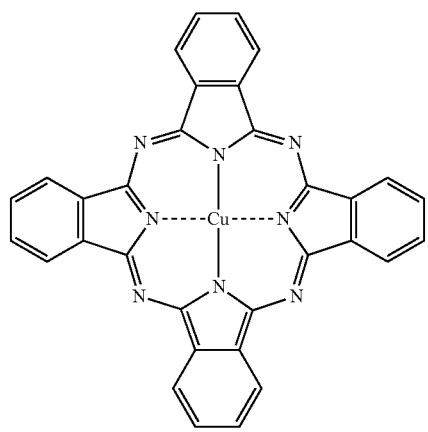

CuPc

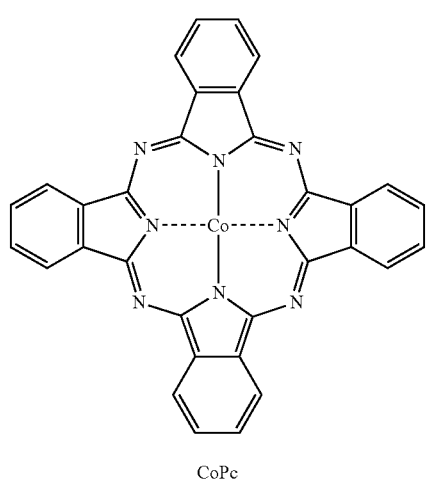

CoPc

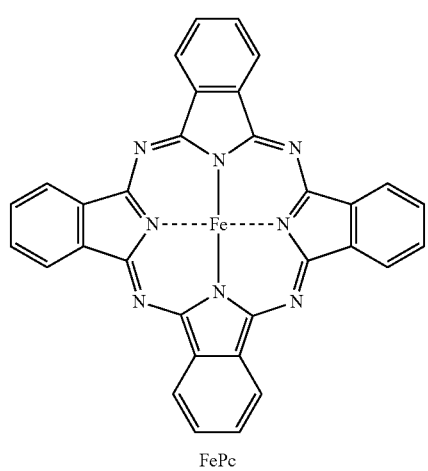

FePc

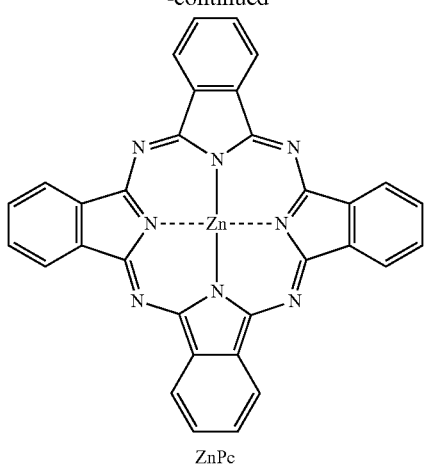

ZnPc

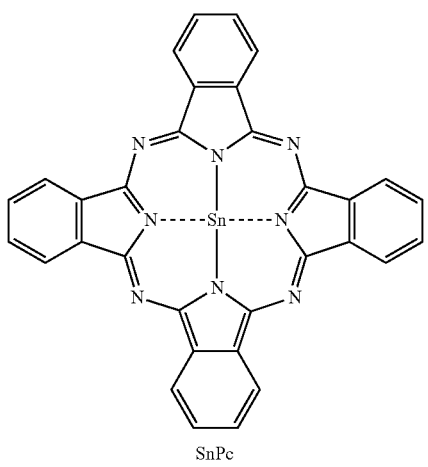

SnPc

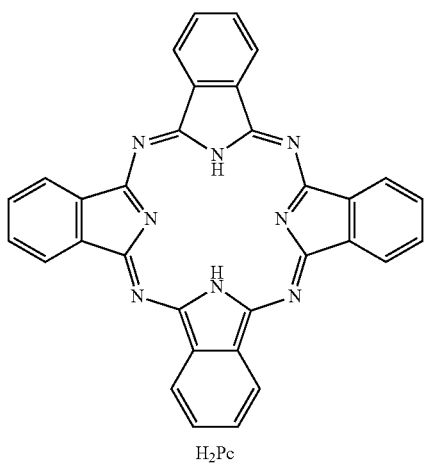

H₂Pc

Alternatively, specifically, the phthalocyanine-based material is preferably PhO-VOPc (vanadyl 2,9,16,23-tetraphenoxy-29H,31H-phthalocaynine; produced by Synthon BV) whose structural formula is shown below. The phthalocyanine material shown below is a phthalocyanine derivative having a phenoxy group. The phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

[Chemical Formula 4]

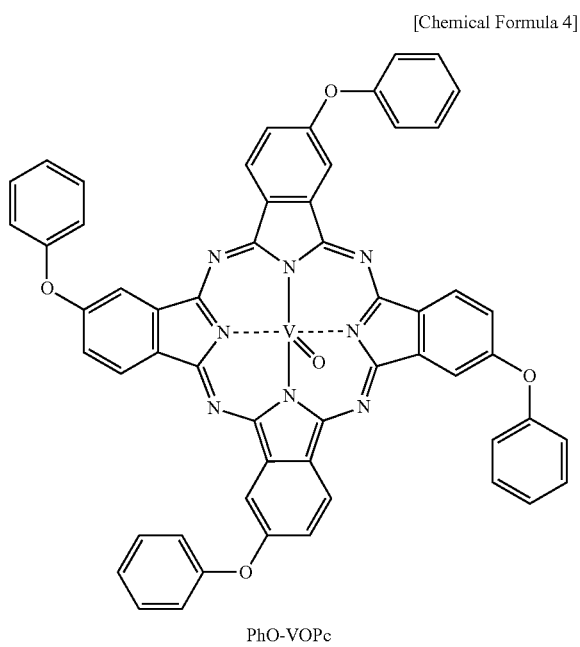

PhO-VOPc

The third layer 104 is provided between and is in contact with the second layer 105 and the EL layer 201-m. The third layer 104 has electron-transport properties, contains an alkali metal, an alkaline earth metal, a rare earth metal, an alkali metal compound, an alkaline earth metal compound, or a rare earth metal compound, and has a function of donating the electrons accepted from the second layer 105 to the EL layer 201-m. The electrons can be transported efficiently in the third layer 104. Thus, electrons can be efficiently injected from the second layer 105 to the EL layer 201-m through the third layer 104. Further, the third layer 104 contains the above metal or the above metal compound, whereby an electron injection buffer at the time when electrons generated in the first layer 106 are injected to the EL layer 201-m through the second layer 105 and the third layer 104 can be lowered to some extent. Thus, the third layer 104 functions as an electron-injection buffer layer.

In the case where the second layer 105 is not provided, the first layer 106 which functions as a charge-generation region, has hole-transport properties, and contains an acceptor substance and the third layer 104 which has electron-transport properties and contains an alkali metal, an alkaline earth metal, a rare earth metal, an alkali metal compound, an alkali earth metal compound, or a rare earth metal compound are directly in contact with each other. The first layer 106 is a p-type region and the third layer 104 is an n-type region; thus, when the first layer 106 and the third layer 104 are in contact with each other, a p-n junction is formed, which results in formation of a depletion layer. Thus, the driving voltage of the light-emitting element is increased.

In contrast, in one embodiment of the present invention, the second layer 105 is provided between the first layer 106 and the third layer 104, whereby the above depletion layer can be prevented from being formed. Thus, providing the second layer 105 makes it possible to suppress an increase in the driving voltage of the light-emitting element.

Further, in the case where the second layer 105 is not provided, the first layer 106 which functions as a charge-generation region, has hole-transport properties, and contains an acceptor substance and the third layer 104 which has electron-transport properties and contains an alkali metal, an alkaline earth metal, a rare earth metal, an alkali metal compound, an alkali earth metal compound, or a rare earth metal compound are directly in contact with each other. The acceptor substance contained in the first layer 106 has strong acceptor properties, and the above metal or the above metal compound contained in the third layer 104 has strong donor properties. Accordingly, when the first layer 106 and the third layer 104 are in contact with each other, the probability that a substance with strong acceptor properties and a substance with strong donor properties come close to each other is increased. When a substance with strong acceptor properties and a substance with strong donor properties come close to each other, the substances interact with each other, which results in inhibition of the functions of the acceptor substance and the donor substance. Thus, the driving voltage of the light-emitting element is increased.

In contrast, in one embodiment of the present invention, the second layer 105 is provided between the first layer 106 and the third layer 104, whereby the mutual interaction between the substance with strong acceptor properties and the substance with strong donor properties can be prevented. Thus, providing the second layer 105 makes it possible to suppress an increase in the driving voltage of the light-emitting element.

Description will be made below with reference to band diagrams.

Figure 2B:
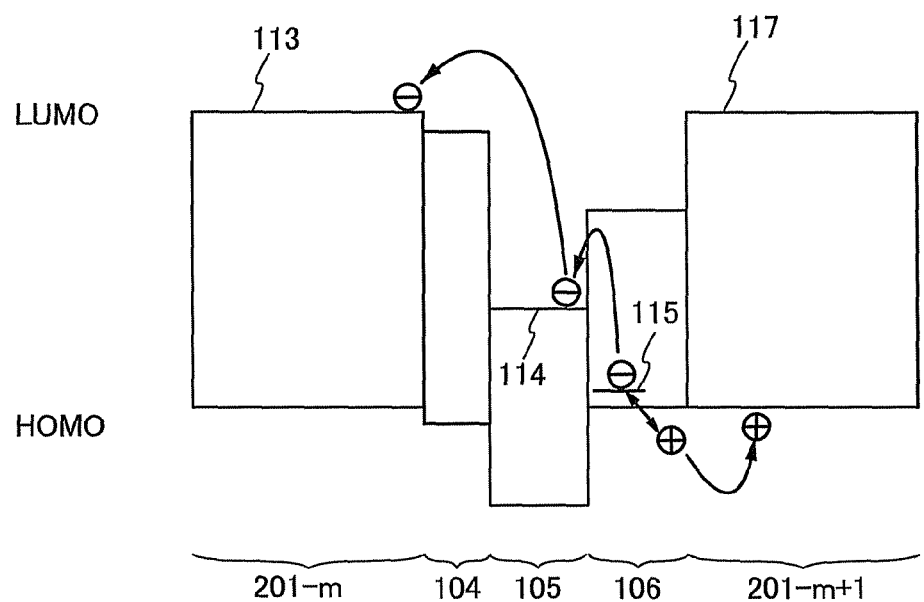

FIG. 2B is a band diagram of the element structure illustrated in FIG. 2A. In FIG. 2B, the reference numeral 113 denotes the lowest unoccupied molecular orbital (LUMO) level of the EL layer 201-m; 114, the LUMO level of the second layer 105; 115, the acceptor level of the acceptor substance in the first layer 106; and 117, the LUMO level of the EL layer 201-m+1.

Holes and electrons are considered to be generated in the first layer 106 in such a manner that when voltage is applied to the EL element, electrons are extracted from the hole-transport substance by the acceptor substance. The electrons generated in the first layer 106 are injected into the EL layer 201-m to be used for light emission of the EL layer 201-m. At the same time, the holes generated in the first layer 106 are injected into the EL layer 201-m+1 to be used for light emission of the EL layer 201-m+1.

The first layer 106 has hole-transport properties; thus, holes generated in the first layer 106 are efficiently transported in the layer. Thus, the holes can be efficiently injected into the EL layer 201-m+1. Further, the first layer 106 contains an acceptor substance, whereby the first layer 106 can effectively function as a charge-generation region. In addition, the first layer 106 contains an acceptor substance, whereby an electron injection buffer at the time when electrons generated in the first layer 106 are injected into the EL layer 201-m through the second layer 105 and the third layer 104 can be lowered to some extent.

The second layer 105 is formed of the above phthalocyanine-based material and has functions of accepting electrons generated in the first layer 106 and donating the electrons to the EL layer 201-m through the third layer 104. Thus, the second layer 105 functions as an electron-relay layer.

The LUMO level 114 of the second layer 105 is controlled so as to be located between the acceptor level 115 of the acceptor substance in the first layer 106 and the LUMO level 113 of the EL layer 201-m. Accordingly, an electron injection barrier at the time when electrons generated in the first layer 106 are injected into the EL layer 201-m can be lowered. Specifically, the LUMO level 114 of the second layer 105 is greater than or equal to −5.0 eV and less than or equal to −3.0 eV. Thus, the light-emitting element can be driven at low voltage.

Electrons transferred from the acceptor level 115 of the first layer 106 to the LUMO level 114 of the second layer 105 are donated to the third layer 104. The third layer 104 has electron-transport properties; thus, the electrons transferred to the third layer 104 are efficiently transported in the layer and are easily injected into the LUMO level 113 of the EL layer 201-m. The third layer 104 contains the above alkali metal, the above alkaline earth metal, the above rare earth metal, the above alkali metal compound, the above alkaline earth metal compound, or the above rare earth metal compound, and thus has a function of lowering an electron injection barrier to some extent. Accordingly, the electrons can be transferred more easily.

After that, the electrons recombine with holes injected from the anode 101 side in the EL layer 201-m, so that the EL layer 201-m emits light. On the other hand, holes generated in the first layer 106 recombine with electrons injected from the cathode 102 side in the EL layer 201-m+1, so that the EL layer 201-m+1 emits light.

As described above, although the second layer 105 is formed of the phthalocyanine-based material, the second layer 105 may contain an alkali metal, an alkaline earth metal, a rare earth metal, an alkali metal compound, an alkaline earth metal compound, or a rare earth metal compound. The above metal or the above metal compound serves as a donor substance with respect to the phthalocyanine-based material.

Figure 3:
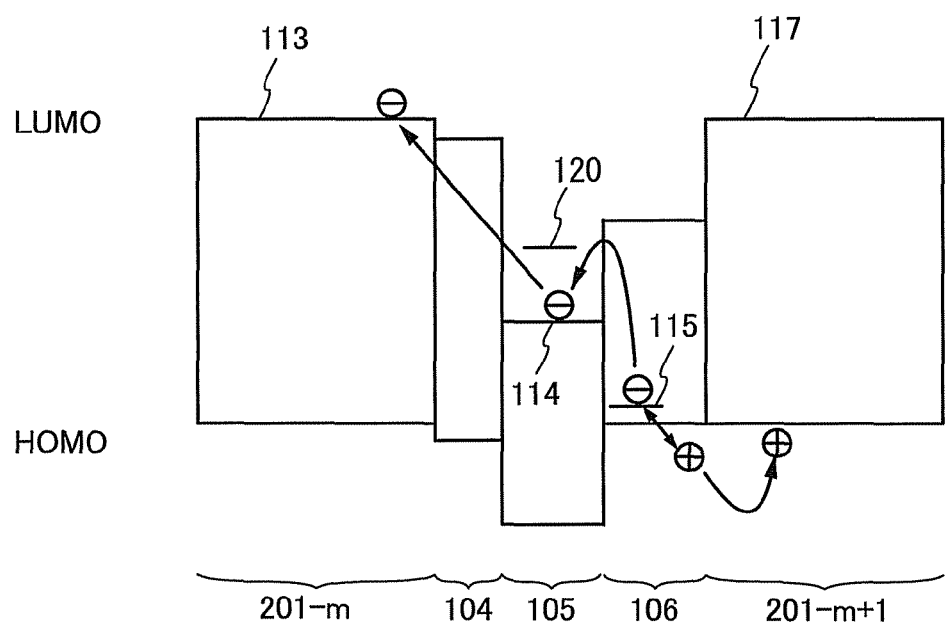
FIG. 3 is an example of a band diagram of a light-emitting element.

FIG. 3 is an example of a band diagram in the case where an alkali metal or the like is contained in the second layer 105. In FIG. 3, the reference numeral 120 denotes a donor level of a donor substance in the second layer 105. The donor level 120 is formed to be located between the acceptor level 115 of the acceptor substance in the first layer 106 and the LUMO level 113 of the EL layer 201-m. Specifically, the donor level of the donor substance is greater than or equal to −5.0 eV and less than or equal to −3.0 eV.

The donor level 120 affects the LUMO level 114 of the second layer 105. Accordingly, electrons can be easily transferred from the acceptor level 115 of the first layer 106 to the LUMO level 114 of the second layer 105.

The first layer 106, the second layer 105, and the third layer 104 will be described below.

The first layer 106 functions as a charge-generation region, has hole-transport properties, and contains an acceptor substance. In addition, the first layer 106 contains a hole-transport substance.

As the hole-transport substance, any of a variety of organic compounds such as an aromatic amine compound, a carbazole derivative, aromatic hydrocarbon, and a high molecular compound (e.g., an oligomer, a dendrimer, or a polymer). Specifically, the substance having a hole mobility of $10^{-6}$ cm$^2$/Vs or higher is preferably used. However, other substances than the above described substances may also be used as long as the substances have higher hole-transport properties than electron-transport properties.

Specific examples of the aromatic amine compound include 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(4-methylphenyl)-N,N-diphenyl-p-phenylenediamine (abbreviation: DTDPPA), 4,4'-bis[N-(4-diphenylaminophenyl)-N-phenylamino]biphenyl (abbreviation: DPAB), 1,3,5-tris[N-(4-diphenylaminophenyl)-N-phenylamino]benzene (abbreviation: DPA3B), 4-phenyl-4'-(9-phenylfluoren-9-yl)triphenylamine (abbreviation: BPAFLP), and the like.

Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Besides, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 9-phenyl-3-[4-(10-phenyl-9-anthryl)phenyl]-9H-carbazole (abbreviation: PCzPA), 1,4-bis[4-(N-carbazolyl)phenyl]-2,3,5,6-tetraphenylbenzene, and the like.

Specific examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Further, the aromatic hydrocarbon may have a vinyl skeleton. Examples of the aromatic hydrocarbon having a vinyl group include 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Specific examples of the high molecular compound include poly(N-vinylcarbazole) (abbreviation: PVK), poly(4-vinyltriphenylamine) (abbreviation: PVTPA), and the like.

Here, in particular, it is preferable that the hole-transport substance do not contain an amine skeleton. The inventors have found out that in the case where the first layer 106 is formed using an acceptor substance and a hole-transport substance which does not have an amine skeleton, the first layer 106 functions as a charge-generation region although no absorption based on charge transfer interaction occurs. Hence, the first layer 106 which does not have an absorption peak in the visible light region and functions as a charge-generation region can be easily formed, whereby a reduction in emission efficiency due to absorption of light can be prevented.

Note that as in Patent Document 1, which has been given as the related art, it has been conventionally considered important that a charge transfer complex be formed by oxidation-reduction reaction in a layer which functions as a charge-generation region. In addition, according to Patent Document 1, when the ionization potential of an organic compound which is used as a hole-transport substance is 5.7 eV or higher, the oxidation-reduction reaction between the organic compound and an acceptor substance is less likely to occur. Thus, in order to promote the occurrence of oxidation-reduction reaction, a substance whose ionization potential is 5.7 eV or lower, specifically, a substance having high electron-donor properties, such as arylamine, has been conventionally considered to be necessary as an organic compound which is used as a hole-transport substance. However, when oxidation-reduction reaction occurs between such a compound having an amine skeleton and an acceptor substance, absorption based on charge transfer interaction occurs in the visible light region and the infrared region. In fact, the absorption spectrum disclosed in Patent Document 1 shows that new absorption occurs at wavelengths of around 500 nm and 1300 nm by mixing a compound having an arylamine skeleton with oxide vanadium. In addition, when the compound having an arylamine skeleton is mixed with $F_4$-TCNQ, new absorption occurs at wavelengths of around 700 nm, 900 nm, and 1200 nm. In that case, an absorption peak especially in the visible light region triggers a reduction in emission efficiency. However, formation of a charge transfer complex has been conventionally considered to be indispensable for a charge-generation layer and absorption to be inevitable.

In contrast, in one embodiment of the present invention, although the first layer 106 is formed using an acceptor substance and a hole-transport substance which does not have an amine skeleton, the first layer 106 functions as a charge-generation layer despite no absorption based on charge transfer interaction. In such a layer which functions as a charge-generation region, charges might be generated by application of an electric field, and holes and electrons might be injected into an EL layer. This aspect is different from that of a conventional layer which functions as a charge-generation region. In fact, 9-[4-(10-phenyl-9-anthracenyl)phenyl]-9H-carbazole (abbreviation: CzPA) that is one of carbazole derivatives which are hole-transport substances which do not have an amine skeleton has an ionization potential of 5.7 eV (AC-2, product of Riken Keiki Co., Ltd.), which is pretty high for a value of ionization potential. Probably because of the above, absorption based on charge transfer interaction does not occur even if CzPA is mixed with molybdenum oxide that is an acceptor substance. However, the first layer 106 functions as a charge-generation region; thus, CzPA can be used in one embodiment of the present invention.

Note that examples of the hole-transport substance which does not have an amine skeleton include the above-described carbazole derivatives such as CBP, TCPB, CzPA, PCzPA, and 1,4-bis[4-(N-carbazolyl)phenyl]-2,3,5,6-tetraphenylbenzene; and aromatic hydrocarbon such as t-BuDNA, DPPA, t-BuDBA, DNA, DPAnth, t-BuAnth, DMNA, 2-tert-butyl-9,10-di(1-naphthyl)anthracene, 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9',9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, DPVBi, and DPVPA. Further, a polymer of a carbazole derivative, such as PVK, may be used.

As the acceptor substance contained in the first layer 106, an oxide of a transition metal and an oxide of a metal belonging to any of Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting properties. Molybdenum oxide is particularly preferable because of its low hygroscopicity. Moisture adversely affects an EL element. For that reason, a material with low hygroscopicity is preferably used in an EL element.

As the first layer 106, a layer in which an acceptor substance and a hole-transport substance are contained at a mass ratio of the acceptor substance to the hole-transport substance of from 0.1:1 to 4.0:1 can be used.

The first layer 106 is not limited to a structure in which a hole-transport substance and an acceptor substance are contained in the same film and can have a stacked structure of a layer containing a hole-transport substance and a layer containing an acceptor substance. Note that in the case of the stacked structure, the layer containing a hole-transport substance is in contact with the EL layer 201-m+1.

The first layer 106 can be formed to a thickness greater than or equal to 10 nm and less than or equal to 200 mm A change in conductivity is small even when the thickness of the first layer 106 is increased; thus, an increase in the driving voltage of the light-emitting element can be suppressed. The adjustment of the thickness of the first layer 106 enables optical adjustment of emission without an increase in driving voltage.

The second layer 105 has functions of quickly accepting electrons attracted to the acceptor substance in the first layer 106 and donating the electrons to the EL layer 201-m through the third layer 104. The second layer 105 is formed of a phthalocyanine-based material. The LUMO level 114 of the second layer 105 is located between the acceptor level 115 of the acceptor substance in the first layer 106 and the LUMO level 113 of the EL layer 201-m. Specifically, the LUMO level is preferably greater than or equal to −5.0 eV and less than or equal to −3.0 eV. Providing the second layer 105 makes it possible to lower an electron injection barrier at the time when electrons generated in the first layer 106 are injected into the EL layer 201-m through the third layer 104. As the phthalocyanine-based material, specifically, any of CuPc, $H_2$Pc, SnPc, ZnPc, CoPc, and FePc can be used. Further, as the phthalocyanine-based material, specifically, PhO-VOPc can be used. The second layer 105 is provided, whereby the light-emitting element can be driven at low voltage.

A donor substance may be added to the second layer 105 so that the mass ratio of the donor substance to the phthalocyanine-based material is from 0.001:1 to 0.1:1. Examples of the donor substance include an organic compound such as tetrathianaphthacene (abbreviation: TTN), nickelocene, and decamethylnickelocene, in addition to an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and carbonate), and a rare earth metal compound (e.g., an oxide, a halide, and carbonate)).

The third layer 104 has a function of donating the electrons accepted from the second layer 105 to the EL layer 201-m. The third layer 104 has electron-transport properties and contains an alkali metal, an alkaline earth metal, a rare earth metal, a compound of the above metal (e.g., an alkali metal compound (e.g., an oxide such as lithium oxide, a halide, and carbonate such as lithium carbonate or cesium carbonate), an alkaline earth metal compound (e.g., an oxide, a halide, and carbonate), a rare earth metal compound (e.g., an oxide, a halide, and carbonate), or the like. Further, the third layer 104 contains an electron-transport substance.

As the electron-transport substance, the following can be used: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation:

BAlq), or the like. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly those having an electron mobility of $10^{-6}$ cm$^2$/V·s or higher. Note that substances other than those cited above may be used as long as they have electron-transport properties higher than hole-transport properties. Further, the third layer 104 is not limited to a single layer, and two or more layers formed of any of the substances given above may be stacked. Further, a high molecular compound such as poly[(9,9-dihexylfluorene-2,7-diyl)-co-(pyridine-3,5-diyl)] (abbreviation: PF-Py) or poly[(9,9-dioctyllfluorene-2,7-diyl)-co-(2,2'-bipyridine-6,6'-diyl)] (abbreviation: PF-BPy) can be used.

As the third layer 104, a layer can be used in which the above alkali metal, the above alkaline earth metal, the above rare earth metal, the above alkali metal compound, the above alkali earth metal compound, or the above rare earth metal compound and the electron-transport substance are contained at a mass ratio of the above metal or the above metal compound to the electron-transport substance of from 0.001:1 to 0.1:1.

The third layer 104 can efficiently transport electrons. Thus, electrons can be efficiently injected into the EL layer 201-m from the second layer 105 through the third layer 104. Further, the third layer 104 contains the above metal or the above metal compound, whereby an electron injection barrier at the time when electrons generated in the first layer 106 are injected into the EL layer 201-m through the second layer 105 and the third layer 104 can be lowered to some extent.

The third layer 104 can have a stacked structure of a layer containing an electron-transport substance and a layer containing the above metal or the above metal compound, without limitation to a structure in which an electron-transport substance and the above metal or the above metal compound are contained in the same film. Note that in the case of the stacked structure, the layer containing an electron-transport substance is in contact with the EL layer 201-m.

Further, part of the third layer 104 or the entire third layer 104 can be used as part of a layer included in the EL layer 201-m. For example, part of the third layer 104 can be used as an electron-transport layer included in the EL layer 201-m.

The first layer 106, the second layer 105, and the third layer 104 can be formed by any of a variety of methods without limitation to a dry method (e.g., a vacuum evaporation method) and a wet method (e.g., an ink-jet method and a spin coating method).

Other structures of the light-emitting element will be described below.

The anode 101 is preferably formed using a metal, an alloy, an electrically-conductive compound, a mixture of these materials, or the like, having a high work function (specifically, a work function of 4.0 eV or higher). Specifically, for example, indium oxide-tin oxide (ITO), indium oxide-tin oxide containing silicon or silicon oxide, indium oxide-zinc oxide (IZO), indium oxide containing tungsten oxide and zinc oxide, and the like can be given.

Alternatively, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), molybdenum oxide, vanadium oxide, ruthenium oxide, tungsten oxide, manganese oxide, titanium oxide, or the like may be used. Alternatively, a conductive polymer such as poly(3,4-ethylenedioxythiophene)/poly(styrenesulfonic acid) (PEDOT/PSS) or polyaniline/poly(styrenesulfonic acid) (PAniJPSS) may be used. Note that, in the case where a charge-generation region is provided in contact with the anode 101, a variety of conductive materials such as Al and Ag can be used for the anode 101 regardless of their work functions.

The anode 101 is generally formed by a sputtering method. For example, a film of indium oxide-zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, the anode 101 can be formed by a sol-gel method or the like.

The cathode 102 can be formed using a metal, an alloy, an electrically-conductive compound, a mixture of these materials, or the like, having a low work function (specifically, a work function of 3.8 eV or lower). For example, any of the following materials can be used: elements that belong to Group 1 or Group 2 of the periodic table, that is, alkali metals such as lithium (Li) and cesium (Cs) or alkaline-earth metals such as magnesium (Mg), calcium (Ca), or strontium (Sr), or alloys thereof (e.g., Mg—Ag and Al—Li); rare earth metals such as europium (Eu) and ytterbium (Yb), or alloys thereof; and the like. Note that a film of an alkali metal, an alkaline earth metal, or an alloy thereof can be formed by a vacuum evaporation method. An alloy of an alkali metal or an alkaline earth metal can also be formed by a sputtering method. Further, a silver paste or the like can be formed by an ink-jet method or the like.

Alternatively, the cathode 102 can be formed using a stack of a film of an alkali metal compound, an alkaline earth metal compound, or a rare earth metal compound (e.g., lithium fluoride (LiF), lithium oxide (LiOx), cesium fluoride (CsF), calcium fluoride (CaF$_2$), or erbium fluoride (ErF$_3$)) and a film of a metal such as aluminum.

Note that in the light-emitting element described in this embodiment, at least one of the anode and the cathode may have a property of transmitting visible light. The light-transmitting property can be ensured by using a transparent electrode such as ITO or by reducing in the thickness of an electrode Next, a specific example of the plurality of EL layers 201 will be described.

Each EL layer 201 includes at least a light-emitting layer containing a light-emitting substance. Each EL layer 201 may have a stacked structure of a light-emitting layer and a layer other than the light-emitting layer. The EL layers 201 may have different stacked structures. The EL layers 201 may be formed of different materials.

Examples of the layers other than the light-emitting layer include a layer containing a hole-injection substance and having hole-injection properties (i.e., a hole-injection layer), a layer containing a hole-transport substance and having hole-transport properties (i.e., a hole-transport layer), a layer containing an electron-transport substance and having electron-transport properties (i.e., an electron-transport layer), a layer containing an electron-injection substance and having electron-injection properties (i.e., an electron-injection layer), a layer containing a bipolar substance and having bipolar properties (electron-transport and hole-transport properties), and the like. These layers can be combined as appropriate. Further, charge-generation layers may be provided as a layer which is in contact with the anode 101 in the EL layer 201-1 and as a layer which is in contact with the cathode 102 in the EL layer 201-n.

Specific examples of substances used for forming the hole-injection layer, the hole-transport layer, the light-emitting layer, the electron-transport layer, and the electron-injection layer will be described below.

The hole-injection layer is a layer containing a hole-injection substance. As the hole-injection substance, for example, a metal oxide such as molybdenum oxide, vanadium oxide, ruthenium oxide, tungsten oxide, manganese oxide, or the like can be used. A phthalocyanine-based compound such as phthalocyanine (abbreviation: $H_2Pc$) or copper(II) phthalocyanine (abbreviation: CuPc) can be used. A polymer such as PEDOT/PSS (abbreviation) can be used.

The hole-transport layer is a layer containing a hole-transport substance. As the hole-transport substance, a substance similar to any of the hole-transport substances of the first layer 106, which have been given above, can be used. Therefore, the above description is referred to here. Note that the layer containing the hole-transport substance is not limited to a single layer, and two or more layers formed of any of the substances given above may be stacked.

The light-emitting layer is a layer containing a light-emitting substance. As the light-emitting substance, any of fluorescent compounds and phosphorescent compounds which are given below can be used. Light emission is classified into light emission from the singlet excited state and light emission from the triplet excited state. Light emission from a light-emitting layer containing a fluorescent compound is light emission from the singlet excited state and light emission from a light-emitting layer containing a phosphorescent compound is light emission from the triplet excited state.

Examples of the fluorescent compound include N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phen ylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: SPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DOM), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Examples of the phosphorescent compound include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir($CF_3$ppy)$_2$(pic)), bis[2-(4',6'-difluorophenyppyridinato-N,$C^{2'}$]iridium(III)acetylacetonate (abbreviation: FIr(acac)), tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), bis[2-(2'-benzo[4,5-a]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (dipivaloylmethanato)bis(2,3,5-triphenylpyrazinato)iridium(III) (abbreviation: Ir(tppr)$_2$(dpm)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that the light-emitting layer preferably has a structure in which these light-emitting substances are dispersed in a host material. As the host material, for example, a hole-transport substance such as an aromatic amine compound such as NPB, TPD, TCTA, TDATA, MTDATA, or 4,4'-bis[N-(spiro- 9,9'-bifluoren-2-yl)-N-phenylamino]biphenyl (abbreviation: BSPB) or a carbazole derivative such as PCzPCA1, PCzPCA2, PCzPCN1, CBP, TCPB, or CzPA can be used.

Alternatively, a hole-transport substance which contains a high molecular compound, such as poly[N-(4-{N'-[4-(4-diphenylamino)phenyl]phenyl-N'-phenylamino}phenyl) methacrylamide] (abbreviation: PTPDMA) or poly[N,N-bis(4-butylphenyl)-N,N'-bis(phenyl)benzidine] (abbreviation: Poly-TPD) can be used.

Alternatively, as the host material, for example, an electron-transport substance such as a metal complex having a quinoline skeleton or a benzoquinoline skeleton, such as Alq, Almq$_3$, BeBq$_2$, or BAlq; a metal complex having an oxazole-based ligand or a thiazole-based ligand, such as Zn(BOX)$_2$ or Zn(BTZ)$_2$; PBD; OXD-7; CO11; TAZ; BPhen; or BCP can be used.

The electron-transport layer is a layer containing an electron-transport substance. As the electron-transport substance, a substance similar to any of the electron-transport substances of the third layer 104, which have been given above, can be used. Therefore, the above description is referred to here. Further, the electron-transport layer is not limited to a single layer, and two or more layers formed of any of the substances given above may be stacked.

The electron-injection layer is a layer containing an electron-injection substance. Examples of the electron-injection substance include an alkali metal or an alkaline earth metal such as lithium fluoride (LiF), cesium fluoride (CsF), and calcium fluoride (CaF$_2$), and a compound thereof. Alternatively, an electron-transport substance containing an alkali metal, an alkaline earth metal, or a compound thereof (e.g., Alq (abbreviation) containing magnesium (Mg)) can be used as the electron-injection substance. Such a structure makes it possible to increase the efficiency of electron injection from the cathode 102.

A charge-generation layer can be provided in the EL layer 201-1 or the EL layer 201-n. In the case where a charge-generation layer is provided in the EL layer 201-1 or the EL layer 201-n, the charge-generation layer contains a hole-transport substance and an acceptor substance. The charge-generation layer may have a stacked structure of a layer containing a hole-transport substance and a layer containing an acceptor substance, without limitation to a structure in which a hole-transport substance and an acceptor substance are contained in the same film. Note that in the case of the stacked structure, the layer containing an acceptor substance is in contact with the anode 101 or the cathode 102.

Providing the charge-generation layer in the EL layer 201-1 or the EL layer 201-n makes it possible to form the anode 101 or the cathode 102 without consideration of the work function of a substance used for forming the electrodes. Note that the charge-generation layer provided in the EL layer 201-1 or the EL layer 201-n can have a similar structure to the above first layer 106 and can be formed using a similar material thereto. Therefore, the above description is referred to here.

Note that each EL layer 201 can be formed by stacking the above layers in appropriate combination. Further, as a formation method of each EL layer 201, any of a variety of methods (e.g., a dry method and a wet method) can be selected as appropriate depending on a material to be used. For example, a vacuum evaporation method, an ink-jet method, a spin coating method, or the like can be used. Further, each layer may be formed by a different formation method.

The layers containing the substances given above are combined, whereby the light-emitting element described in this embodiment can be manufactured. Light emission from the light-emitting substances given above can be obtained from the light-emitting element. Thus, light emission of a variety of colors can be obtained by changing the kind of light-emitting substance used in the light-emitting layer. Further, a plurality of light-emitting substances which emit light of different colors can be used as the light-emitting substances, whereby light emission having a broad spectrum or white light emission can also be obtained.

Figure 4A:
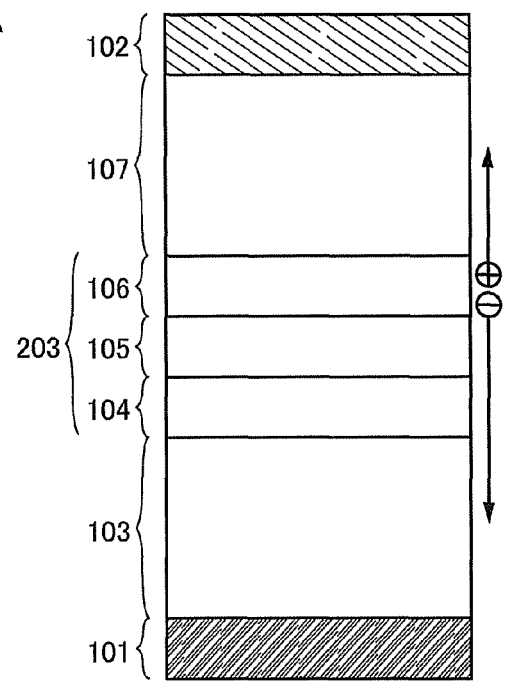
FIG. 4A illustrates an example of a structure of a light-emitting element and FIG. 4B is an example of a band diagram of the light-emitting element.
Figure 4B:
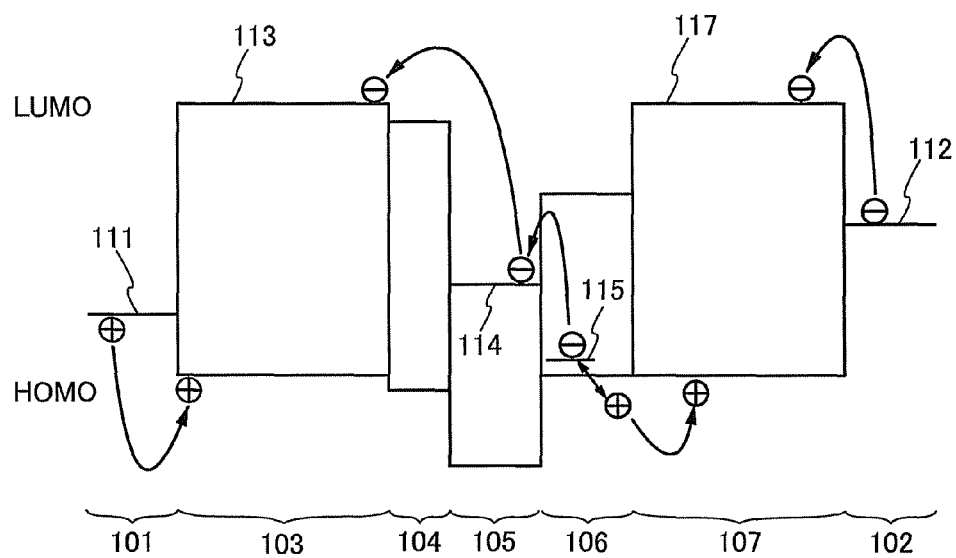

As for the light-emitting element including n EL layers, which has been described so far, it is needless to say that n may be 2 or 3. FIG. 4A illustrates a structure of a light-emitting element in the case where n is 2 and FIG. 4B is a band diagram of the light-emitting element. Note that the reference numerals 111 and 112 denote the Fermi levels of the anode 101 and the cathode 102, respectively.

In the light-emitting element illustrated in FIG. 4A, a first EL layer 103 and a second EL layer 107 each including a light-emitting region are provided between the pair of electrodes (the anode 101 and the cathode 102), and an intermediate layer 203 is provided between the first EL layer 103 and the second EL layer 107. The intermediate layer 203 includes the first layer 106, the second layer 105, and the third layer 104 from the cathode 102 side.

The first layer 106 is provided between and is in contact with the second EL layer 107 and the second layer 105. The second layer 105 is provided between and is in contact with the first layer 106 and the third layer 104. The third layer 104 is provided between and is in contact with the second layer 105 and the first EL layer 103.

Description will be made below with reference to the band diagram of FIG. 4B.

Holes and electrons are considered to be generated in the first layer 106 in such a manner that when voltage is applied between the pair of electrodes (the anode 101 and the cathode 102), electrons are extracted from a hole-transport substance by an acceptor substance. Further, the first layer 106 contains an acceptor substance and thus can effectively function as a charge-generation region. The first layer 106 has hole-transport properties; thus, holes generated in the first layer 106 are efficiently transported in the layer. Accordingly, the holes can be efficiently injected into the second EL layer 107. Further, the first layer 106 contains an acceptor substance, whereby an electron injection barrier at the time when electrons generated in the first layer 106 are injected into the first EL layer 103 through the second layer 105 and the third layer 104 can be lowered to some extent.

The second layer 105 is formed of a phthalocyanine-based material and has functions of accepting electrons generated in the first layer 106 and donating the electrons to the first EL layer 103 through the third layer 104. Thus, the second layer 105 functions as an electron-relay layer.

The LUMO level 114 of the second layer 105 is controlled so as to be located between the acceptor level 115 of the acceptor substance in the first layer 106 and the LUMO level 113 of the first EL layer 103. Accordingly, an electron injection barrier at the time when electrons generated in the first layer 106 are injected into the first EL layer 103 can be lowered. Thus, the light-emitting element can be driven at low voltage.

Electrons transferred from the acceptor level 115 of the first layer 106 to the LUMO level 114 of the second layer 105 are donated to the third layer 104. The third layer 104 has electron-transport properties; thus, the electrons transferred to the third layer 104 are efficiently transported in the layer and are easily injected into the LUMO level 113 of the first EL layer 103. The third layer 104 contains the above alkali metal, the above alkaline earth metal, the above rare earth metal, the above alkali metal compound, the above alkaline earth metal compound, or the above rare earth metal compound, and thus has a function of lowering an electron injection barrier to some extent. Accordingly, the electrons can be transferred more easily After that, the electrons recombine with holes injected from the anode 101 side in the first EL layer 103, so that the first EL layer 103 emits light. On the other hand, holes generated in the first layer 106 recombine with electrons injected from the cathode 102 side in second EL layer 107, so that the second EL layer 107 emits light.

Figure 5:
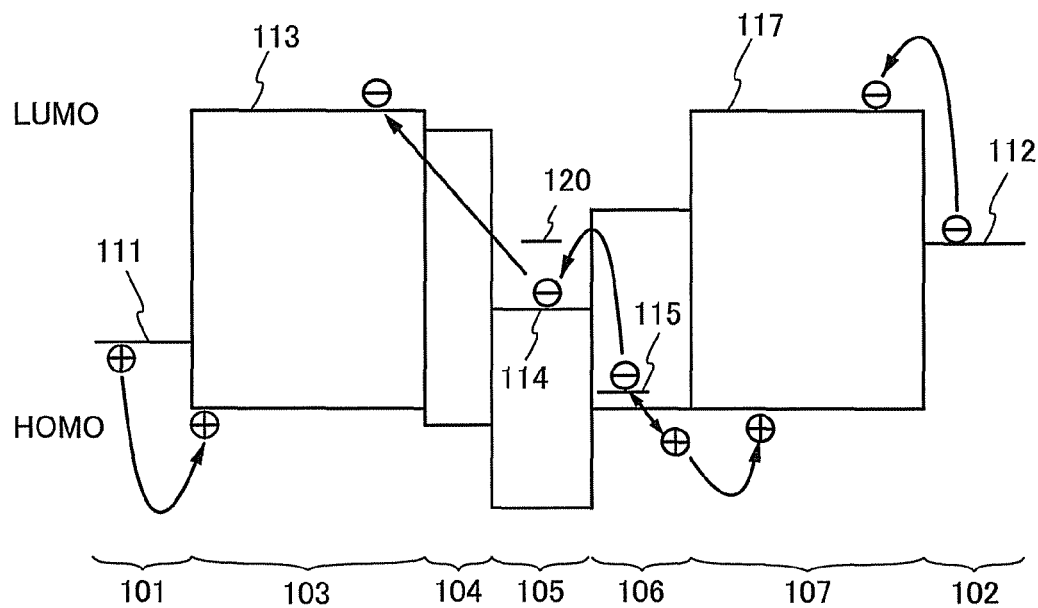
FIG. 5 is an example of a band diagram of a light-emitting element.

FIG. 5 is a band diagram in the case where the second layer 105 contains an alkali metal, an alkaline earth metal, a rare earth metal, an alkali metal compound, an alkaline earth metal compound, or a rare earth metal compound.

The reference numeral 120 in FIG. 5 denotes the level (also referred to as the donor level) of the above metal or the above metal compound in the second layer 105.

The donor level 120 affects the LUMO level 114 of the second layer 105. Accordingly, electrons can be easily transferred to the LUMO level 114 of the second layer 105 from the acceptor level 115 of the first layer 106. Thus, the light-emitting element can be driven at lower voltage Further, the light-emitting element described in this embodiment can be manufactured over any of a variety of substrates. As the substrate, for example, a substrate made of glass, plastic, a metal plate, metal foil, or the like can be used. In the case of extracting light emission of the light-emitting element from the substrate side, a light-transmitting substrate is preferably used. Note that a substrate other than the above may also be used as long as it can serve as a support in the manufacturing process of the light-emitting element.

Note that the structure described in this embodiment can be used in combination with any of the structures described in the other embodiments, as appropriate.

In Embodiments 2 to 5 described below, light-emitting elements in the case where n is 2 will be described for convenience.

(Embodiment 2)

In this embodiment, a structure of a light-emitting element which is one embodiment of the present invention and an example of a band diagram of the light-emitting element will be described with reference to FIGS. 6A and 6B. In this embodiment, an example of the light-emitting element described in Embodiment 1 will be described in which the third layer 104 has a stacked structure of a layer containing an electron-transport substance and a layer containing an alkali metal, an alkaline earth metal, a rare earth metal, an alkali metal compound, an alkaline earth metal compound, or a rare earth metal compound.

Figure 6A:
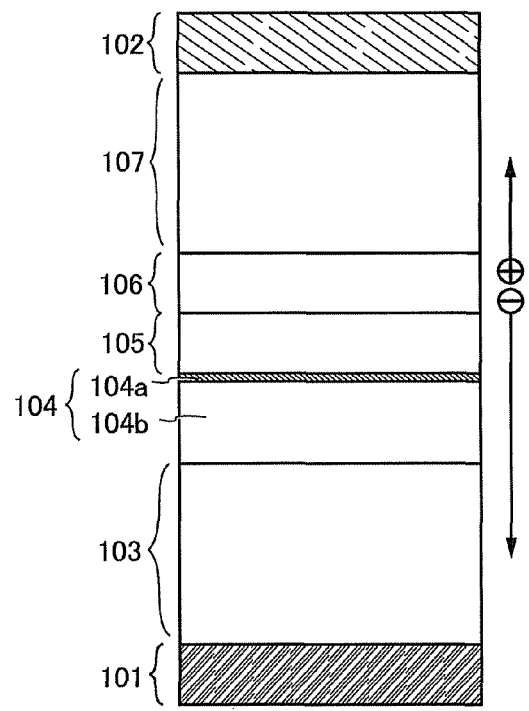
FIG. 6A illustrates an example of a structure of a light-emitting element and FIG. 6B is an example of a band diagram of the light-emitting element.

As illustrated in FIG. 6A, the light-emitting element described in this embodiment includes the first EL layer 103 and the second EL layer 107 between the pair of electrodes (the anode 101 and the cathode 102). The first EL layer 103 and the second EL layer 107 each include at least a light-emitting layer containing a light-emitting substance. Between the first EL layer 103 and the second EL layer 107, the first layer 106, the second layer 105, and the third layer 104 are provided from the cathode 102 side. The first layer 106 functions as a charge-generation region, has hole-transport properties, and contains an acceptor substance. Further, the first layer 106 contains a hole-transport substance. The second layer 105 is formed of a phthalocyanine-based material.

The anode 101, the cathode 102, the first EL layer 103, the second layer 105, the first layer 106, and the second EL layer 107 in this embodiment can have the structures described in Embodiment 1 and can be formed using the substances given in Embodiment 1.

The third layer 104 has a stacked structure of a layer 104a which is in contact with the second layer 105 and a layer 104b which is in contact with the first EL layer 103. The layer 104a contains an alkali metal, an alkaline earth metal, a rare earth metal, an alkali metal compound, an alkaline earth metal compound, or a rare earth metal compound. The layer 104b is a layer containing an electron-transport substance.

As the electron-transport substance used in the layer 104b, a substance similar to any of the electron-transport substances of the third layer 104, which have been given in Embodiment 1, can be used.

Examples of a substance used in the layer 104a include the following substances with high electron-injection properties: alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (e.g., an oxide of lithium oxide, a halide, and a carbonate such as a lithium carbonate and a cesium carbonate); alkaline earth metal compounds (e.g., an oxide, a halide, and carbonate); rare earth metal compounds (e.g., an oxide, a halide, and a carbonate); and the like. These substances with high electron-injection properties are preferable because they are stable in the air, and therefore provide high productivity and are suitable for mass production.

As the layer 104a, a single layer of the above metal or the above metal compound is provided. The layer 104a is formed to have an extremely small thickness (specifically, greater than or equal to 0.1 nm and less than or equal to 1 nm) in order to prevent an increase in driving voltage. Note that in the case where the layer 104a is formed over the layer 104b after the formation of the layer 104b, the substance used for forming the layer 104a can partly exist in the layer 104b. In other words, the layer 104a which is extremely thin exists at an interface between the second layer 105 and the layer 104b.

Description will be made below with reference to a band diagram.

Figure 6B:
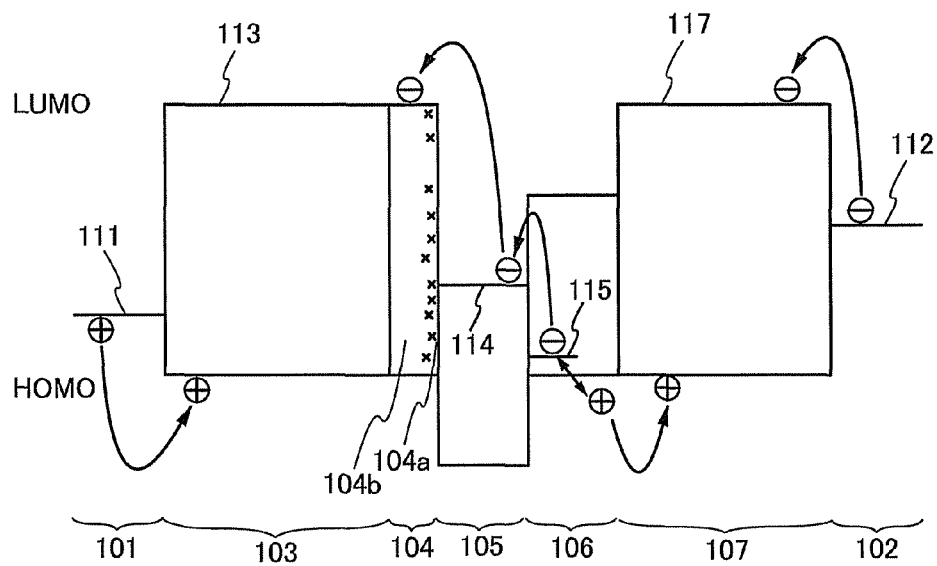

FIG. 6B is a band diagram of the element structure illustrated in FIG. 6A. In FIG. 6B, the reference numeral 113 denotes the LUMO level of the first EL layer 103; 114, the LUMO level of the second layer 105; 115, the acceptor level of an acceptor substance in the first layer 106; and 117, the LUMO level of the second EL layer 107. The symbol x denotes a substance which is contained in the third layer 104 and is formed of the above metal or the above metal compound.

Holes and electrons are considered to be generated in the first layer 106 in such a manner that when voltage is applied between the pair of electrodes (the anode 101 and the cathode 102), electrons are extracted from a hole-transport substance by an acceptor substance. Further, the first layer 106 contains an acceptor substance and thus can effectively function as a charge-generation region. The first layer 106 has hole-transport properties; thus, holes generated in the first layer 106 are efficiently transported in the layer. Accordingly, the holes can be efficiently injected into the second EL layer 107. Further, the first layer 106 contains an acceptor substance, whereby an electron injection barrier at the time when electrons generated in the first layer 106 are injected into the first EL layer 103 through the second layer 105 and the third layer 104 can be lowered to some extent.

The second layer 105 is formed of a phthalocyanine-based material and has functions of accepting electrons generated in the first layer 106 and donating the electrons to the first EL layer 103 through the third layer 104. Thus, the second layer 105 functions as an electron-relay layer.

The LUMO level 114 of the second layer 105 is controlled so as to be located between the acceptor level 115 of the acceptor substance in the first layer 106 and the LUMO level 113 of the first EL layer 103. Accordingly, an electron injection barrier at the time when electrons generated in the first layer 106 are injected into the first EL layer 103 can be lowered. Specifically, the LUMO level 114 of the second layer 105 is preferably about greater than or equal to −5.0 eV and less than or equal to −3.0 eV. Thus, the light-emitting element can be driven at low voltage.

Electrons transferred to the LUMO level 114 of the second layer 105 from the acceptor level 115 of the first layer 106 are donated to the third layer 104 (the layer 104a and the layer 104b). Providing the layer 104a at the interface between the second layer 105 and the layer 104b makes it possible to lower an injection barrier between the first layer 106 and the layer 104b to some extent. Accordingly, electrons generated in the first layer 106 can be easily injected into the layer 104b. The layer 104b has electron-transport properties; thus, the electrons transferred to the layer 104b are efficiently transported in the layer and are easily injected into the LUMO level 113 of the first EL layer 103. Note that the layer 104b can also function as an electron-transport layer of the first EL layer 103. Alternatively, an electron-transport layer may be additionally formed in the first EL layer 103. In the case where an electron-transport layer is additionally formed, an electron-transport substance used in the layer 104b and an electron-transport substance used in the electron-transport layer may be the same or different.

After that, the electrons recombine with holes injected from the anode 101 side in the first EL layer 103, so that the first EL layer 103 emits light. In contrast, holes generated in the first layer 106 recombine with electrons injected from the cathode 102 side in the second EL layer 107, so that the second EL layer 107 emits light.

In this embodiment, the third layer 104 has the stacked structure of the layer 104b containing an electron-transport substance and the layer 104a containing a metal or a metal compound. The driving voltage of the light-emitting element which includes the third layer 104 having the stacked structure of the layer 104b and the layer 104a as described above is lower than the driving voltage of a light-emitting element which includes a third layer having a structure in which an electron-transport substance and a metal or a metal compound are contained in the same film.

The structure described in this embodiment can be used in appropriate combination with any of the structures described in the other embodiments.

For example, as described in Embodiment 1, a donor substance may be added to the second layer 105 so that the mass ratio of the donor substance to the phthalocyanine-based material is from 0.001:1 to 0.1:1. In that case, any of the donor substances given in Embodiment 1 can be used as the donor substance.

(Embodiment 3)

In this embodiment, a structure of a light-emitting element which is one embodiment of the present invention and an example of a band diagram of the light-emitting element will be described with reference to FIGS. 7A and 7B. In this embodiment, the case will be described where the third layer 104 in the light-emitting element described in Embodiment 1 contains an electron-transport substance and an alkali metal, an alkaline earth metal, a rare earth metal, an alkali metal compound, an alkaline earth metal compound, or a rare earth metal compound.

Figure 7A:
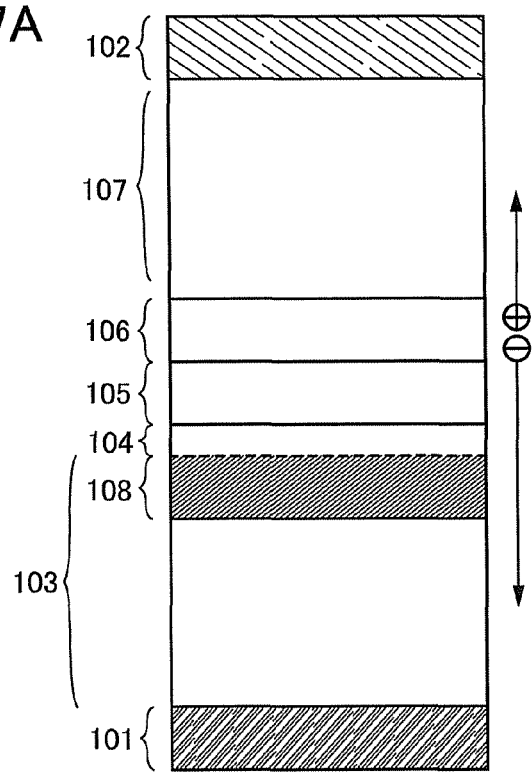
FIG. 7A illustrates an example of a structure of a light-emitting element and FIG. 7B is an example of a band diagram of the light-emitting element.

As illustrated in FIG. 7A, the light-emitting element described in this embodiment includes the first EL layer 103 and the second EL layer 107 between the pair of electrodes (the anode 101 and the cathode 102). The first EL layer 103 and the second EL layer 107 each include at least a light-emitting layer containing a light-emitting substance. Between the first EL layer 103 and the second EL layer 107, the first layer 106, the second layer 105, and the third layer 104 are provided from the cathode 102 side. The first layer 106 functions as a charge-generation region, has hole-transport properties, and contains an acceptor substance. Further, the first layer 106 contains a hole-transport substance. The second layer 105 is formed of a phthalocyanine-based material.

The anode 101, the cathode 102, the first EL layer 103, the second layer 105, the first layer 106, and the second EL layer 107 in this embodiment can have the structures described in Embodiment 1 and can be formed using the substances given in Embodiment 1.

The third layer 104 is provided between the first EL layer 103 and the second layer 105 and contains an electron-transport substance and an alkali metal, an alkaline earth metal, a rare earth metal, an alkali metal compound, an alkaline earth metal compound, or a rare earth metal compound. Note that in this embodiment, it is preferable that the above metal or the above metal compound be added so that the mass ratio of the above metal or the above metal compound to the electron-transport substance is from 0.001:1 to 0.1:1. Accordingly, the third layer 104 with high film quality can be obtained.

As the electron-transport substance used in the third layer 104, a substance similar to any of the electron-transport substances of the third layer 104 which have been given in Embodiment 1, can be used.

As the alkali metal, the alkaline earth metal, the rare earth metal, the alkali metal compound, the alkaline earth metal compound, or the rare earth metal compound which is used in the third layer 104, the above metal or the above metal compound used in the third layer 104 described in Embodiment 1 can be used.

In the first EL layer 103, an electron-transport layer 108 may be formed so as to be in contact with the third layer 104. In the case where the electron-transport layer 108 is formed in the first EL layer 103, an electron-transport substance used in the third layer 104 and an electron-transport substance used in the electron-transport layer 108 may be the same or different.

Description will be made below with reference to a band diagram.

Figure 7B:
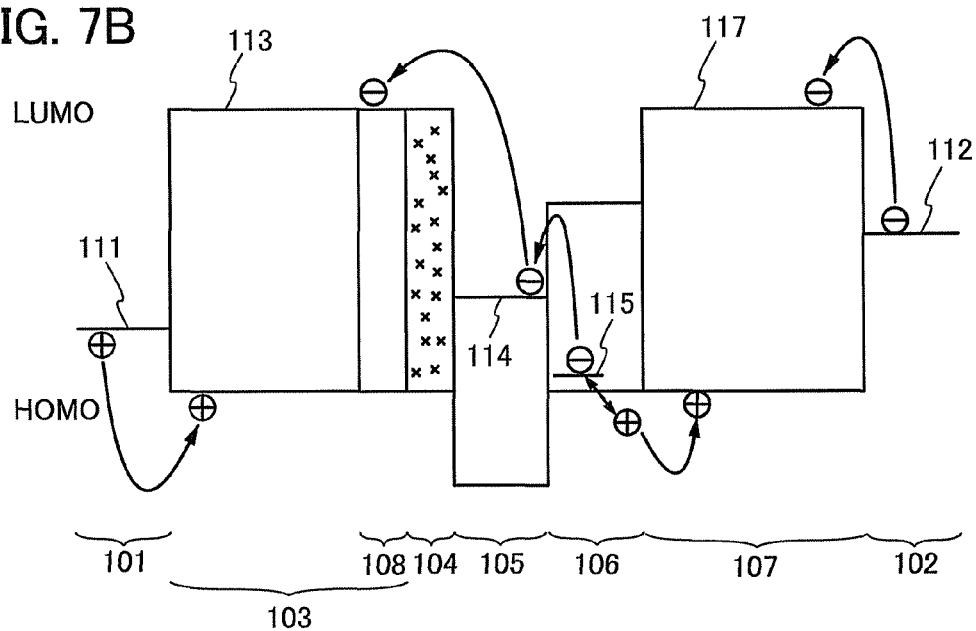

FIG. 7B is a band diagram of the element structure illustrated in FIG. 7A. In FIG. 7B, the reference numeral 113 denotes the LUMO level of the first EL layer 103; 114, the LUMO level of the second layer 105; 115, the acceptor level of an acceptor substance in the first layer 106; and 117, the LUMO level of the second EL layer 107. The symbol x denotes a substance which is contained in the third layer 104 and is formed of the above metal or the above metal compound.

Holes and electrons are considered to be generated in the first layer 106 in such a manner that when voltage is applied between the pair of electrodes (the anode 101 and the cathode 102), electrons are extracted from a hole-transport substance by an acceptor substance. Further, the first layer 106 contains an acceptor substance and thus can effectively function as a charge-generation region. The first layer 106 has hole-transport properties; thus, holes generated in the first layer 106 are efficiently transported in the layer. Accordingly, the holes can be efficiently injected into the second EL layer 107. Further, the first layer 106 contains an acceptor substance, whereby an electron injection barrier at the time when electrons generated in the first layer 106 are injected into the first EL layer 103 through the second layer 105 and the third layer 104 can be lowered to some extent.

The second layer 105 is formed of a phthalocyanine-based material and has functions of accepting electrons generated in the first layer 106 and donating the electrons to the first EL layer 103 through the third layer 104. Thus, the second layer 105 functions as an electron-relay layer.

The LUMO level 114 of the second layer 105 is controlled so as to be located between the acceptor level 115 of the acceptor substance in the first layer 106 and the LUMO level 113 of the first EL layer 103. Accordingly, an electron injection barrier at the time when electrons generated in the first layer 106 are injected into the first EL layer 103 can be lowered. Specifically, the LUMO level 114 of the second layer 105 is preferably about greater than or equal to −5.0 eV and less than or equal to −3.0 eV. Thus, the light-emitting element can be driven at low voltage.

Electrons transferred to the LUMO level 114 of the second layer 105 from the acceptor level 115 of the first layer 106 are donated to the third layer 104. The third layer 104 has electron-transport properties; thus, the electrons transferred to the third layer 104 are efficiently transported in the layer and are easily injected into the LUMO level 113 of the first EL layer 103. Further, the third layer 104 contains the alkali metal, the alkaline earth metal, the rare earth metal, the alkali metal compound, the alkaline earth metal compound, or the rare earth metal compound, and thus has a function of lowering an electron injection barrier to some extent. Accordingly, the electrons can be transferred more easily.

After that, the electrons recombine with holes injected from the anode 101 side in the first EL layer 103, so that the first EL layer 103 emits light. In contrast, holes generated in the first layer 106 recombine with electrons injected from the cathode 102 side in the second EL layer 107, so that the second EL layer 107 emits light.

The structure described in this embodiment can be used in appropriate combination with any of the structures described in the other embodiments.

For example, as described in Embodiment 1, a donor substance may be added to the second layer 105 so that the mass ratio of the donor substance to the phthalocyanine-based material is from 0.001:1 to 0.1:1. In that case, any of the donor substances given in Embodiment 1 can be used as the donor substance.

(Embodiment 4)

In this embodiment, an example of a structure of a light-emitting element which is one embodiment of the present invention will be described with reference to FIGS. 8A and 8B. In this embodiment, a structure of the first layer 106 in the light-emitting element described in Embodiment 1 will be described.

Figure 8A:
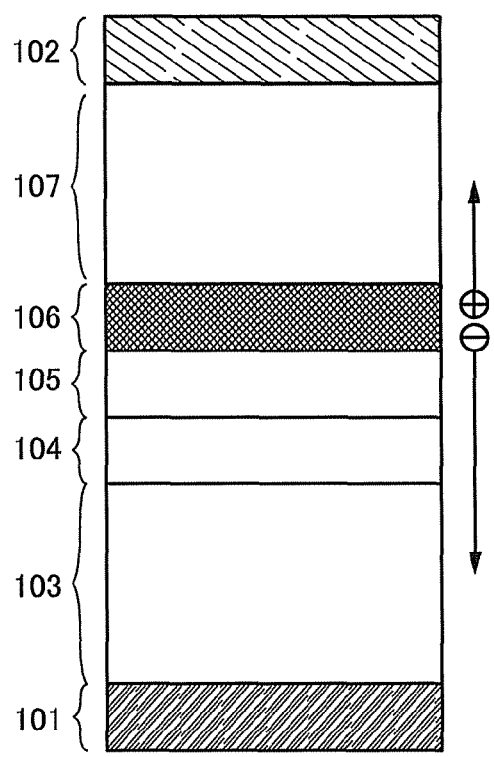
FIGS. 8A and 8B illustrate examples of structures of light-emitting elements.
Figure 8B:
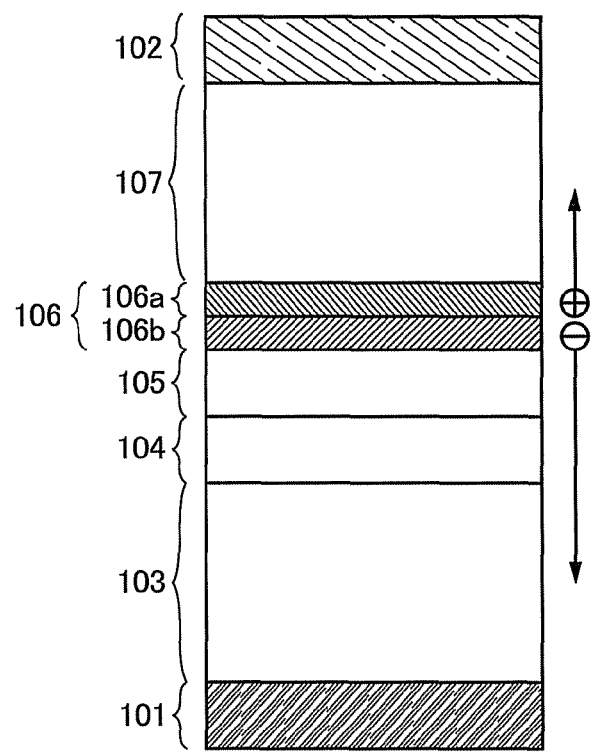

As illustrated in FIGS. 8A and 8B, the light-emitting element described in this embodiment includes the first EL layer 103 and the second EL layer 107 between the pair of electrodes (the anode 101 and the cathode 102). The first EL layer 103 and the second EL layer 107 each include at least a light-emitting layer containing a light-emitting substance. Between the first EL layer 103 and the second EL layer 107, the first layer 106, the second layer 105, and the third layer 104 are provided from the cathode 102 side. In FIGS. 8A and 8B, the anode 101, the cathode 102, the first EL layer 103, the third layer 104, the second layer 105, and the second EL layer 107 can have any of the structures described in Embodiments 1 to 3 and can be formed using any of the substances given in Embodiments 1 to 3.

The first layer 106 functions as a charge-generation region, has hole-transport properties, and contains an acceptor substance. In addition, the first layer 106 contains a hole-transport substance. Holes and electrons are considered to be generated in the first layer 106 in such a manner that when voltage is applied between the pair of electrodes (the anode 101 and the cathode 102), electrons are extracted from the hole-transport substance by the acceptor substance.

The first layer 106 illustrated in FIG. 8A has a structure in which a hole-transport substance and an acceptor substance are contained in the same film. Note that the acceptor substance is preferably added so that the mass ratio of the acceptor substance to the hole-transport substance is from 0.1:1 to 4.0:1. This facilitates generation of charges in the first layer 106.

In FIG. 8A, the acceptor substance is added to the hole-transport substance (i.e., the hole-transport substance is doped with the acceptor substance), and an increase in driving voltage can be suppressed even when the thickness of the first layer 106 is increased. Thus, an increase in driving voltage can be suppressed and color purity by optical adjustment can be improved. Further, when the thickness of the first layer 106 is increased, a short circuit of the light-emitting element can be prevented.

In contrast, the first layer 106 illustrated in FIG. 8B has a stacked structure of a layer 106a which is in contact with the second EL layer 107 and a layer 106b which is in contact with the second layer 105. The layer 106a contains a hole-transport substance. The layer 106b contains an acceptor substance.

In some cases, absorption in the visible light which is based on charge transfer interaction is exhibited in the first layer 106. In the case where the layer 106a containing a hole-transport substance and the layer 106b containing an acceptor substance are stacked, the charge transfer interaction does not act on the entire first layer 106 but acts on only the interface between the layer 106a and the layer 106b. For that reason, even in the case where absorption based on the charge transfer interaction occurs, light emitted from the first EL layer 103 is less likely to be absorbed, which is preferable.

As the hole-transport substance used in the first layer 106, a substance similar to any of the hole-transport substances of the first layer 106, which have been given in Embodiment 1, can be used.

Examples of the acceptor substance used in the first layer 106 include 7,7,8,8-tetracyano-2,3,5,6-tetrafluoroquinodimethane (abbreviation: $F_4$-TCNQ), chloranil, and the like. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. In particular, molybdenum oxide is preferable because of its low hygroscopic property.

The structure described in this embodiment can be used in appropriate combination with any of the structures described in the other embodiments.

For example, as described in Embodiment 1, a donor substance may be added to the second layer 105 so that the mass ratio of the donor substance to the phthalocyanine-based material is from 0.001:1 to 0.1:1. In that case, any of the donor substances given in Embodiment 1 can be used as the donor substance.

(Embodiment 5)

In this embodiment, an example of a structure of a light-emitting element which is one embodiment of the present invention and an example of a band diagram will be described with reference to FIGS. 9A and 9B.

Figure 9A:
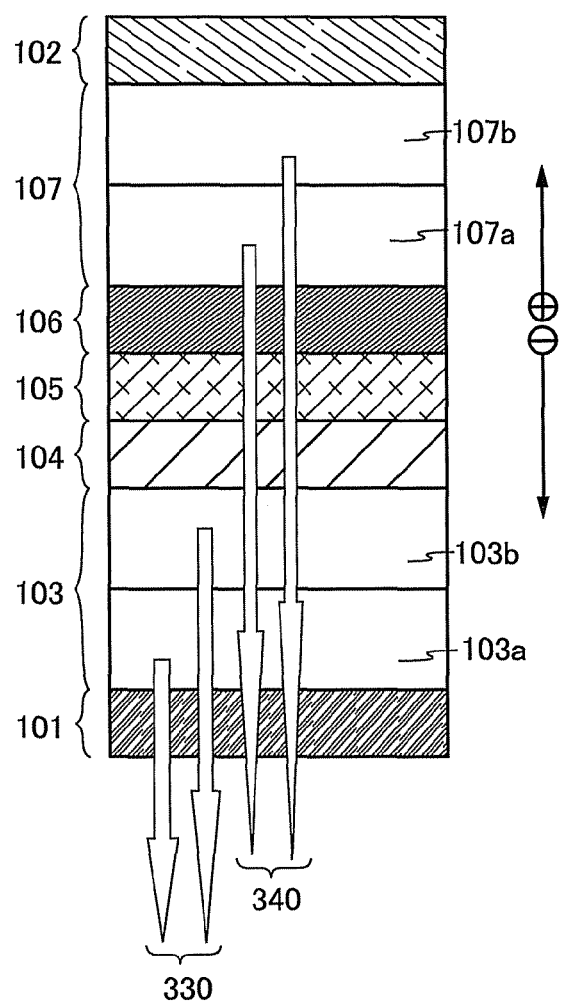
FIG. 9A illustrates an example of a structure of a light-emitting element and FIG. 9B shows examples of emission spectra of the light-emitting element.

As illustrated in FIG. 9A, the light-emitting element described in this embodiment includes the first EL layer 103 and the second EL layer 107 between the pair of electrodes (the anode 101 and the cathode 102). Each of the first EL layer 103 and the second EL layer 107 is formed of an organic compound and includes at least a light-emitting layer containing a light-emitting substance. Between the first EL layer 103 and the second EL layer 107, the first layer 106, the second layer 105, and the third layer 104 are provided from the cathode 102 side. In FIG. 9A, the anode 101, the cathode 102, the third layer 104, the second layer 105, and the first layer 106 can have any of the structures described in Embodiments 1 to 4 and can be formed using any of the substances given in Embodiments 1 to 4.

The first EL layer 103 includes a first light-emitting layer 103a which exhibits an emission spectrum having a peak in the blue to blue-green wavelength range and a second light-emitting layer 103b which exhibits an emission spectrum having a peak in the yellow to orange wavelength range. The first light-emitting layer 103a contains a first light-emitting substance. The second light-emitting layer 103b contains a second light-emitting substance. The second EL layer 107 includes a third light-emitting layer 107a which exhibits an emission spectrum having a peak in the blue-green to green wavelength range and a fourth light-emitting layer 107b which exhibits an emission spectrum having a peak in the orange to red wavelength range. The third light-emitting layer 107a contains a third light-emitting substance. The fourth light-emitting layer 107b contains a fourth light-emitting substance. The first light-emitting layer 103a and the second light-emitting layer 103b may be stacked in reverse order. The third light-emitting layer 107a and the fourth light-emitting layer 107b may be stacked in reverse order.

When voltage is applied between the pair of electrodes (the anode 101 and the cathode 102), holes injected from the anode 101 and electrons generated in the first layer 106 and injected through the second layer 105 and the third layer 104 recombine in the first light-emitting layer 103a or the second light-emitting layer 103b, whereby first light emission 330 is obtained. Furthermore, electrons injected from the cathode 102 and holes generated in and injected from the first layer 106 recombine in the third light-emitting layer 107a or the fourth light-emitting layer 107b, whereby second light emission 340 is obtained.

Figure 9B:
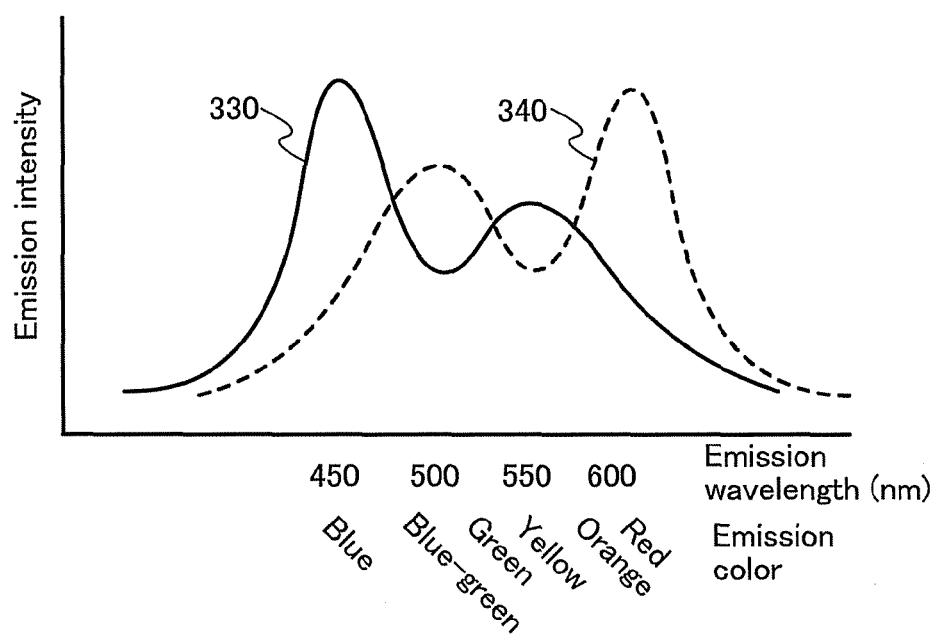

FIG. 9B schematically shows emission spectra of the first light emission 330 and the second light emission 340. The first light emission 330 is light emission from both the first light-emitting layer 103a and the second light-emitting layer 103b. Therefore, the emission spectrum having peaks in both the blue to blue-green wavelength range and the yellow to orange wavelength range is exhibited. In other words, the first EL layer 103 exhibits light emission of two-wavelength-type white color or two-wavelength-type color close to white. The second light emission 340 is light emission from both the third light-emitting layer 107a and the fourth light-emitting layer 107b. Therefore, the emission spectrum having peaks in both the blue-green to green wavelength range and the orange to red wavelength range is exhibited. In other words, the second EL layer 107 exhibits light emission of two-wavelength-type white color or two-wavelength-type color close to white which is different from the light emission of the first EL layer 103.

When the first light emission 330 and the second light emission 340 overlap with each other, the light-emitting element can exhibit light emission that covers the blue to blue-green wavelength range, the blue-green to green wavelength range, the yellow to orange wavelength range, and the orange to red wavelength range.

The contribution of the first light-emitting layer 103a to the entire emission spectrum is approximately one quarter, for example, even if the emission luminance of the first light-emitting layer 103a (which exhibits an emission spectrum having a peak in the blue to blue-green wavelength range) deteriorates over time or changes due to current density; thus, deviation of chromaticity is relatively small.

Although the example has been described in which the first EL layer 103 exhibits the emission spectrum having peaks in both the blue to blue-green wavelength range and the yellow to orange wavelength range, and the second EL layer 107 exhibits the emission spectrum having peaks in both the blue-green to green wavelength range and the orange to red wavelength range, the first EL layer 103 and the second EL layer 107 each may exhibit the opposite emission spectrum. In other words, a structure may be employed in which the second EL layer 107 exhibits the emission spectrum having peaks in both the blue to blue-green wavelength range and the yellow to orange wavelength range, and the first EL layer 103 exhibits the emission spectrum having peaks in both the blue-green to green wavelength range and the orange to red wavelength range. Further, each of the first EL layer 103 and the second EL layer 107 may have a structure in which layers other than the light-emitting layer (e.g., an electron-transport layer and a hole-transport layer) are stacked.

Next, light-emitting substances which can be used in the EL layer of the light-emitting element described in this embodiment will be described. However, substances which can be applied to the light-emitting element described in this embodiment are not limited to those given below.

Blue to blue-green light emission can be obtained, for example, by using perylene, TBP, 9,10-diphenylanthracene, or the like as a light-emitting substance (also referred to as a guest material) and dispersing the guest material in a host material. Alternatively, the blue to blue-green light emission can be obtained from a styrylarylene derivative such as DPVBi, or an anthracene derivative such as DNA or t-BuDNA. A polymer such as poly(9,9-dioctylfluorene) may be used. Further, as examples of a guest material for blue light emission, styrylamine derivatives such as YGA2S and N,N'-diphenyl-N,N'-bis(9-phenyl-9H-carbazol-3-yl)stilbene-4,4'-diamine (abbreviation: PCA2S) are given. In particular, YGA2S is preferable because it has a peak at around 450 nm. Further, as a host material, an anthracene derivative is preferable; t-BuDNA and CzPA are suitable. In particular, CzPA is preferable because it is electrochemically stable.

Blue-green to green light emission can be obtained, for example, by using a coumarin dye such as coumarin 30 or coumarin 6; FIrpic; Ir(ppy)$_2$(acac); or the like as a guest material and dispersing the guest material in a host material. Alternatively, the blue-green to green light emission can be obtained from a metal complex such as BAlq, Zn(BTZ)$_2$, or bis(2-methyl-8-quinolinolato)chlorogallium (Ga(mq)$_2$Cl). A polymer such as poly(p-phenylenevinylene) may be used. Further alternatively, the blue-green to green light emission can be obtained by dispersing perylene or TBP, which is given above, in a host material at a high concentration greater than or equal to 5 wt %. Further, an anthracene derivative is preferably used as a guest material of a blue-green to green light-emitting layer, in which case high emission efficiency can be obtained. For example, the use of DPABPA makes it possible to obtain highly efficient blue-green light emission. Further, an anthracene derivative in which an amino group has been substituted into the 2-position is preferably used, in which case highly efficient green light emission can be obtained. In particular, 2PCAPA is suitable because of its long lifetime. As a host material for these materials, an anthracene derivative is preferable; CzPA, which is given above, is preferable because it is electrochemically stable. Further, in the case where a light-emitting element which has two peaks in the blue to green wavelength range is manufactured by combining green light emission and blue light emission, an anthracene derivative with electron-transport properties, such as CzPA, is preferably used as a host material for a blue-light-emitting layer and an aromatic amine compound with hole-transport properties, such as NPB, is preferably used as a host material for a green-light-emitting layer, in which case light emission can be obtained at the interface between the blue-light-emitting layer and the green-light-emitting layer. In other words, in such a case, an aromatic amine compound such as NPB is preferable as a host material for a green light-emitting material such as 2PCAPA.

Yellow to orange light emission can be obtained, for example, by using rubrene, DCM1, DCM2, bis[2-(2-thienyl) pyridinato]acetylacetonatoiridium (abbreviation: Ir(thp)$_2$(acac)), bis(2-phenylquinolinato)acetylacetonatoiridium (abbreviation: Ir(Pq)$_2$(acac)), or the like as a guest material and dispersing the guest material in a host material. In particular, a tetracene derivative such as rubrene is preferable as a guest material because it has high efficiency and chemical stability. As a host material in this case, an aromatic amine compound such as NPB is preferable. Alternatively, a metal complex such as bis(8-quinolinolato)zinc (abbreviation: Znq$_2$) or bis[2-cinnamoyl-8-quinolinolato]zinc (abbreviation: Znsq$_2$) can be used as a host material. Further alternatively, a polymer such as poly(2,5-dialkoxy-1,4-phenylenevinylene) may be used.

Orange to red light emission can be obtained, for example, by using BisDCM, 4-(dicyanomethylene)-2,6-bis[2-(julolidin-9-yl)ethynyl]-4H-pyran (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), Ir(thp)$_2$(acac), or the like as a guest material and dispersing the guest material in a host material. Alternatively, the orange to red light emission can be obtained from a metal complex such as Znq$_2$ or Znsq$_2$. Further alternatively, a polymer such as poly(3-alkylthiophene) may be used. As a guest material which exhibits red light emission, 4H-pyran derivatives such as BisDCM, DCM2, DCJTI, and BisDCJTM are preferable because it has high efficiency. In particular, DCJTI and BisDCJTM are preferable because they have an emission peak at around 620 nm.

As a host material in the above-described structures, a host material which has a shorter emission wavelength than the light-emitting substance or a host material which has a large energy gap is preferably used. Specifically, a hole-transport material or an electron-transport material typified by the examples given in Embodiment 1 can be selected as appropriate. Alternatively, CBP, TCTA, TCPB, or the like may be used.

As a result of combining the emission spectrum of the first EL layer and the emission spectrum of the second EL layer, the light-emitting element can exhibit white light emission which broadly covers the blue to blue-green wavelength range, the blue-green to green wavelength range, the yellow to orange wavelength range, and the orange to red wavelength range.

Note that emitted light may be made close to natural light having a continuous emission spectrum in such a manner that the thickness of each stacked layer is adjusted and slight interference of light is intentionally caused so that generation of a projected sharp peak is suppressed and an emission spectrum with a shape close to a trapezoid is obtained. Further, the position of a peak of an emission spectrum can be changed by adjusting the thickness of each stacked layer and intentionally causing slight interference of light. By adjusting the thickness of each stacked layer so that a plurality of peak intensities which appear in an emission spectrum are made substantially the same and by reducing the intervals between the peaks, white light emission having an emission spectrum with a shape close to a trapezoid can be obtained.

In order to obtain white light from each of the first EL layer 103 and the second EL layer 107 of the light-emitting element described in this embodiment, both the first light-emitting substance and the second light-emitting substance and both the third light-emitting substance and the fourth light-emitting substance need to emit light. For that reason, both a hole-transport substance and an electron-transport substance are preferably used as host materials in order to control charge-transport properties in the first EL layer 103 and the second EL layer 107. As the hole-transport substance or the electron-transport substance which can be used in the first EL layer 103 and the second EL layer 107, the substances given in Embodiment 1 can be used as appropriate.

For example, the first EL layer 103 can have a structure in which a layer containing the hole-transport substance and the first light-emitting substance, a layer containing the hole-transport substance and the second light-emitting substance, and a layer containing the electron-transport substance and the second light-emitting substance are sequentially stacked from the anode 101 side. Further, the second EL layer 107 can have a structure in which a layer containing the hole-transport substance and the third light-emitting substance, a layer containing a hole-transport substance and the fourth light-emitting substance, and a layer containing an electron-transport substance and the fourth light-emitting substance are sequentially stacked from the anode 101 side.

Further, as the first light-emitting substance and the second light-emitting substance, substances which emit light of complementary colors can be selected. Further, as the third light-emitting substance and the fourth light-emitting substance, substances which emit light of complementary colors can be selected. Examples of complementary colors include blue and yellow, and blue-green and red. A substance which emits light of blue, yellow, blue green, or red may be selected as appropriate from, for example, the light-emitting substances given above.

As described in this embodiment, when two light-emitting substances which have different emission wavelengths are contained in the EL layer, part of excitation energy of the light-emitting substance whose emission wavelength is located on the shorter wavelength side is transferred to the light-emitting substance whose emission wavelength is located on the longer wavelength side, so that the light-emitting substance whose emission wavelength is located on the longer wavelength side can emit light.

Note that the structure described in this embodiment can be used in appropriate combination with any of the structures described in the other embodiments.

(Embodiment 6)

In this embodiment, a variety of electronic devices and lighting devices which are completed by using a light-emitting device manufactured using a light-emitting element which is one embodiment of the present invention will be described with reference to FIGS. 10A to 10E and FIG. 11.

As examples of the electronic devices to which the light-emitting device manufactured using any of the light-emitting elements is applied, the following can be given: television devices (also referred to as televisions or television receivers), monitors of computers or the like, cameras such as digital cameras or digital video cameras, digital photo frames, mobile phones (also referred to as cellular phones or cellular phone devices), portable game machines, portable information terminals, audio reproducing devices, large game machines such as pachinko machines, and the like. Some specific examples of these electronic devices and lighting devices are illustrated in FIGS. 10A to 10E.

FIG. 10A illustrates an example of a television device. In a television device 9100, a display portion 9103 is incorporated in a housing 9101. The display portion 9103 can display images. A light-emitting device can be manufactured using any of the light-emitting elements described in the above embodiments, and the light-emitting device can be used as an image display device of the display portion 9103 or as a light source thereof. In addition, the housing 9101 is supported by a stand 9105.

The television device 9100 can be operated with an operation switch of the housing 9101 or a separate remote controller 9110. Channels can be switched and volume can be controlled with operation keys 9109 of the remote controller 9110 so that an image displayed on the display portion 9103 can be controlled. Furthermore, the remote controller 9110 may be provided with a display portion 9107 for displaying data output from the remote controller 9110.

Note that the television device 9100 is provided with a receiver, a modem, and the like. A general television broadcast can be received with the receiver. Moreover, when the display device is connected to a communication network with or without wires via the modem, one-way (from a sender to a receiver) or two-way (between a sender and a receiver, between receivers, or the like) information communication can be performed.

The light-emitting device manufactured using the light-emitting element which is one embodiment of the present invention consumes less power. Thus, when the light-emitting device is used as an image display device of the display portion 9103 of the television device or as a light source thereof, the television device can have a long lifetime.

FIG. 10B illustrates a computer, which includes a main body 9201, a housing 9202, a display portion 9203, a keyboard 9204, an external connection port 9205, a pointing device 9206, and the like. Note that the computer is manufactured in such a manner that a light-emitting device manufactured using the light-emitting element which is one embodiment of the present invention is used as an image display device of the display portion 9203 or as a light source thereof.

The light-emitting device manufactured using the light-emitting element which is one embodiment of the present invention consumes less power. Thus, when the light-emitting device is used as an image display device of the display portion 9203 of the computer or as a light source thereof, the computer can have a long lifetime.

FIG. 10C illustrates a portable game machine, which includes two housings, a housing 9301 and a housing 9302 which are jointed with a connector 9303 so as to be opened and folded. A display portion 9304 and a display portion 9305 are incorporated in the housing 9301 and the housing 9302, respectively. In addition, the portable game machine illustrated in FIG. 10C includes a speaker portion 9306, a recording medium insertion portion 9307, an LED lamp 9308, an input means (operation keys 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), or a microphone 9312), and the like. Needless to say, the structure of the portable game machine is not limited to the above and other structures in which a light-emitting device manufactured using the light-emitting element which is one embodiment of the present invention is used for at least one or both of the display portion 9304 and the display portion 9305 may be employed. The portable game machine may include additional accessory as appropriate. The portable game machine illustrated in FIG. 10C has a function of reading out a program or data stored in a storage medium to display it on the display portion, and a function of sharing information with another portable game machine by wireless communication. Note that the portable game machine illustrated in FIG. 10C can have a variety of functions without limitation to the above functions.

The light-emitting device manufactured using the light-emitting element which is one embodiment of the present invention consumes less power. Thus, when the light-emitting device is used as an image display device of the display portions 9304 and 9305 of the portable game machine or as a light source thereof, the portable game machine can have a long lifetime.

FIG. 10D illustrates an example of a mobile phone. A mobile phone 9400 is provided with a display portion 9402 incorporated in a housing 9401, operation buttons 9403, an external connection port 9404, a speaker 9405, a microphone 9406, and the like. Note that the mobile phone 9400 is manufactured in such a manner that a light-emitting device manufactured using the light-emitting element which is one embodiment of the present invention is used as an image display device of the display portion 9402 or as a light source thereof.

When the display portion 9402 of the mobile phone 9400 illustrated in FIG. 10D is touched with a finger or the like, data can be input to the mobile phone 9400. Users can make a call or compose a message by touching the display portion 9402 with their fingers or the like.

There are mainly three screen modes of the display portion 9402. The first mode is a display mode mainly for displaying images. The second mode is an input mode mainly for inputting data such as text. The third mode is a display-and-input mode which is a combination of the display mode and the input mode are combined.

For example, in the case of making a call or composing a message, a text input mode mainly for inputting text is selected for the display portion 9402 so that text displayed on a screen can be input. In that case, it is preferable to display a keyboard or number buttons on almost the entire screen of the display portion 9402.

When a detection device including a sensor for detecting inclination, such as a gyroscope or an acceleration sensor, is provided inside the mobile phone 9400, the detection device detects the direction of the mobile phone 9400 (whether the mobile phone 9400 is placed horizontally or vertically for a landscape mode or a portrait mode) so that the screens of the display portion 9402 can be automatically switched.

The screen modes are switched by touching the display portion 9402 or operating the operation button 9403 of the housing 9401. Alternatively, the screen modes can be switched depending on the kind of image displayed on the display portion 9402. For example, when a signal of an image displayed on the display portion is a signal of moving image data, the screen mode is switched to the display mode. When the signal is a signal of text data, the screen mode is switched to the input mode.

Furthermore, in the input mode, when input by touching the display portion 9402 is not performed for a certain period of time while a signal is detected by an optical sensor in the display portion 9402, the screen mode may be controlled so as to be switched from the input mode to the display mode.

The display portion 9402 can also function as an image sensor. For example, an image of a palm print, a fingerprint, or the like is taken when the display portion 9402 is touched with the palm or the finger, whereby personal authentication can be performed. Furthermore, by providing a backlight or a sensing light source which emits a near-infrared light in the display portion, an image of a finger vein, a palm vein, or the like can be taken.

The light-emitting device manufactured using the light-emitting element which is one embodiment of the present invention consumes less power. Thus, when the light-emitting device is used as an image display device of the display portion 9402 of the mobile phone 9400 or as a light source thereof, the mobile phone can have a long lifetime.

FIG. 10E illustrates a lighting device (a desk lamp), which includes a lighting portion 9501, a shade 9502, an adjustable arm 9503, a support 9504, a base 9505, and a power supply switch 9506. Note that the lighting device is manufactured in such a manner that a light-emitting device manufactured using the light-emitting element which is one embodiment of the present invention is used in the lighting portion 9501 (also referred to as a light source). Note that the term "lighting device" encompasses ceiling lights (ceiling-fixed lighting devices), wall lights (wall-hanging lighting devices), and the like, as well as the desk lamp illustrated in FIG. 10E.

The light-emitting device manufactured using the light-emitting element which is one embodiment of the present invention consumes less power. Thus, when the light-emitting device is used for the lighting portion 9501 (the light source) of the lighting device (the desk lamp), the lighting device (the desk lamp) can have a long lifetime.

Figure 11:
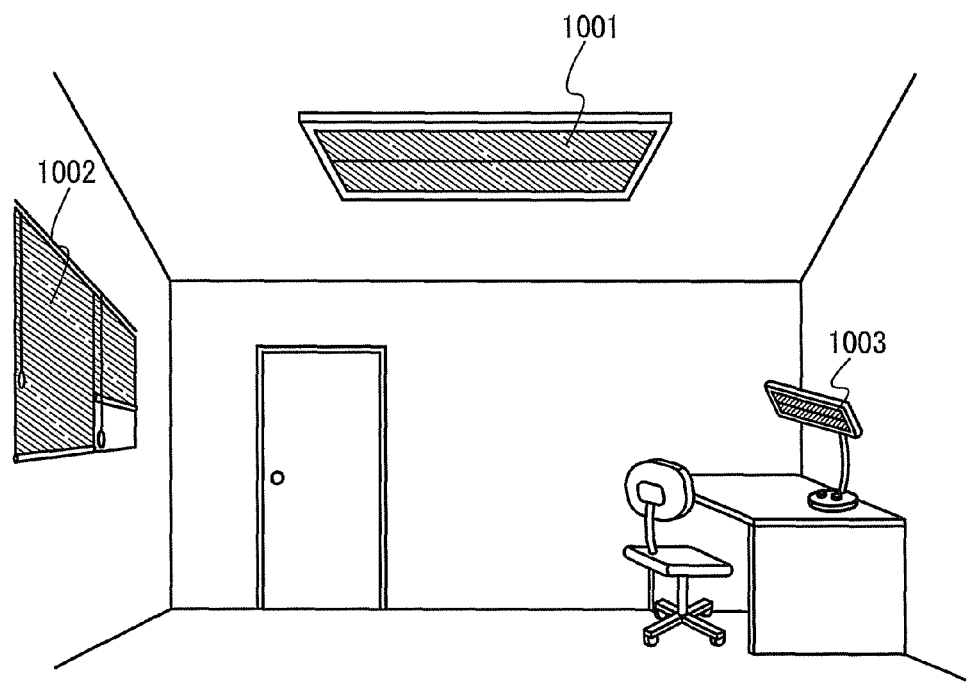
FIG. 11 illustrates examples of lighting devices.

FIG. 11 illustrates an example in which a light-emitting device manufactured using the light-emitting element which is one embodiment of the present invention is used for an interior lighting device. Since the light-emitting device manufactured using the light-emitting element which is one embodiment of the present invention can also have a larger area, the light-emitting device can be used as a large-area lighting device as illustrated by a ceiling-fixed lighting device 1001. Additionally, the light-emitting device can be used as a wall-hanging lighting device 1002. Since the light-emitting device manufactured using the light-emitting element which is one embodiment of the present invention includes the light-emitting element with low driving voltage, the light-emitting device can be used as a lighting device which consumes less power. As illustrated in FIG. 11, a desk lamp 1003 illustrated in FIG. 10E may be used together in the room provided with the interior lighting device.

As described above, the electronic devices or the lighting devices can be obtained by application of the light-emitting device manufactured using the light-emitting element which is one embodiment of the present invention. The applicable range of the light-emitting device manufactured using the light-emitting element which is one embodiment of the present invention is extremely wide, which allows the light-emitting device to be applied to electronic devices in a wide variety of fields.

Note that the structure described in this embodiment can be used in appropriate combination with any of the structures described in the other embodiments.

EXAMPLE 1

In this example, a light-emitting element which is one embodiment of the present invention will be described with reference to FIG. 12 and FIG. 13. In this example, light-emitting elements A, B, and C and a comparative light-emitting element a were manufactured, and the operating characteristics of these light-emitting elements were compared. Structural formulae of materials used in this example are shown below.

[Chemical Formula 5]

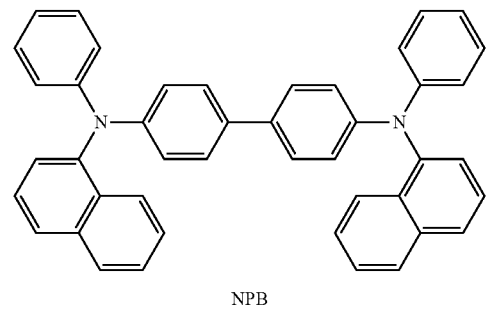

NPB

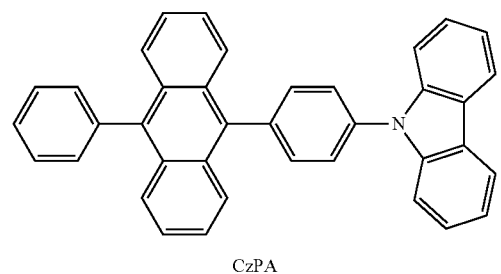

CzPA

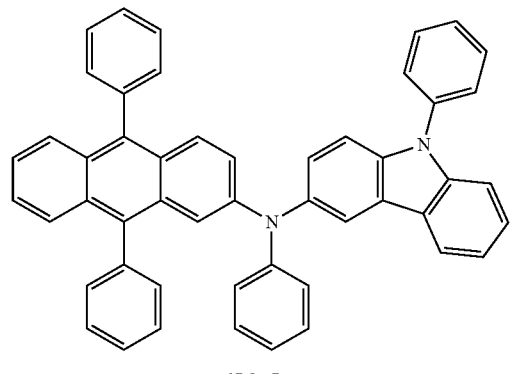

2PCAPA

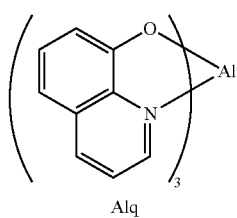

Alq

-continued

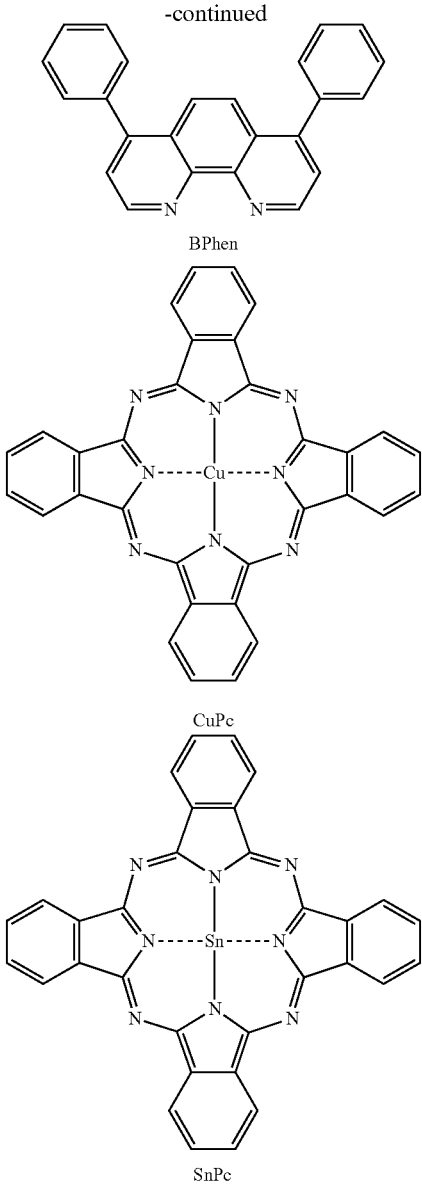

BPhen

CuPc

SnPc

Manufacturing methods of the light-emitting elements A to C of this example and the comparative light-emitting element a will be described below. The differences among the light-emitting elements A to C and the comparative light-emitting element a lie in the structures of second layers and the presence or absence of the second layer. The light-emitting elements A to C and the comparative light-emitting element a have the same structure except for the above differences; therefore, the manufacturing methods of these light-emitting elements will be collectively described below.

First, indium tin oxide containing silicon or silicon oxide was deposited to a thickness of 110 nm over a glass substrate by a sputtering method to form an anode (an electrode area: 2 mm×2 mm).

Next, the glass substrate provided with the anode was fixed to a substrate holder provided in a deposition chamber of a vacuum evaporation apparatus such that the surface on which the anode was formed faced downward. The pressure of the vacuum evaporation apparatus was reduced to approximately $10^{-4}$ Pa, and then 4,4'-bis[N-(1-naphthyl)-N-phenylamino] biphenyl (abbreviation: NPB) which is a hole-transport substance and molybdenum(VI) oxide which is an acceptor substance were co-evaporated to form a layer containing NPB and molybdenum(VI) oxide. The thickness of the layer was 50 nm. The mass ratio of NPB to molybdenum(VI) oxide was adjusted to be 4:1 (=NPB: molybdenum(VI) oxide). Note that the co-evaporation method refers to an evaporation method in which evaporation is carried out from a plurality of evaporation sources at the same time in one treatment chamber. The layer containing NPB and molybdenum(VI) oxide is a layer containing a composite material of an organic compound and an inorganic compound and functions as a charge-generation layer when voltage is applied.

Next, NPB was deposited to a thickness of 10 nm by an evaporation method using resistance heating to form a first hole-transport layer.

Next, 9-[4-(10-phenyl-9-anthryl)phenyl]-9H-carbazole (abbreviation: CzPA) and N-(9,10-diphenyl-2-anthryl)-N,9-diphenyl-9H-carbazol-3-amine (2PCAPA) were co-evaporated to form a first light-emitting layer. The mass ratio of CzPA to 2PCAPA was adjusted to be 1:0.05 (=CzPA: 2PCAPA). CzPA is an electron-transport substance and 2PCAPA is a substance which emits green light. The thickness of the first light-emitting layer was 30 nm.

Next, tris(8-quinolinolato)aluminum (abbreviation: Alq) was deposited to a thickness of 10 nm by an evaporation method using resistance heating to form a first electron-transport substance containing layer.

In the above-described manner, a first EL layer including the charge-generation layer, the first hole-transport layer, the first light-emitting layer, and the first electron-transport substance-containing layer was formed.

Next, bathophenanthroline (abbreviation: BPhen) was deposited to a thickness of 10 nm by an evaporation method using resistance heating. Then, lithium oxide ($Li_2O$) was deposited to a thickness of about 0.1 nm by an evaporation method using resistance heating. BPhen is an electron-transport substance. The layer containing BPhen and the layer containing lithium oxide were stacked to form a third layer.

Next, any of CuPc, SnPc, and CuPc to which lithium was added was deposited, as a phthalocyanine material, to a thickness of about 3 nm by an evaporation method using resistance heating to form a second layer. In the light-emitting element A, CuPc was deposited; in the light-emitting element B, SnPc was deposited; and in the light-emitting element C, CuPc to which lithium (Li) was added was deposited. In the light-emitting element C, the mass ratio of CuPc to Li was adjusted to be 1:0.02 (=CuPc: Li). The second layer was not formed in the comparative light-emitting element a.

Next, 4,4'-bis[N-(1-naphthyl)-N-phenylamino]biphenyl (abbreviation: NPB) which is a hole-transport substance and molybdenum(VI) oxide which is an acceptor substance were co-evaporated to form a first layer. The thickness of the first layer was 60 nm. The mass ratio of NPB to molybdenum(VI) oxide was adjusted to be 4:1 (=NPB:molybdenum(VI) oxide).

Next, NPB was deposited to a thickness of 10 nm by an evaporation method using resistance heating to form a second hole-transport layer.

Next, CzPA and 2PCAPA were co-evaporated to form a second light-emitting layer. The mass ratio of CzPA to 2PCAPA was adjusted to be 1:0.05 (=CzPA: 2PCAPA). CzPA is an electron-transport substance and 2PCAPA is a substance which emits green light. The thickness of the second light-emitting layer was 30 nm.

Next, Alq was deposited to a thickness of 10 nm by an evaporation method using resistance heating to form a second electron-transport substance containing layer.

Next, BPhen was deposited to a thickness of 20 nm by an evaporation method using resistance heating to form a third electron-transport substance containing layer. Then, lithium fluoride (LiF) was deposited to a thickness of about 1 nm by an evaporation method using resistance heating to form an electron-injection layer.

In the above-described manner, a second EL layer including the second hole-transport layer, the second light-emitting layer, the second electron-transport substance containing layer, the third electron-transport substance containing layer, and the electron-injection layer was formed.

Next, aluminum was deposited to a thickness of 200 nm to form a cathode. Thus, the light-emitting elements A to C and the comparative light-emitting element a were manufactured.

Table 1 below shows parts of the structures of the light-emitting elements A to C and the comparative light-emitting element a. The light-emitting elements A to C each correspond to the light-emitting element described in Embodiment 1, 2, or 4. Note that all of the light-emitting elements have the same structures of the anode, the first EL layer, and the second EL layer; therefore, the detailed description of the first EL layer and the second EL layer is omitted.

TABLE 1

|  | Anode | 1st EL layer | 3rd layer | 2nd layer | 1st layer | 2nd EL layer | Cathode |
|---|---|---|---|---|---|---|---|
| Light-emitting element A | NITO (110 nm) | * | BPhen (20 nm)\ Li$_2$O (0.1 nm) | CuPc (3 nm) | NPB:MoO$_x$ (60 nm 4:1) | * | Al (200 nm) |
| Light-emitting element B |  |  |  | SnPc (3 nm) |  |  |  |
| Light-emitting element C |  |  |  | CuPc:Li (3 nm 1:0.02) |  |  |  |
| Comparative light-emitting element a |  |  |  | — |  |  |  |

* Description of materials and thicknesses are omitted.

The light-emitting elements A to C and the comparative light-emitting element a which were obtained through the above-described steps were sealed in a glove box under a nitrogen atmosphere so that these light-emitting elements were prevented from being exposed to the air. Then, the operating characteristics of these light-emitting elements were measured. Note that the measurement was performed at room temperature (in an atmosphere kept at 25° C.). Note that all of the light-emitting elements exhibited green light emission at a wavelength of about 520 nm from 2PCAPA which is the light-emitting substance.

Figure 12:
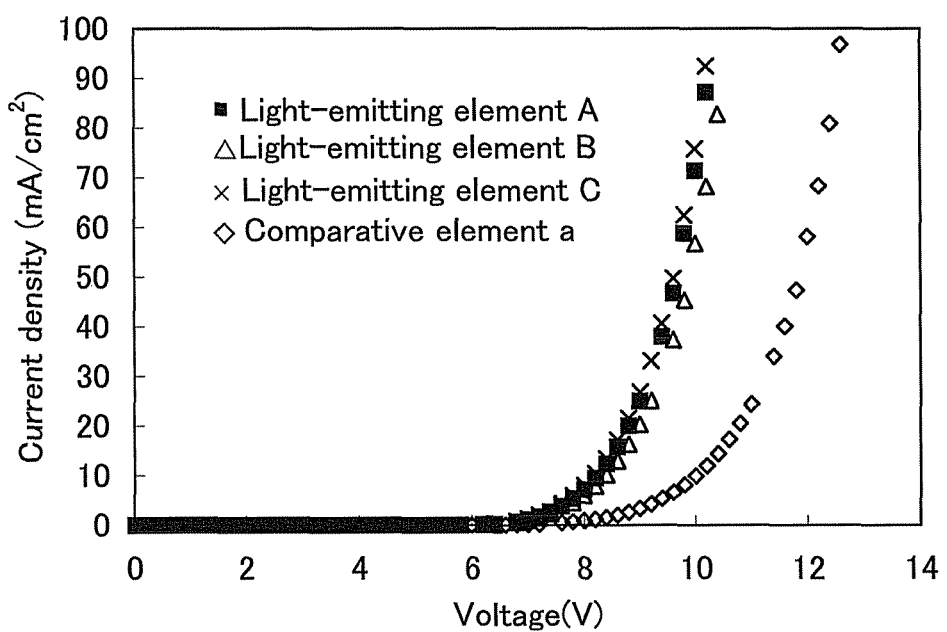
FIG. 12 shows characteristics of light-emitting elements.

FIG. 12 shows the voltage-current density characteristics of the light-emitting elements A to C and the comparative light-emitting element a. FIG. 13 shows the current density-current efficiency characteristics thereof. Table 2 shows the initial values of the main characteristics of these light-emitting elements at around 1000 cd/m$^2$.

TABLE 2

|  | Voltage (V) | Chromaticity (x, y) | Current efficiency (cd/A) | External quantum efficiency (%) |
|---|---|---|---|---|
| Light-emitting element A | 7.7 | (0.27, 0.61) | 24 | 7.2 |
| Light-emitting element B | 7.8 | (0.26, 0.62) | 24 | 7.2 |
| Light-emitting element C | 7.6 | (0.25, 0.62) | 24 | 7.1 |
| Comparative light-emitting element a | 9.2 | (0.25, 0.61) | 25 | 7.3 |

FIG. 12 shows that owing to the second layer, the light-emitting elements A to C can have larger current density than the comparative light-emitting element a when the same voltage is applied to these light-emitting elements. In other words, for a same current density, the driving voltage of each of the light-emitting elements A to C can be lower than that of the comparative light-emitting element a.

Figure 13:
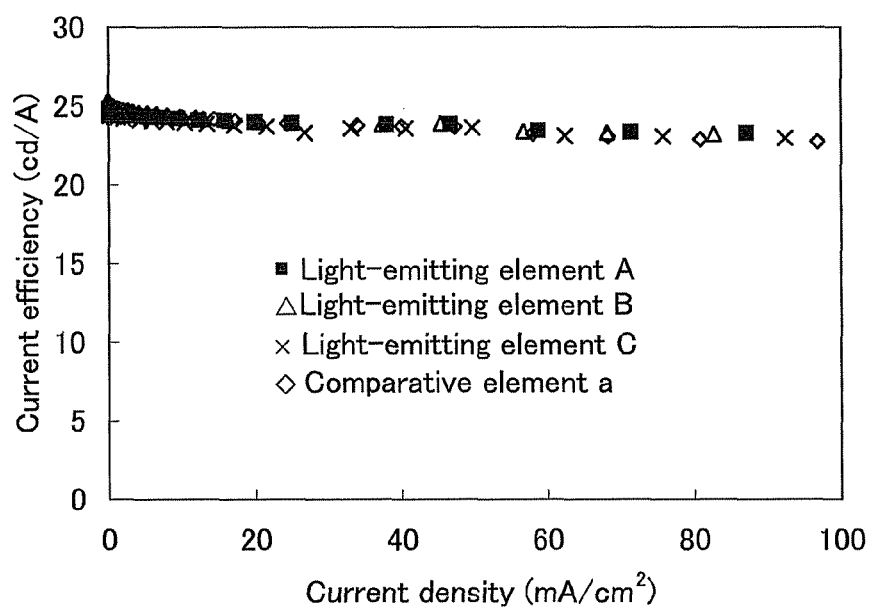
FIG. 13 shows characteristics of the light-emitting elements.

Further, the current density-current efficiency characteristics shown in FIG. 13 show that the light-emitting elements A to C have substantially the same current efficiency as the comparative light-emitting element a at any current density.

According to the results shown in FIG. 12 and FIG. 13, the driving voltage of each of the light-emitting elements A to C can be reduced to be lower than that of the comparative light-emitting element a with the current efficiency maintained substantially the same as that of the comparative light-emitting element a.

As shown in Table 2, the driving voltage at around 1000 cd/m$^2$ of each of the light-emitting elements A to C (i.e., A: 7.7 V, B: 7.8 V, and C, 7.6 V) is lower than that of the comparative light-emitting element a (i.e., 9.2 V). The chromaticity of each of the light-emitting elements A to C is substantially the same as that of the comparative light-emitting element a. The current efficiency of each of the light-emitting elements A to C is substantially the same as that of the comparative light-emitting element a. The external quantum efficiency of each of the light-emitting elements A to C is substantially the same as that of the comparative light-emitting element a.

As described above, the result that the driving voltage of each of the light-emitting elements A to C can be lower than that of the comparative light-emitting element a was obtained. In other words, the second layers provided in the light-emitting elements A to C each have a prominent effect, and the second layers enable the light-emitting elements to be driven at low voltage.

EXAMPLE 2

In this example, a light-emitting element which is one embodiment of the present invention will be described with reference to FIG. 14 and FIG. 15. In this example, a light-emitting element D and a light-emitting element E and a comparative light-emitting element b were manufactured, and the operating characteristics of these light-emitting elements were compared. A formula of a material used in this example is shown below. Note that the structural formulae of the materials used in Embodiment 1 are omitted here.

[Chemical Formula 6]

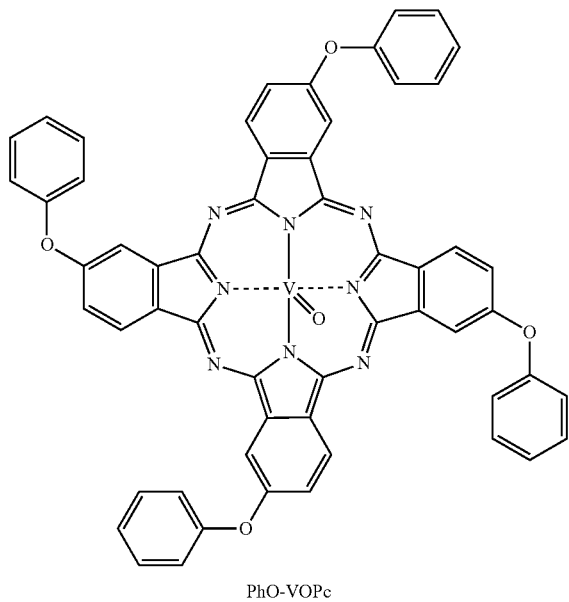

PhO-VOPc

Except for a second layer, the light-emitting elements D and E and the comparative light-emitting element b were manufactured in a manner similar to those of the light-emitting elements which have been described in Example 1. In each of the light-emitting elements D and E, either PhO-VOPc which is a phthalocyanine-based derivative having a phenoxy group or PhO-VOPc to which lithium was added was deposited, as a phthalocyanine material, to a thickness of about 3 nm to form a second layer. In the light-emitting element D, PhO-VOPc was deposited. In the light-emitting element E, PhO-VOPc to which lithium (Li) was added was deposited. In the light-emitting element E, the weight ratio of PhO-VOPc to Li was adjusted to be 1:0.02 (=PhO-VOPc: Li). The second layer was not formed in the comparative light-emitting element b. Thus, the light-emitting elements D and E and the comparative light-emitting element b were obtained.

Table 3 below shows parts of the structures of the light-emitting elements D and E and the comparative light-emitting element b. The light-emitting elements D and E each correspond to the light-emitting element described in Embodiment 1, 2, or 4. Note that all of the light-emitting elements have the same structures of the anode, the first EL layer, and the second EL layer; therefore, the detailed description of the first EL layer and the second EL layer is omitted.

TABLE 3

| | Anode | 1st EL layer | 3rd layer | 2nd layer | 1st layer | 2nd EL layer | Cathode |
|---|---|---|---|---|---|---|---|
| Light-emitting element D | NITO (110 nm) | * | BPhen (20 nm)\ Li$_2$O (0.1 nm) | PhO-VOPc (3 nm) | NPB:MoO$_x$ (60 nm 4:1) | * | Al (200 nm) |
| Light-emitting element E | | | | PhO-VOPc:Li (3 nm 1:0.02) | | | |
| Comparative light-emitting element b | | | | — | | | |

The light-emitting elements D and E and the comparative light-emitting element b which were obtained through the above-described steps were sealed in a glove box under a nitrogen atmosphere so that these light-emitting elements were prevented from being exposed to the air. Then, the operating characteristics of these light-emitting elements were measured. Note that the measurement was performed at room temperature (in an atmosphere kept at 25° C.). Note that all of the light-emitting elements exhibited green light emission at a wavelength of about 520 nm from 2PCAPA which is the light-emitting substance.

Figure 14:
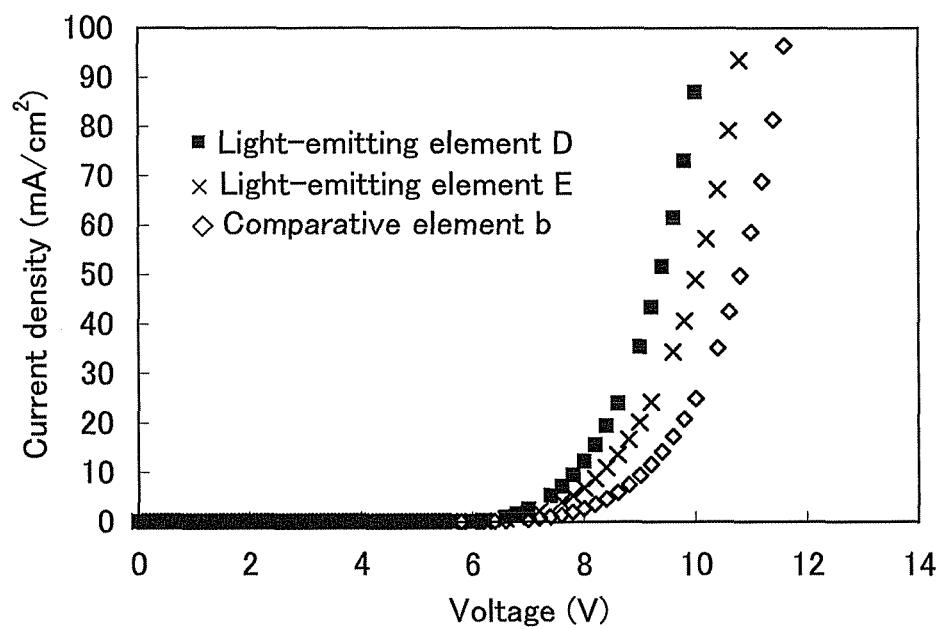
FIG. 14 shows characteristics of light-emitting elements.

FIG. 14 shows the voltage-current density characteristics of the light-emitting elements D and E and the comparative light-emitting element b. FIG. 15 shows the current density-current efficiency characteristics thereof. Table 4 shows the initial values of the main characteristics of these light-emitting elements at around 1000 cd/m$^2$.

TABLE 4

| | Voltage (V) | Chromaticity (x, y) | Current efficiency (cd/A) | External quantum efficiency (%) |
|---|---|---|---|---|
| Light-emitting element D | 7.3 | (0.26, 0.64) | 31 | 8.9 |
| Light-emitting element E | 7.5 | (0.29, 0.62) | 31 | 8.9 |
| Comparative light-emitting element b | 8.1 | (0.26, 0.63) | 32 | 9.1 |

FIG. 14 shows that owing to the second layer, the light-emitting elements D and E can have larger current density than the comparative light-emitting element b when the same voltage is applied to these light-emitting elements. In other words, for a same current density, the driving voltage of each of the light-emitting elements D and E can be lower than that of the comparative light-emitting element b.

Figure 15:
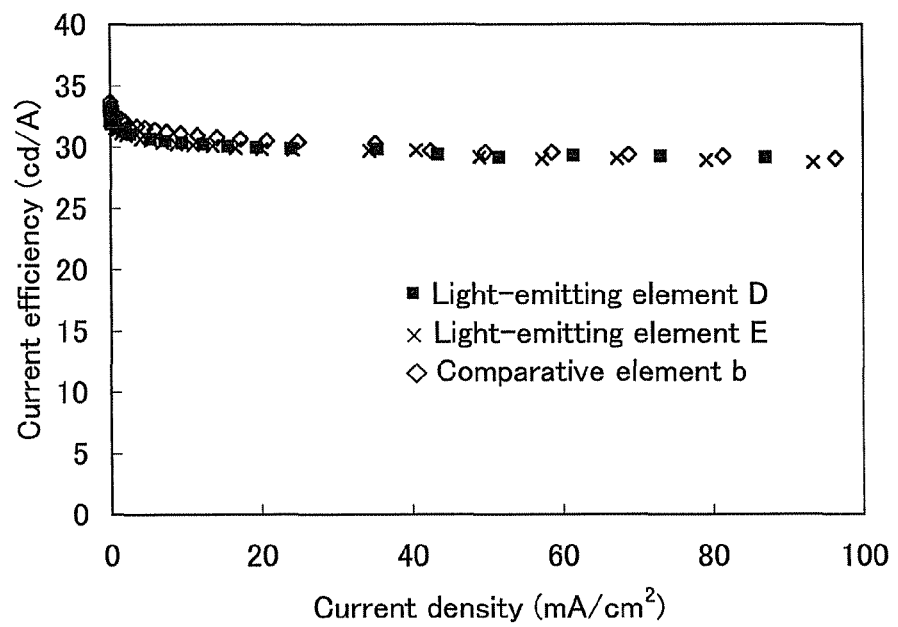
FIG. 15 shows characteristics of the light-emitting elements.

Further, the current density-current efficiency characteristics shown in FIG. 15 show that the light-emitting elements D and E have substantially the same current efficiency as the comparative light-emitting element b at any current density.

According to the results shown in FIG. 14 and FIG. 15, the driving voltage of each of the light-emitting elements D and E can be reduced to be lower than that of the comparative light-emitting element b with the current efficiency maintained substantially the same as that of the comparative light-emitting element a.

As shown in Table 4, the driving voltage at around 1000 cd/m² of each of the light-emitting elements D and E (i.e., D: 7.3 V and E: 7.5 V) is lower than that of the comparative light-emitting element b (i.e., 8.1 V). The chromaticity of each of the light-emitting elements D and E is substantially the same as that of the comparative light-emitting element b. The current efficiency of each of the light-emitting elements D and E is substantially the same as that of the comparative light-emitting element b. The external quantum efficiency of each of the light-emitting elements D and E is substantially the same as that of the comparative light-emitting element b.

As described above, the result that the driving voltage of each of the light-emitting elements D and E can be lower than that of the comparative light-emitting element b was obtained. In other words, the second layers provided in the light-emitting elements D and E each have a prominent effect, and the second layers enable the light-emitting elements to be driven at low voltage.

PhO-VOPc which is a phthalocyanine derivative having a phenoxy group and which was used as the phthalocyanine material in this example is soluble in a solvent; thus, PhO-VOPc is easily handled at the time of forming a light-emitting element and maintenance of an apparatus used for film formation can be facilitated.

EXAMPLE 3

In this example, a light-emitting element which is one embodiment of the present invention will be described with reference to FIG. 16 and FIG. 17. In this example, a light-emitting element F, a light-emitting element G, and a comparative light-emitting element c were manufactured, and the operating characteristics of these light-emitting elements were compared. A formula of a material used in this example is shown below. Note that the structural formulae of the materials used in Example 1 are omitted here.

[Chemical Formula 7]

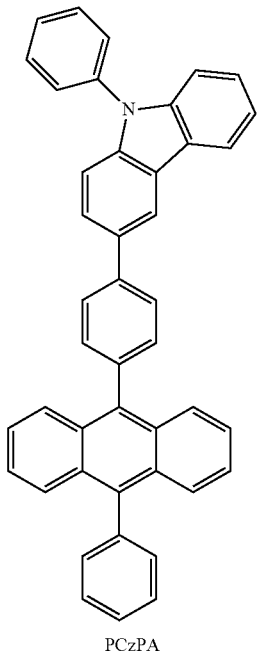

PCzPA

Manufacturing methods of the light-emitting elements F and G and the comparative light-emitting element c will be described below. The differences between the light-emitting element F and the light-emitting element G lie in the structures of a first EL layer, a first layer, and a second EL layer. The difference between the light-emitting element F and the comparative light-emitting element c lies in the presence or absence of a second layer. The light-emitting elements D and E and the comparative light-emitting element b have the same structure except for the above differences; therefore, the manufacturing methods of these light-emitting elements will be collectively described below.

First, indium tin oxide containing silicon or silicon oxide was deposited to a thickness of 110 nm over a glass substrate by a sputtering method to form an anode (an electrode area: 2 mm×2 mm).

Next, the glass substrate provided with the anode was fixed to a substrate holder provided in a deposition chamber of a vacuum evaporation apparatus such that the surface on which the anode was formed faced downward. The pressure of the vacuum evaporation apparatus was reduced to approximately $10^{-4}$ Pa, and then 9-phenyl-3-[4-(10-phenyl-9-anthryl)phenyl]-9H-carbazole (abbreviation: PCzPA) or NPB which is a hole-transport substance and molybdenum(VI) oxide which is an acceptor substance were co-evaporated to form a layer containing PCzPA or NPB and molybdenum(VI) oxide. The thickness of the layer was 50 nm. The mass ratio of PCzPA or NPB to molybdenum(VI) oxide was adjusted to be 4:1 (=PCzPA or NPB: molybdenum(VI) oxide). In the light-emitting element F and the comparative light-emitting element c, a layer containing PCzPA and molybdenum(VI) oxide was formed. In the light-emitting element G, a layer containing NPB and molybdenum(VI) oxide was formed. Note that the co-evaporation method refers to an evaporation method in which evaporation is carried out from a plurality of evaporation sources at the same time in one treatment chamber. The layer containing PCzPA or NPB and molybdenum (VI) oxide is a layer containing a composite material of an organic compound and an inorganic compound and functions as a charge-generation layer when voltage is applied.

Next, PCzPA or NPB was deposited to a thickness of 10 nm by an evaporation method using resistance heating to form a first hole-transport layer. In the light-emitting element F and the comparative light-emitting element c, PCzPA was deposited. In the light-emitting element G, NPB was deposited.

Next, CzPA and 2PCAPA were co-evaporated to form a first light-emitting layer. The mass ratio of CzPA to 2PCAPA was adjusted to be 1:0.05 (=CzPA: 2PCAPA). CzPA is an electron-transport substance and 2PCAPA is a substance which emits green light. The thickness of the first light-emitting layer was 30 nm.

Next, Alq was deposited to a thickness of 10 nm by an evaporation method using resistance heating to form a first electron-transport substance containing layer.

In the above-described manner, the first EL layer including the charge-generation layer, the first hole-transport layer, the first light-emitting layer, and the first electron-transport substance containing layer was formed.

Next, BPhen was deposited to a thickness of 10 nm by an evaporation method using resistance heating. Then, lithium oxide (Li$_2$O) was deposited to a thickness of about 0.1 nm by an evaporation method using resistance heating. BPhen is an electron-transport substance. The layer containing BPhen and the layer containing lithium oxide were stacked to form a third layer.

Next, as a phthalocyanine material, CuPc was deposited to a thickness of about 2 nm by an evaporation method using resistance heating to form a second layer in the light-emitting element F and the light-emitting element G. The second layer was not formed in the comparative light-emitting element c.

Next, PCzPA or NPB which is a hole-transport substance and molybdenum(VI) oxide which is an acceptor substance were co-evaporated to form the first layer. The thickness of the first layer was 60 nm. The mass ratio of PCzPA or NPB to molybdenum(VI) oxide was adjusted to be 4:1 (=PCzPA or NPB:molybdenum(VI) oxide). A layer containing PCzPA and molybdenum(VI) oxide was formed in the light-emitting element F and the comparative light-emitting element c. A layer containing NPB and molybdenum(VI) oxide was formed in the light-emitting element G.

Next, PCzPA or NPB was deposited to a thickness of 10 nm by an evaporation method using resistance heating to form a second hole-transport layer. In the light-emitting element F and the comparative light-emitting element c, PCzPA was deposited. In the light-emitting element O, NPB was deposited.

Next, CzPA and 2PCAPA were co-evaporated to form a second light-emitting layer. The mass ratio of CzPA to 2PCAPA was adjusted to be 1:0.05 (=CzPA: 2PCAPA). CzPA is an electron-transport substance and 2PCAPA is a substance which emits green light. The thickness of the second light-emitting layer was 30 nm.

Next, Alq was deposited to a thickness of 10 nm by an evaporation method using resistance heating to form a second electron-transport substance containing layer.

Next, BPhen was deposited to a thickness of 20 nm by an evaporation method using resistance heating to form a third electron-transport substance containing layer. Then, lithium fluoride (LiF) was deposited to a thickness of about 1 nm by an evaporation method using resistance heating to form an electron-injection layer.

In the above-described manner, the second EL layer including the second hole-transport layer, the second light-emitting layer, the second electron-transport substance containing layer, the third electron-transport substance containing layer, and the electron-injection layer was formed.

Then, aluminum was deposited to a thickness of 200 nm to form a cathode. Thus, the light-emitting elements F and G and the comparative light-emitting element c were manufactured.

Table 5 below shows the structures of the light-emitting elements F and G and the comparative light-emitting element c. The light-emitting elements F and G each correspond to the light-emitting element described in Embodiment 1, 2, or 4.

The light-emitting elements F and G and the comparative light-emitting element c which were obtained through the above-described steps were sealed in a glove box under a nitrogen atmosphere so that these light-emitting elements were prevented from being exposed to the air. Then, the operating characteristics of these light-emitting elements were measured. Note that the measurement was performed at room temperature (in an atmosphere kept at 25° C.). Note that all of the light-emitting elements exhibited green light emission at a wavelength of about 520 nm from 2PCAPA which is the light-emitting substance.

Figure 16:
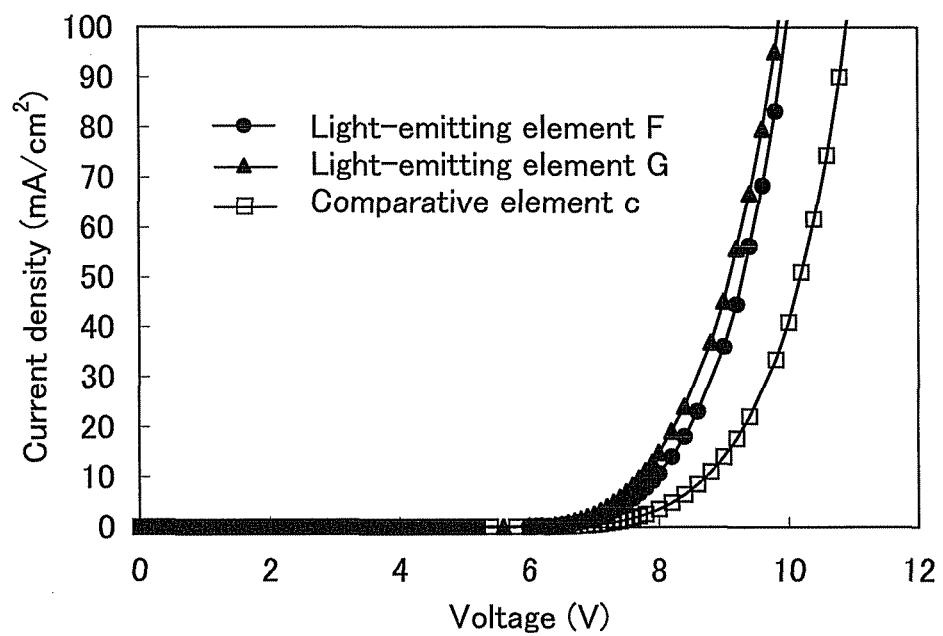
FIG. 16 shows characteristics of light-emitting elements.

FIG. 16 shows the voltage-current density characteristics of the light-emitting elements F and G and the comparative light-emitting element c. FIG. 17 shows the current density-current efficiency characteristics thereof. Table 6 shows the initial values of the main characteristics of the light-emitting elements at around 1000 cd/m$^2$.

TABLE 6

|  | Voltage (V) | Chromaticity (x, y) | Current efficiency (cd/A) | External quantum efficiency (%) |
| --- | --- | --- | --- | --- |
| Light-emitting element F | 7.3 | (0.23, 0.65) | 28 | 8.2 |
| Light-emitting element G | 7.2 | (0.23, 0.64) | 26 | 7.8 |
| Comparative light-emitting element c | 8 | (0.23, 0.65) | 27 | 8.1 |

FIG. 16 shows that owing to the second layer, the light-emitting elements F and G can have larger current density than the comparative light-emitting element c when the same voltage is applied to these light-emitting elements. In other words, for a same current density, the driving voltage of each of the light-emitting elements F and G can be lower than that of the comparative light-emitting element c.

Figure 17:
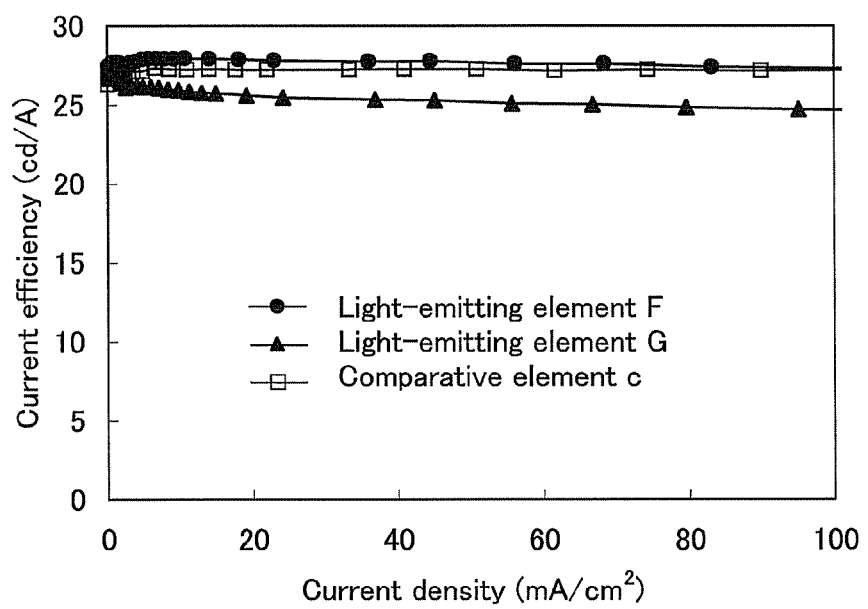
FIG. 17 shows characteristics of the light-emitting elements.

Further, the current density-current efficiency characteristics shown in FIG. 17 show that the light-emitting elements F and G have substantially the same current efficiency as the comparative light-emitting element c at any current density.

According to the results shown in FIG. 16 and FIG. 17, the driving voltage of each of the light-emitting elements F and G can be reduced to be lower than that of the comparative light-emitting element c with the current efficiency maintained substantially the same as that of the comparative light-emitting element b.

TABLE 5

|  | Anode | 1st EL layer | 3rd layer | 2nd layer | 1st layer | 2nd EL layer | Cathode |
| --- | --- | --- | --- | --- | --- | --- | --- |
| Light-emitting element F | NITO (110 nm) | PCzPA:MoOx (50 nm 4:1)\ CzPA (10 nm)\ EML1\ Alq (10 nm) | BPhen (10 nm)\ Li$_2$O (0.1 nm) | CuPc (2 nm) | PCzPA:MoOx (60 nm 4:1) | PCzPA (10 nm)\ EML2\ Alq (10 nm)\ Phen (20 nm)\ LiF (1 nm) | Al (200 nm) |
| Light-emitting element G |  | NPB:MoOx (50 nm 4:1)\ NPB (10 nm)\ EML1\ Alq (10 nm) |  | CuPc (2 nm) | NPB:MoOx (60 nm 4:1) | NPB (10 nm)\ EML2\ Alq (10 nm)\ Phen (20 nm)\ LiF (1 nm) |  |
| Light-emitting element c |  | PCzPA:MoOx (50 nm 4:1)\ CzPA (10 nm)\ EML1\ Alq (10 nm) |  | — | PCzPA:MoOx (60 nm 4:1) | PCzPA (10 nm)\ EML2\ Alq (10 nm)\ Phen (20 nm)\ LiF (1 nm) |  |

*EML 1, 2 = CzPA:2PCAPA (30 nm, 1:0.05)

As shown in Table 6, the driving voltage at around 1000 cd/m² of each of the light-emitting elements F and G (i.e., F: 7.3 V and G: 7.2 V) is lower than that of the comparative light-emitting element c (i.e., 8.0 V). The chromaticity of each of the light-emitting elements F and G is substantially the same as that of the comparative light-emitting element c. The current efficiency of the light-emitting elements F and G is substantially the same as that of the comparative light-emitting element c. The external quantum efficiency of each of the light-emitting elements F and G is substantially the same as that of the comparative light-emitting element c.

As described above, the result that the driving voltage of each of the light-emitting elements F and G can be lower than that of the comparative light-emitting element c was obtained. In other words, the second layers provided in the light-emitting elements F and G each have a prominent effect, and the second layers enable the light-emitting elements to be driven at low voltage.

Further, as shown in FIG. 17 and Table 6, the light-emitting element F in which the layer containing PCzPA and molybdenum(VI) oxide was used as the charge-generation layer and the first layer has higher current efficiency than the light-emitting element G in which the layer containing NPB and molybdenum(VI) oxide was used as the charge-generation layer and the first layer. The reason for the above is considered as follows: the layer containing PCzPA and molybdenum(VI) oxide hardly has absorption of light based on charge transfer interaction, in comparison with the layer containing NPB and molybdenum(VI) oxide, and thus has a smaller loss of light at the time of light extraction.

Example 4

In this example, a light-emitting element which is one embodiment of the present invention will be described with reference to FIG. 18 and FIG. 19. In this example, a light-emitting element H, a light-emitting element I, and a comparative light-emitting element d were manufactured, and the operating characteristics of these light-emitting elements were compared.

Except for a third layer, the light-emitting elements H and I and the comparative light-emitting element d were manufactured in a manner similar to those of the light-emitting elements F and G and the comparative light-emitting element c, respectively, which have been described in Example 3. In the light-emitting elements H and I and the comparative light-emitting element d, BPhen to which lithium (Li) was added was deposited to a thickness of 10 nm by an evaporation method using resistance heating to form the third layer. The mass ratio of BPhen to Li was adjusted to be 1:0.02 (=BPhen: Li). Thus, the light-emitting elements H and I and the comparative light-emitting element d were obtained.

Table 7 below shows the structures of the light-emitting elements H and I and the comparative light-emitting element d. The light-emitting elements H and I each correspond to the light-emitting element described in Embodiment 1, 3 or 4.

TABLE 7

| | Anode | 1st EL layer | 3rd layer | 2nd layer | 1st layer | 2nd EL layer | Cathode |
|---|---|---|---|---|---|---|---|
| Light-emitting element H | NITO (110 nm) | PCzPA:MoOx (50 nm 4:1)\ PCzPA (10 nm)\ EML1\ Alq (10 nm) | BPhen:Li (10 nm 1:0.02) | CuPc (2 nm) | PCzPA:MoOx (60 nm 4:1) | PCzPA (10 nm)\ EML2\ Alq (10 nm)\ BPhen (20 nm)\ LiF (1 nm) | Al (200 nm) |
| Light-emitting element I | | NPB:MoOx (50 nm 4:1)\ NPB (10 nm)\ EML1\ Alq (10 nm) | | CuPc (2 nm) | NPB:MoOx (60 nm 4:1) | NPB (10 nm)\ EML2\ Alq (10 nm)\ BPhen (20 nm) LiF (1 nm) | |
| Comparative light-emitting element d | | PCzPA:MoOx (50 nm 4:1)\ PCzPA (10 nm)\ EML1\ Alq (10 nm) | | — | PCzPA:MoOx (60 nm 4:1) | PCzPA (10 nm)\ EML2\ Alq (10 nm)\ BPhen (20 nm)\ LiF (1 nm) | |

*EML 1, 2 = CzPA:2PCAPA (30 nm, 1:0.05)

The operating characteristics of the obtained light-emitting elements H and I and the obtained comparative light-emitting element d were measured. Note that the measurement was performed at room temperature (in an atmosphere kept at 25° C.). Note that all of the light-emitting elements exhibited green light emission at a wavelength of about 520 nm from 2PCAPA which is a light-emitting substance.

Figure 18:
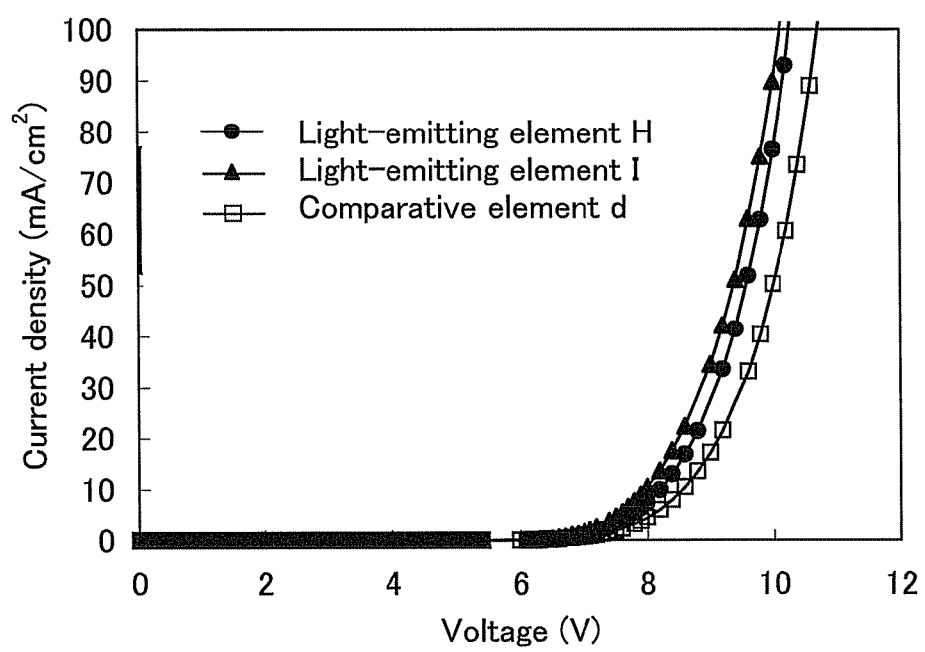
FIG. 18 shows characteristics of light-emitting elements.

FIG. 18 shows the voltage-current density characteristics of the light-emitting elements H and I and the comparative light-emitting element d. FIG. 19 shows the current density-current efficiency characteristics thereof. Table 8 shows the initial values of the main characteristics of these light-emitting elements at around 1000 cd/m².

TABLE 8

| | Voltage (V) | Chromaticity (x, y) | Current efficiency (cd/A) | External quantum efficiency (%) |
|---|---|---|---|---|
| Light-emitting element H | 7.6 | (0.24, 0.64) | 28 | 8.4 |
| Light-emitting element I | 7.4 | (0.24, 0.64) | 26 | 7.7 |
| Comparative light-emitting element d | 7.9 | (0.24, 0.64) | 28 | 8.4 |

FIG. 18 shows that owing to the second layer, the light-emitting elements H and I can have larger current density than the comparative light-emitting element d when the same voltage is applied to these light-emitting elements. In other words, for a same current density, the driving voltage of each of the light-emitting elements H and I can be lower than that of the comparative light-emitting element d.

Figure 19:
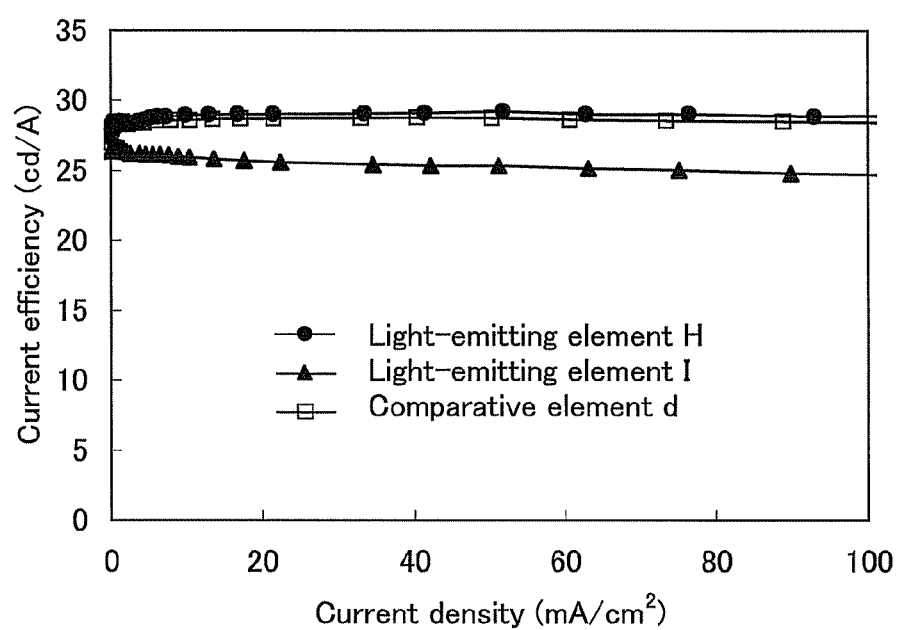
FIG. 19 shows characteristics of the light-emitting elements.

Further, the current density-current efficiency characteristics shown in FIG. 19 show that the light-emitting elements H and I have substantially the same current efficiency as the comparative light-emitting element d at any current density.

According to the results shown in FIG. 18 and FIG. 19, the driving voltage of each of the light-emitting elements H and I can be reduced to be lower than that of the comparative light-emitting element d with the current efficiency maintained substantially the same as that of the comparative light-emitting element d.

As shown in Table 8, the driving voltage at around 1000 cd/m$^2$ of each of the light-emitting elements H and I (i.e., H, 7.6 V and I: 7.4 V) is lower than that of the comparative light-emitting element d (i.e., 7.9 V). The chromaticity of each of the light-emitting elements H and I is substantially the same as that of the comparative light-emitting element d. The current efficiency of each of the light-emitting elements H and I is substantially the same as that of the comparative light-emitting element d. The external quantum efficiency of each of the light-emitting elements H and I is substantially the same as that of the comparative light-emitting element d.

As described above, the result that the driving voltage of each of the light-emitting elements H and I can be lower than that of the comparative light-emitting element d was obtained. In other words, the second layers provided in the light-emitting elements H and I each have a prominent effect, and the second layers enable the light-emitting elements to be driven at low voltage.

Further, as shown in FIG. 19 and Table 8, the light-emitting element H in which the layer containing PCzPA and molybdenum(VI) oxide was used as the charge-generation layer and the first layer has higher current efficiency than the light-emitting element I in which the layer containing NPB and molybdenum(VI) oxide was used as the charge-generation layer and the first layer. The reason for the above is considered as follows: the layer containing PCzPA and molybdenum(VI) oxide hardly has absorption of light based on charge transfer interaction, in comparison with the layer containing NPB and molybdenum(VI) oxide, and thus has a smaller loss of light at the time of light extraction.

EXAMPLE 5

In this example, a light-emitting element which is one embodiment of the present invention will be described with reference to FIG. 20 and FIG. 21. In this example, a light-emitting element J, a light-emitting element K, and a comparative light-emitting element e were manufactured, and the operating characteristics of these light-emitting elements were compared.

Except for a third layer, the light-emitting elements J and K and the comparative light-emitting element e were manufactured in a manner similar to those of the light-emitting elements F and G and the comparative light-emitting element c, respectively, which have been described in Example 3. In the light-emitting elements J and K and the comparative light-emitting element e, BPhen to which calcium (Ca) was added was deposited to a thickness of 10 nm by an evaporation method using resistance heating to form the third layer. The mass ratio of BPhen to Ca was adjusted to be 1:0.08 (=BPhen: Ca). Thus, the light-emitting elements J and K and the comparative light-emitting element e were obtained.

Table 9 below shows the structures of the light-emitting elements J and K and the comparative light-emitting element e. The light-emitting elements J and K each correspond to the light-emitting element described in Embodiment 1, 3 or 4.

TABLE 9

| | Anode | 1st EL layer | 3rd layer | 2nd layer | 1st layer | 2nd EL layer | Cathode |
|---|---|---|---|---|---|---|---|
| Light-emitting element J | NITO (110 nm) | PCzPA:MoOx (50 nm 4:1)\ PCzPA (10 nm)\ EML1\ Alq (10 nm) | BPhen:Ca (10 nm 1:0.08) | CuPc (2 nm) | PCzPA:MoOx (60 nm 4:1) | PCzPA (10 nm)\ EML2\ Alq (10 nm)\ BPhen (20 nm)\ LiF (1 nm) | Al (200 nm) |
| Light-emitting element K | | NPB:MoOx (50 nm 4:1)\ NPB (10 nm)\ EML1\ Alq (10 nm) | | CuPc (2 nm) | NPB:MoOx (60 nm 4:1) | NPB (10 nm)\ EML2\ Alq (10 nm)\ BPhen (20 nm)\ LiF (1 nm) | |
| Comparative light-emitting element e | | PCzPA:MoOx (50 nm 4:1)\ PCzPA (10 nm)\ EML1\ Alq (10 nm) | — | | PCzPA:MoOx (60 nm 4:1) | PCzPA (10 nm)\ EML2\ Alq (10 nm)\ BPhen (20 nm)\ LiF (1 nm) | |

*EML 1, 2 = CzPA:2PCAPA (30 nm, 1:0.05)

The operating characteristics of the obtained light-emitting elements J and K and the obtained comparative light-emitting element e were measured. Note that the measurement was performed at room temperature (in an atmosphere kept at 25° C.). Note that all of the light-emitting elements exhibited green light emission at a wavelength of about 520 nm from 2PCAPA which is a light-emitting substance.

Figure 20:
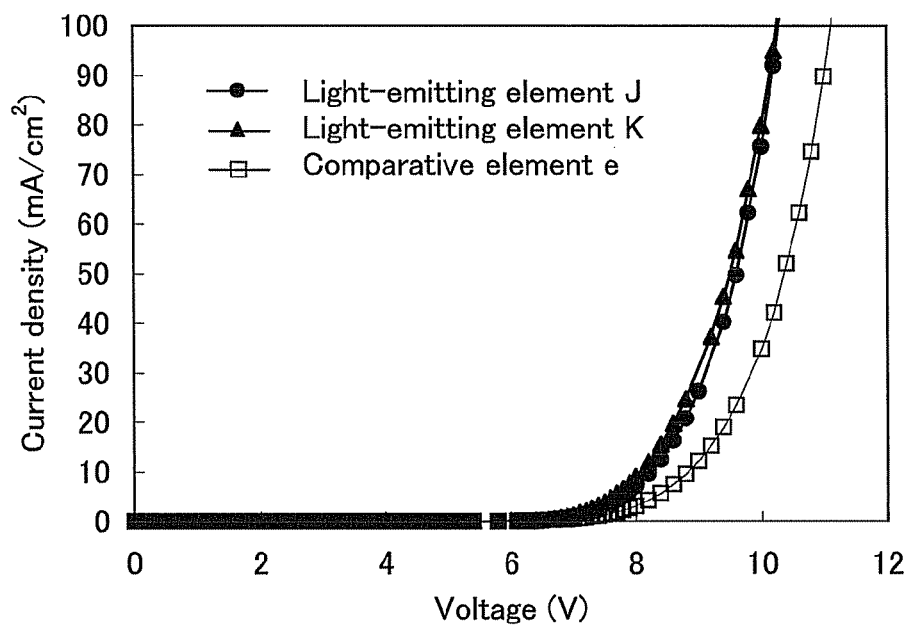
FIG. 20 shows characteristics of light-emitting elements.

FIG. 20 shows the voltage-current density characteristics of the light-emitting elements J and K and the comparative light-emitting element e. FIG. 21 shows the current density-current efficiency characteristics thereof. Table 10 shows the initial values of the main characteristics of these light-emitting elements at around 1000 cd/m$^2$.

TABLE 10

| | Voltage (V) | Chromaticity (x, y) | Current efficiency (cd/A) | External quantum efficiency (%) |
|---|---|---|---|---|
| Light-emitting element J | 7.6 | (0.23, 0.65) | 26 | 7.8 |
| Light-emitting element K | 7.5 | (0.23, 0.64) | 25 | 7.4 |
| Comparative light-emitting element e | 8.2 | (0.23, 0.65) | 27 | 7.9 |

FIG. 20 shows that owing to the second layer, the light-emitting elements J and K can have larger current density than the comparative light-emitting element e when the same voltage is applied to these light-emitting elements. In other words, for a same current density, the driving voltage of each of the light-emitting elements J and K can be lower than that of the comparative light-emitting element e.

Figure 21:
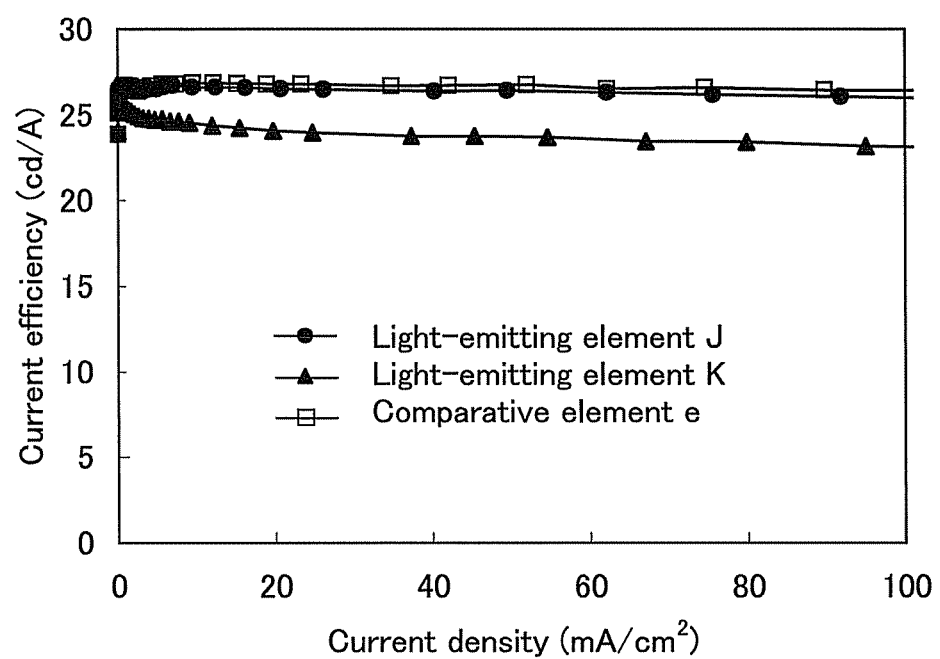
FIG. 21 shows characteristics of the light-emitting elements.

Further, the current density-current efficiency characteristics shown in FIG. 21 show that the light-emitting elements J and K have substantially the same current efficiency as the comparative light-emitting element e at any current density.

According to the results shown in FIG. 20 and FIG. 21, the driving voltage of each of the light-emitting elements J and K can be reduced to be lower than that of the comparative light-emitting element e with the current efficiency maintained substantially the same as that of the comparative light-emitting element e.

As shown in Table 10, the driving voltage at around 1000 $cd/m^2$ of each of the light-emitting elements J and K (i.e., J: 7.6 V and K: 7.5 V) is lower than that of the comparative light-emitting element e (i.e., 8.2 V). The chromaticity of each of the light-emitting elements J and K is substantially the same as that of the comparative light-emitting element e. The current efficiency of each of the light-emitting elements J and K is substantially the same as that of the comparative light-emitting element e. The external quantum efficiency of each of the light-emitting elements J and K is substantially the same as that of the comparative light-emitting element e.

As described above, the result that the driving voltage of each of the light-emitting elements J and K can be lower than that of the comparative light-emitting element e was obtained. In other words, the second layers provided in the light-emitting elements J and K each have a prominent effect, and the second layers enable the light-emitting elements to be driven at low voltage.

Further, as shown in FIG. 21 and Table 10, the light-emitting element J in which the layer containing PCzPA and molybdenum(VI) oxide was used as the charge-generation layer and the first layer has higher current efficiency than the light-emitting element K in which the layer containing NPB and molybdenum(VI) oxide was used as the charge-generation layer and the first layer. The reason for the above is considered as follows: the layer containing PCzPA and molybdenum(VI) oxide hardly has absorption of light based on charge transfer interaction, in comparison with the layer containing NPB and molybdenum(VI) oxide, and thus has a smaller loss of light at the time of light extraction.

This application is based on Japanese Patent Application serial no. 2010-082706 filed with the Japan Patent Office on Mar. 31, 2010, the entire contents of which are hereby incorporated by reference.

What is claimed is:

1. A light-emitting element comprising:
   n EL layers between an anode and a cathode, n being a natural number greater than or equal to 2; and
   a first layer, a second layer, and a third layer between an m-th EL layer from the anode and an (m+1)th EL layer, m being a natural number greater than or equal to 1 and lesser than or equal to (n−1),
   wherein the first layer is provided between the (m+1)th EL layer and the second layer, is in contact with the (m+1)th EL layer and the second layer, contains an organic compound and an oxide of a transition metal or an oxide of a metal belonging to any one of Groups 4 to 8 of the periodic table,
   wherein the second layer is provided between the first layer and the third layer, is in contact with the first layer and the third layer, is formed of a phthalocyanine-based material, and contains an alkali metal, an alkaline earth metal, a rare earth metal, an alkali metal compound, an alkaline earth metal compound, or a rare earth metal compound,
   wherein the third layer is provided between the second layer and the m-th EL layer, is in contact with the second layer and the m-th EL layer contains an alkali metal, an alkaline earth metal, a rare earth metal, an alkali metal compound, an alkaline earth metal compound, or a rare earth metal compound, and
   wherein the phthalocyanine-based material is any of the materials shown by the following structural formulae

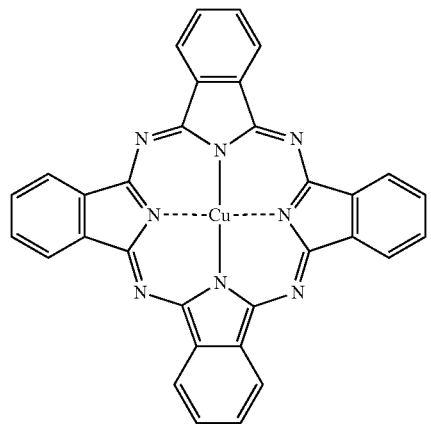

CuPc

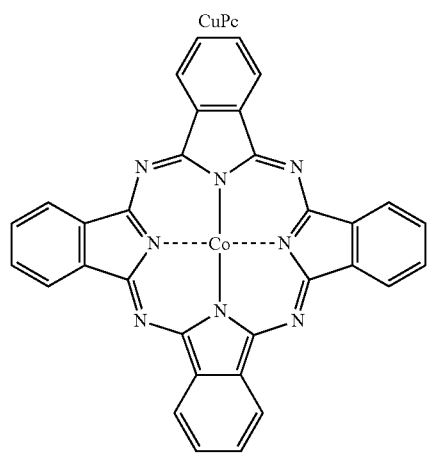

CoPc

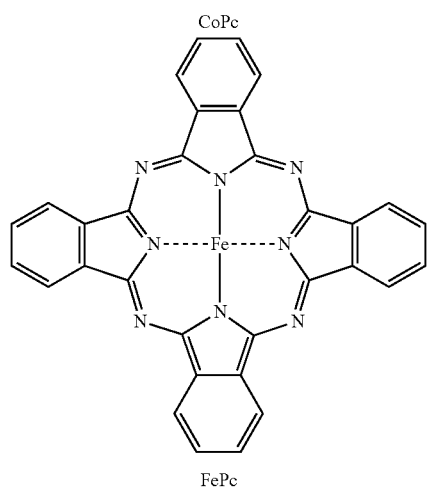

FePc

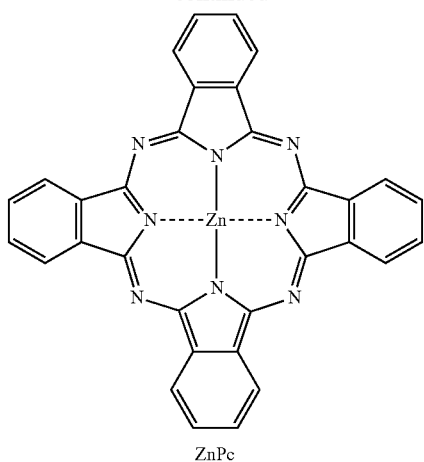

ZnPc

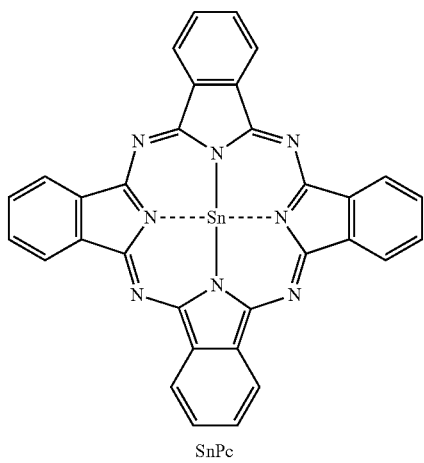

SnPc

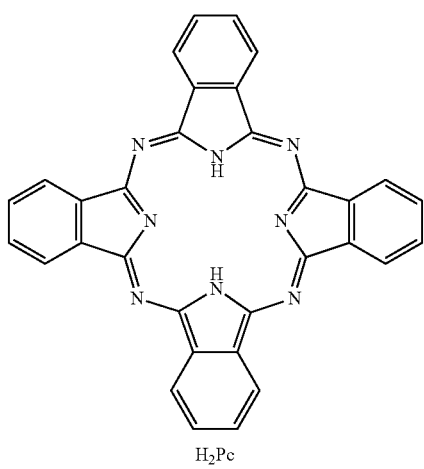

H₂Pc

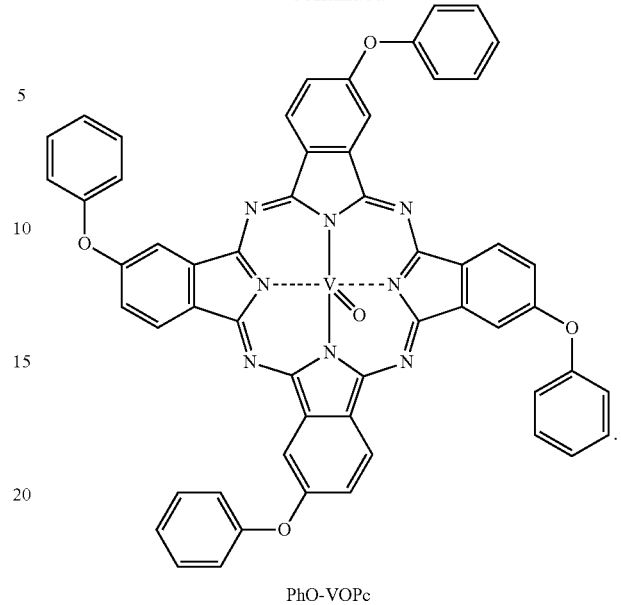

PhO-VOPc

2. A light-emitting device comprising the light-emitting element according to claim 1.

3. An electronic device comprising the light-emitting device according to claim 2.

4. A lighting device comprising the light-emitting device according to claim 2.

5. The light-emitting element according to claim 1, wherein a LUMO level of the second layer is greater than or equal to —5.0 eV less than or equal to —3.0 eV.

6. The light-emitting element according to claim 1, wherein the organic compound does not contain an amine skeleton.

7. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m +1)th EL layer and the second layer, is in contact with the (m+1)th EL layer and the second layer, and contains an organic compound and an acceptor substance,
wherein the second layer is provided between the first layer and the third layer, is in contact with the first layer and the third layer, and is formed of a phthalocyanine-based material,
wherein the second layer further comprises an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer and contains an alkali metal, an alkaline earth metal, a rare earth metal, an alkali metal compound, an alkaline earth metal compound, or a rare earth metal compound, and
wherein the phthalocyanine-based material is any of the materials shown by the following structural formulae

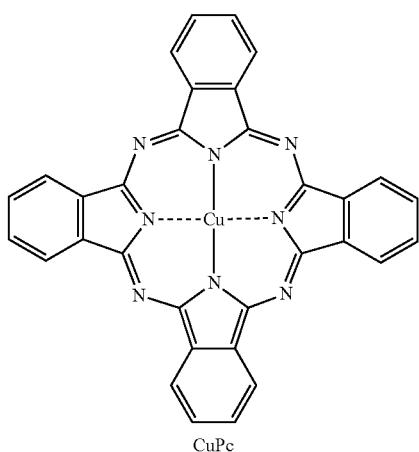

CuPc

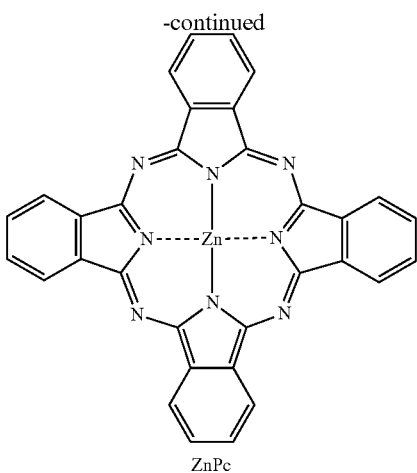

ZnPc

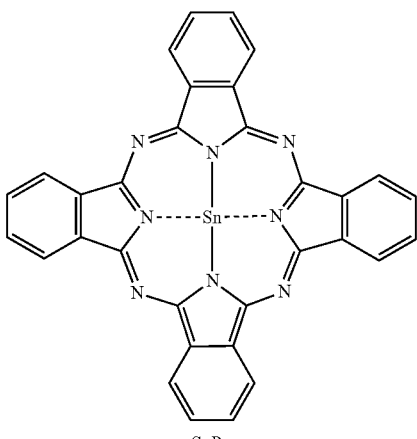

SnPc

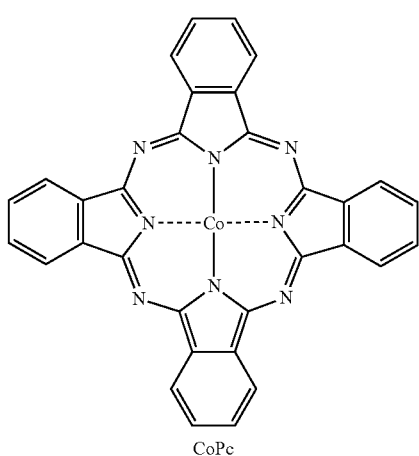

CoPc

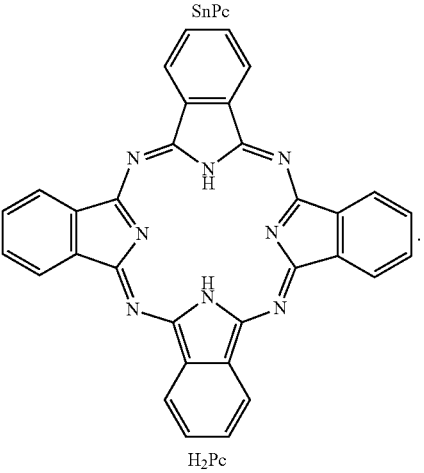

H₂Pc

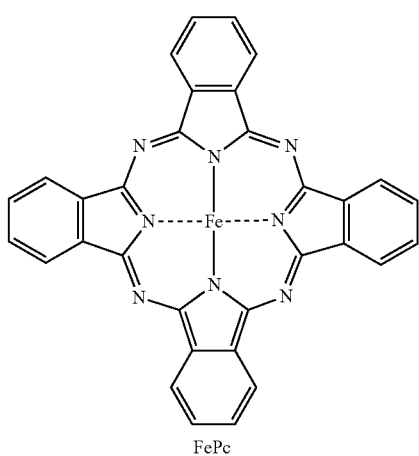

FePc

8. The light-emitting element according to claim 7,
wherein the first layer functions as a charge generation layer and has hole-transport properties; and
wherein the third layer has electron-transport properties.

9. The light-emitting element according to claim 7,
wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

10. The light-emitting element according to claim 7,
wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

11. The light-emitting element according to claim 7,
wherein the acceptor substance is an oxide of a transition metal or an oxide of a metal belonging to any one of Groups 4 to 8 of the periodic table.

12. The light-emitting element according to claim 7,
wherein the acceptor substance is molybdenum oxide.

13. The light-emitting element according to claim 7,
wherein the first layer further comprises a hole-transport substance, and
wherein a layer containing the hole-transport substance and a layer containing the acceptor substance are stacked.

14. The light-emitting element according to claim 7,
wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

15. A light-emitting device comprising the light-emitting element according to claim 7.

16. An electronic device comprising the light-emitting device according to claim 15.

17. A lighting device comprising the light-emitting device according to claim 15.

18. The light-emitting element according to claim 7,
wherein a LUMO level of the second layer is greater than or equal to −5.0 eV less than or equal to −3.0 eV.

19. The light-emitting element according to claim 7,
wherein a LUMO level of the second layer is located between a LUMO level of the acceptor substance in the first layer and a LUMO level of the m-th EL layer.

20. The light-emitting element according to claim 7,
wherein the organic compound does not contain an amine skeleton.

21. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m+1)th EL layer and the second layer, is in contact with the (m+1)th EL layer and the second layer, contains an organic compound and an acceptor substance,
wherein the second layer is provided between the first layer and the third layer, is in contact with the first layer and the third layer, and is formed of a phthalocyanine-based material having a phenoxy group,
wherein the second layer further comprises an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer, and contains an alkali metal, an alkaline earth metal, a rare earth metal, an alkali metal compound, an alkaline earth metal compound, or a rare earth metal compound, and
wherein the phthalocyanine-based material is the material shown by the following structural formula

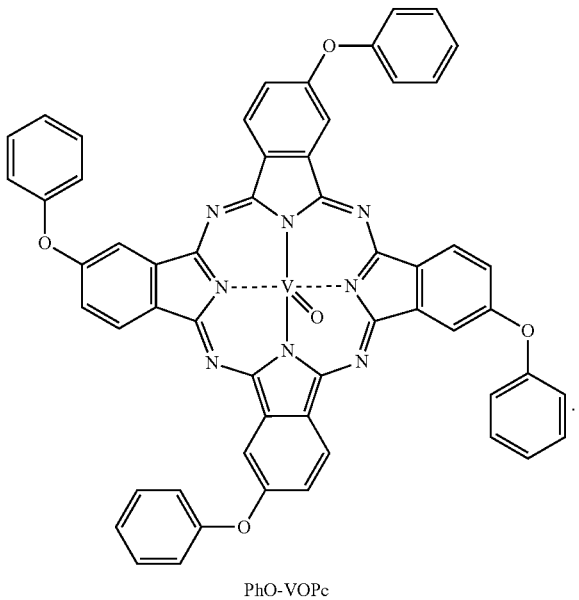

PhO-VOPc

22. The light-emitting element according to claim 21,
wherein the first layer functions as a charge generation layer and has hole-transport properties; and
wherein the third layer has electron-transport properties.

23. The light-emitting element according to claim 21,
wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

24. The light-emitting element according to claim 21,
wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

25. The light-emitting element according to claim 21,
wherein the acceptor substance is an oxide of a transition metal or an oxide of a metal belonging to any one of Groups 4 to 8 of the periodic table.

26. The light-emitting element according to claim 21,
wherein the acceptor substance is molybdenum oxide.

27. The light-emitting element according to claim 21,
wherein the first layer further comprises a hole-transport substance, and
wherein a layer containing the hole-transport substance and a layer containing the acceptor substance are stacked.

28. The light-emitting element according to claim 21,
wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

29. A light-emitting device comprising the light-emitting element according to claim 21.

30. An electronic device comprising the light-emitting device according to claim 29.

31. A lighting device comprising the light-emitting device according to claim 29.

32. The light-emitting element according to claim 21, wherein a LUMO level of the second layer is greater than or equal to −5.0 eV less than or equal to −3.0 eV.

33. The light-emitting element according to claim 21, wherein the organic compound does not contain an amine skeleton.

34. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m+1)th EL layer and the second layer, is in contact with the (m+1)th EL layer and the second layer, and contains an organic compound and an acceptor substance,
wherein the second layer is provided between the first layer and the third layer, is in contact with the first layer and the third layer, and is formed of a phthalocyanine-based material,
wherein the second layer further comprises an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer and contains an alkali metal, an alkaline earth metal, a rare earth metal, an alkali metal compound, an alkaline earth metal compound, or a rare earth metal compound.

35. The light-emitting element according to claim 34, wherein the acceptor substance is molybdenum oxide.

36. The light-emitting element according to claim 34, wherein the phthalocyanine-based material has a phenoxy group.

37. The light-emitting element according to claim 34, wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

38. The light-emitting element according to claim 34, wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

39. The light-emitting element according to claim 34, wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

40. A light-emitting device comprising the light-emitting element according to claim 34.

41. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m+1)th EL layer and the second layer, is in contact with the (m+1)th EL layer and the second layer, and contains an organic compound and an acceptor substance,
wherein the second layer is provided between the first layer and the third layer, is in contact with the first layer and the third layer, and is formed of a phthalocyanine-based material,
wherein the second layer further comprises an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer and contains an alkali metal, an alkaline earth metal, a rare earth metal, an alkali metal compound, an alkaline earth metal compound, or a rare earth metal compound, and
wherein the first layer has a stacked structure of a layer containing the organic compound and a layer containing the acceptor substance.

42. The light-emitting element according to claim 41, wherein the phthalocyanine-based material is any of the materials shown by the following structural formulae

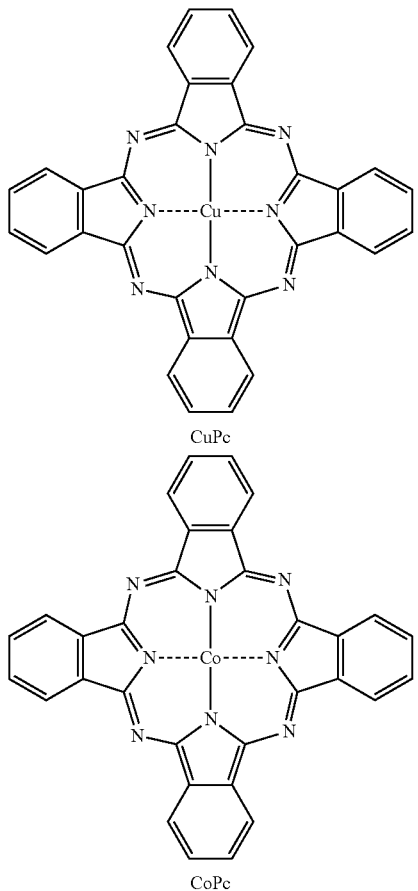

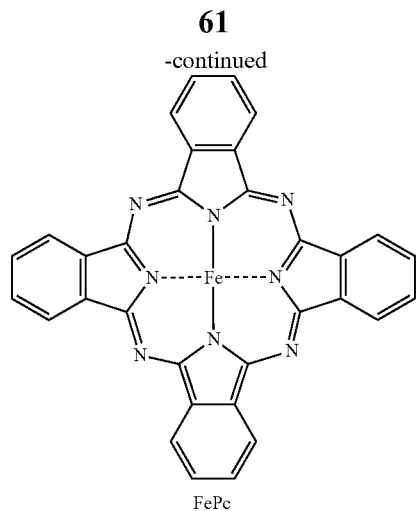

FePc

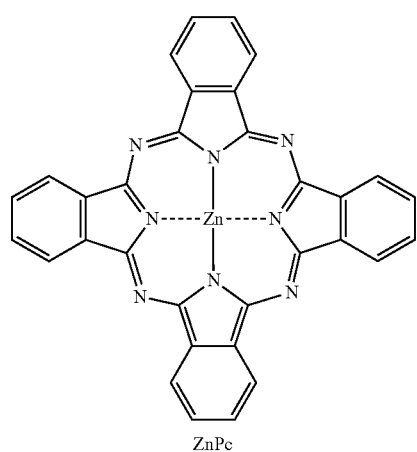

ZnPc

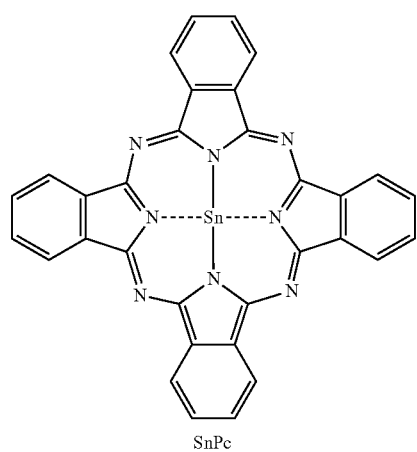

SnPc

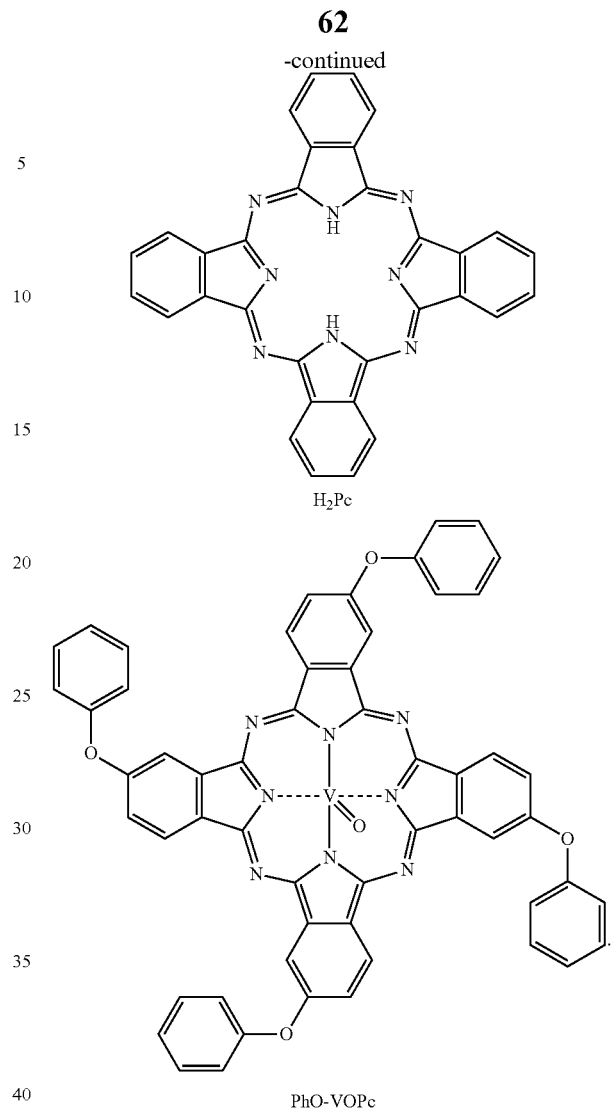

H₂Pc

PhO-VOPc

43. The light-emitting element according to claim 41, wherein the acceptor substance is molybdenum oxide.

44. The light-emitting element according to claim 41, wherein the phthalocyanine-based material has a phenoxy group.

45. The light-emitting element according to claim 41, wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

46. The light-emitting element according to claim 41, wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

47. The light-emitting element according to claim 41, wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

48. A light-emitting device comprising the light-emitting element according to claim 41.

49. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m+1)th EL layer and the second layer, is in contact with the (m+1)th EL layer and the second layer, contains an organic compound and an oxide of a transition metal or an oxide of a metal belonging to any one of Groups 4 to 8 of the periodic table,
wherein the second layer is provided between the first layer and the third layer, is in contact with the first layer and the third layer, is formed of a phthalocyanine-based material, and contains an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer contains an alkali metal, an alkaline earth metal, a rare earth metal, an alkali metal compound, an alkaline earth metal compound, or a rare earth metal compound.

50. The light-emitting element according to claim 49, wherein the phthalocyanine-based material has a phenoxy group.

51. The light-emitting element according to claim 49, wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

52. The light-emitting element according to claim 49, wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

53. The light-emitting element according to claim 49, wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

54. A light-emmitting device comprising the light-emitting element according to claim 49.

55. A light-emitting element comprising:
n EL layers between an anode and a cathode, n being a natural number greater than or equal to 2; and
a first layer, a second layer, and a third layer between an m-th EL layer from the anode and an (m+1)th EL layer, m being a natural number greater than or equal to 1 and lesser than or equal to (n−1),
wherein the first layer is provided between the (m+1)th EL layer and the second layer, is in contact with the (m+1)th EL layer and the second layer, contains an organic compound and an oxide of a transition metal or an oxide of a metal belonging to any one of Groups 4 to 8 of the periodic table,
wherein the second layer is provided between the first layer and the third layer, is in contact with the first layer and the third layer, is formed of a phthalocyanine-based material, and contains an alkali metal, an alkaline earth metal, a rare earth metal, an alkali metal compound, an alkaline earth metal compound, or a rare earth metal compound,
wherein the third layer is provided between the second layer and the m-th EL layer, is in contact with the second layer and the m-th EL layer contains an alkali metal, an alkaline earth metal, a rare earth metal, an alkali metal compound, an alkaline earth metal compound, or a rare earth metal compound, and
wherein the first layer has a stacked structure of a layer containing the organic compound and a layer containing the oxide of the transition metal or the oxide of the metal belonging to any one of Groups 4 to 8 of the periodic table.

56. The light-emitting element according to claim 55, wherein the phthalocyanine-based material is any of the materials shown by the following structural formulae

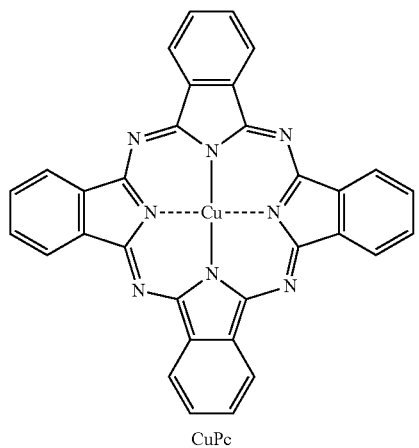

CuPc

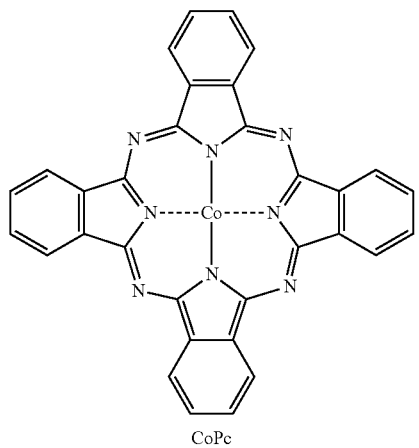

CoPc

-continued

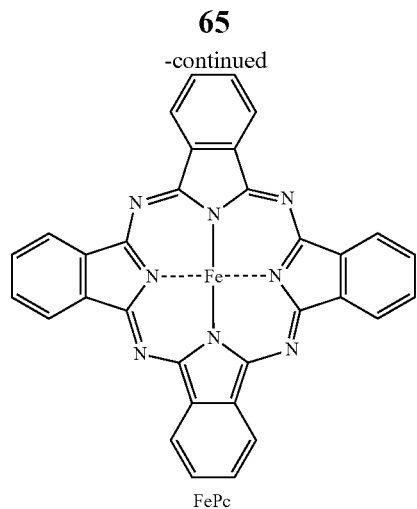

FePc

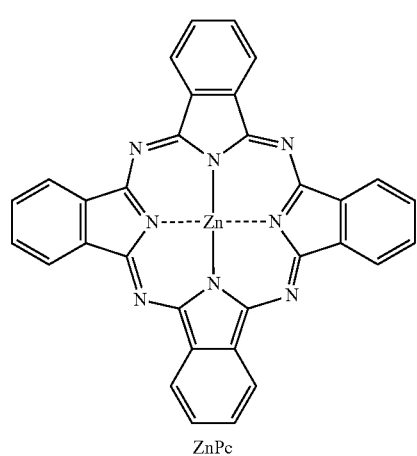

ZnPc

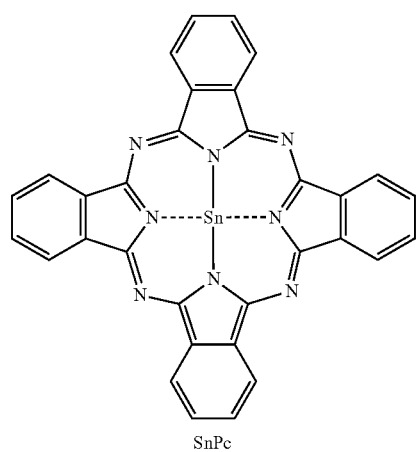

SnPc

-continued

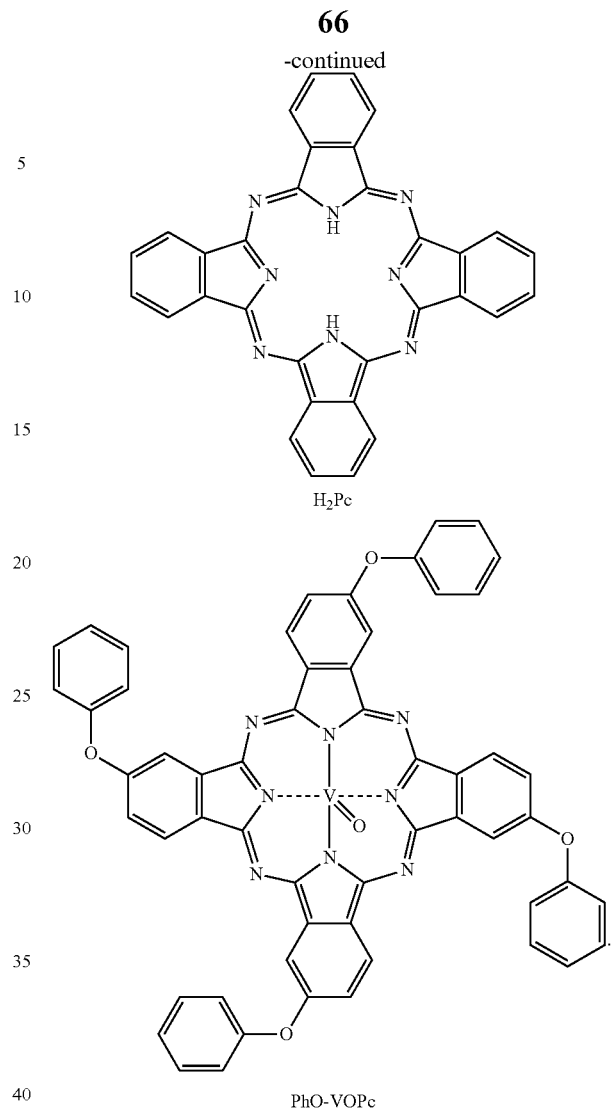

H₂Pc

PhO-VOPc

57. The light-emitting element according to claim 55, wherein the phthalocyanine-based material has a phenoxy group.

58. The light-emitting element according to claim 55, wherein, in the second layer, a mass ratio of the alkali metal, the alkaline earth metal, the rare earth metal, the alkali metal compound, the alkaline earth metal compound, or the rare earth metal compound to the phthalocyanine-based material is from 0.001:1 to 0.1:1.

59. The light-emitting element according to claim 55, wherein the third layer further comprises an electron-transport substance, and
wherein, in the third layer, a mass ratio of the alkali metal, the alkaline earth metal, the rare earth metal, the alkali metal compound, the alkaline earth metal compound, or the rare earth metal compound to the electron-transport substance is from 0.001:1 to 0.1:1.

60. The light-emitting element according to claim 55, wherein the third layer further comprises an electron-transport substance, and
wherein a layer containing the electron-transport substance and a layer containing the alkali metal, the alkaline earth metal, the rare earth metal, the alkali metal compound, the alkaline earth metal compound, or the rare earth metal compound are stacked.

61. A light-emitting device comprising the light-emitting element according to claim 55.

* * * * *

UNITED STATES PATENT AND TRADEMARK OFFICE
CERTIFICATE OF CORRECTION

PATENT NO. : 9,276,221 B2
APPLICATION NO. : 13/072908
DATED : March 1, 2016
INVENTOR(S) : Hiromi Nowatari and Satoshi Seo It is certified that error appears in the above-identified patent and that said Letters Patent is hereby corrected as shown below:

In the Specification:

Column 4, Line 24; Change "(in is" to --(m is--.

Column 13, Line 60 to 61; Change ")-N,N-diphenyl-[" to --)-N,N'-diphenyl-[--.

Column 13, Line 66; Change "N,N-diphenyl" to --N,N'-diphenyl--.

Column 14, Line 30 to 31; Change "anthracene, 10,10'-diphenyl-9,9'-bianthryl, 10,10'-bis(" to --anthracene, 9,9'-bianthryl, 10,10'-diphenyl-9,9'-bianthryl, 10,10'-bis(--.

Column 16, Line 11; Change "200 mm A change" to --200 nm. A change--.

Column 18, Line 10; Change "(PAniJPSS)" to --(PAni/PSS)--.

Column 19, Line 41; Change "]-N,N-diphenylstilbene" to --]-N,N'-diphenylstilbene--.

Column 20, Line 3; Change "SPT)," to --BPT),--.

Column 20, Line 17; Change "(abbreviation: DOM)," to --(abbreviation: DCJTB),--.

Column 20, Line 30; Change "difluorophenyppyridinato" to --difluorophenyl)pyridinato--.

Column 21, Line 7; Change "[N,N-bis" to --[N,N'-bis--.

Column 24, Line 46; Change "symbol x" to --symbol X--.

Column 26, Line 53; Change "symbol x" to --symbol X--.

Column 31, Line 23; Change "(abbreviation: Ir(Pq)$_2$" to --(abbreviation: Ir(pq)$_2$--.

Column 40, Line 50; Change "and C, 7.6 V)" to --and C: 7.6 V)--.

Column 45, Line 18; Change "element O," to --element G,--.

Column 49, Line 8; Change "(i.e., H," to --(i.e., H:--.

Signed and Sealed this
Twenty-sixth Day of July, 2016

Michelle K. Lee
*Director of the United States Patent and Trademark Office*